US007562350B2

(12) United States Patent
Watanabe

(10) Patent No.: US 7,562,350 B2
(45) Date of Patent: Jul. 14, 2009

(54) PROCESSING SYSTEM AND METHOD USING RECOMPOSABLE SOFTWARE

(75) Inventor: Akio Watanabe, Yokohama (JP)

(73) Assignee: Ricoh Company, Ltd., Tokyo (JP)

( * ) Notice: Subject to any disclaimer, the term of this patent is extended or adjusted under 35 U.S.C. 154(b) by 1367 days.

(21) Appl. No.: 10/015,899

(22) Filed: Dec. 17, 2001

(65) Prior Publication Data

US 2002/0078266 A1 Jun. 20, 2002

(30) Foreign Application Priority Data

| Dec. 15, 2000 | (JP) | ............................. 2000-381357 |
| Mar. 22, 2001 | (JP) | ............................. 2001-083032 |
| Mar. 23, 2001 | (JP) | ............................. 2001-086172 |

(51) Int. Cl.
*G06F 9/44* (2006.01)
*H03K 17/693* (2006.01)

(52) U.S. Cl. .................... 717/124; 717/127; 716/16
(58) Field of Classification Search ......... 717/124–135, 717/139, 154, 168, 122; 703/28; 714/724, 714/33, 727, 725; 715/787; 348/126, 129; 324/158.1, 765; 378/58, 22; 716/15, 16, 716/4–7, 12–17; 706/62; 29/840, 832; 356/237.5; 709/224

See application file for complete search history.

(56) References Cited

U.S. PATENT DOCUMENTS

| 4,185,298 | A | * | 1/1980 | Billet et al. ................. 348/129 |
| 4,872,052 | A | * | 10/1989 | Liudzius et al. ............. 348/126 |
| 5,323,108 | A | * | 6/1994 | Marker et al. ............. 324/158.1 |
| 5,561,696 | A | * | 10/1996 | Adams et al. ................. 378/58 |
| 5,619,700 | A | * | 4/1997 | Abe ........................... 717/122 |
| 5,687,209 | A | * | 11/1997 | Adams ........................ 378/22 |
| 5,717,928 | A | * | 2/1998 | Campmas et al. ............. 716/17 |
| 5,781,447 | A | * | 7/1998 | Gerdes ........................ 716/15 |

(Continued)

FOREIGN PATENT DOCUMENTS

JP 61-5353 1/1986

(Continued)

OTHER PUBLICATIONS

Raghunathan et al., A content based retrieval engine for circuit board inspection, IEEE, 1999, pp. 104-108 vol. 1.*

(Continued)

*Primary Examiner*—Wei Y Zhen
*Assistant Examiner*—Satish Rampuria
(74) *Attorney, Agent, or Firm*—Oblon, Spivak, McClelland, Maier & Neustadt, P.C.

(57) ABSTRACT

An inspecting apparatus for inspecting a performance of a circuit baseboard. The inspecting apparatus includes a PLD having a circuit for inspecting the circuit baseboard based upon a response signal from the circuit baseboard. A file storing device may be provided so as to store at least one PLD file in a memory. A correspondence assigning device is provided so as to assign correspondence of a PLD file to a circuit baseboard and register information of the correspondence in the memory. A list displaying device may be provided so as to display a list of a plurality of circuit baseboards to be viewed. A determining device may be provided so as to determine a type of a circuit baseboard selected from the list of a plurality of circuit baseboards via the list display.

2 Claims, 87 Drawing Sheets

U.S. PATENT DOCUMENTS

| | | | | |
|---|---|---|---|---|
| 5,831,868 | A | * 11/1998 | Beausang et al. | 716/18 |
| 5,835,503 | A | * 11/1998 | Jones et al. | 714/719 |
| 5,903,466 | A | * 5/1999 | Beausang et al. | 716/18 |
| 5,910,010 | A | * 6/1999 | Nishizawa et al. | 438/15 |
| 6,042,614 | A | * 3/2000 | Davidson et al. | 717/116 |
| 6,071,317 | A | * 6/2000 | Nagel | 717/128 |
| 6,097,202 | A | * 8/2000 | Takahashi | 324/761 |
| 6,144,954 | A | * 11/2000 | Li | 706/62 |
| 6,158,119 | A | * 12/2000 | Crist et al. | 29/840 |
| 6,195,774 | B1 | * 2/2001 | Jacobson | 714/727 |
| 6,198,529 | B1 | * 3/2001 | Clark et al. | 356/237.5 |
| 6,278,797 | B1 | * 8/2001 | Nagasaki et al. | 382/146 |
| 6,381,565 | B1 | * 4/2002 | Nakamura | 703/28 |
| 6,401,220 | B1 | * 6/2002 | Grey et al. | 714/33 |
| 6,408,432 | B1 | * 6/2002 | Herrmann et al. | 717/139 |
| 6,421,071 | B1 | * 7/2002 | Harrison | 715/787 |
| 6,453,435 | B1 | * 9/2002 | Limon et al. | 714/724 |
| 6,571,386 | B1 | * 5/2003 | Figurin et al. | 717/154 |
| 6,772,381 | B1 | * 8/2004 | Somchit et al. | 714/725 |
| 6,915,512 | B1 | * 7/2005 | Miyajima | 717/168 |
| 7,055,141 | B2 | * 5/2006 | Tzeng | 717/132 |
| 2002/0105353 | A1 | * 8/2002 | Mori et al. | 324/765 |
| 2003/0033406 | A1 | * 2/2003 | John et al. | 709/224 |
| 2003/0135802 | A1 | * 7/2003 | Klein et al. | 714/725 |
| 2004/0163241 | A1 | * 8/2004 | White | 29/832 |

FOREIGN PATENT DOCUMENTS

| | | |
|---|---|---|
| JP | 61-196175 | 8/1986 |
| JP | 62-223679 | 10/1987 |
| JP | 1-184480 | 7/1989 |
| JP | 02-264339 | 10/1990 |
| JP | 04-169873 | 6/1992 |
| JP | 04-218843 | 8/1992 |
| JP | 05-133992 | * 5/1993 |
| JP | 06-139101 | * 5/1994 |
| JP | 06-177944 | 6/1994 |
| JP | 06-324106 | 11/1994 |
| JP | 08-194631 | 7/1996 |
| JP | 09-006702 | * 1/1997 |
| JP | 09-081416 | * 3/1997 |
| JP | 9-89999 | 4/1997 |
| JP | 10-301803 | * 11/1998 |
| JP | 10-340201 | * 12/1998 |
| JP | 11-118889 | * 4/1999 |
| JP | 10216946 | * 2/2000 |

OTHER PUBLICATIONS

Mostafa et al., Design of an inspection system for electrical characteristics of a PC board, IEEE, Nov. 6-9, 1993, pp. 720-724.*

Sen-Tarng et al., A software metric combination model for software reuse, IEEE, Dec. 2-4, 1998, pp. 70-77.*

Li-Ren et al., A Gauss-elimination based PRPG for combinational circuits, IEEE, Mar. 6-9, 1995, pp. 212-216.*

Rolince et al., Next generation functional test program development system, IEEE, Sep. 18-21, 2000, pp. 125-128.*

Kao et al., Automatic generation of load board schematics for testing mixed signal ICs; 1993, IEEE, pp. 1-6.*

Kusiak et al., Design of modular digital circuits for testability; 1997, IEEE, vol. 20, Issue 1, pp. 48-57.*

Beenker et al., Macro Testing: Unifying IC And Board Test; 1986, IEEE, vol. 3, Issue 6, pp. 26-32.*

* cited by examiner

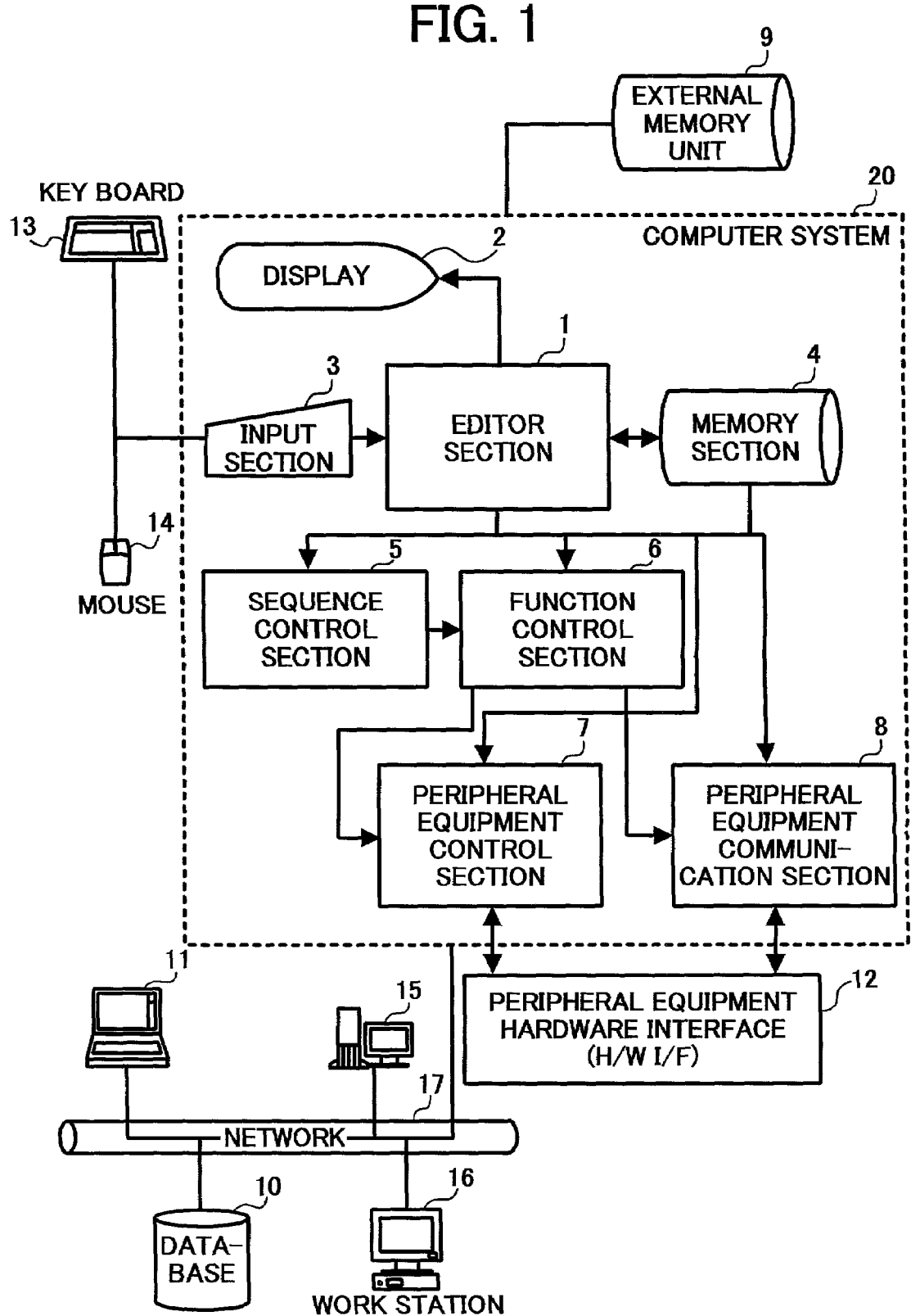

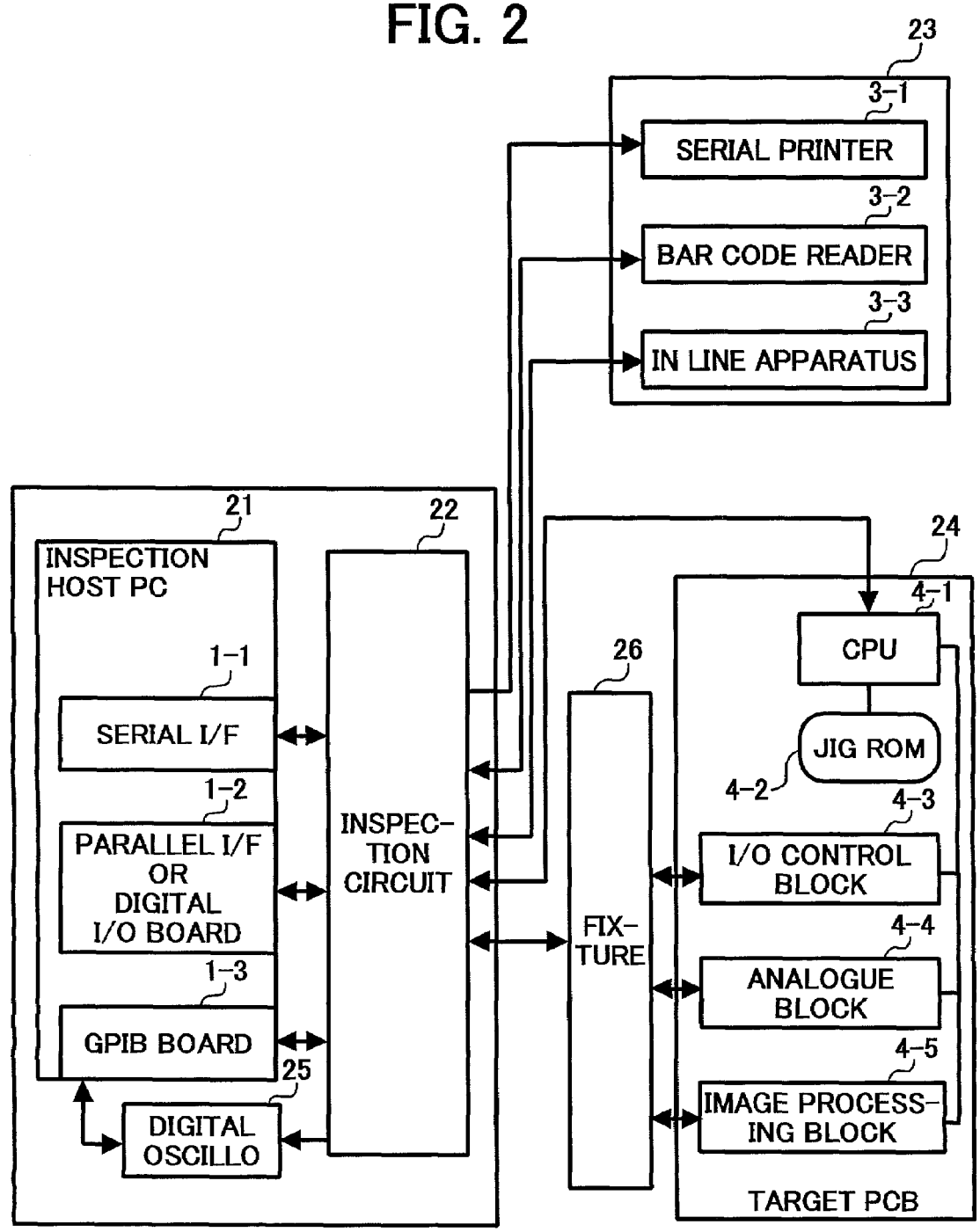

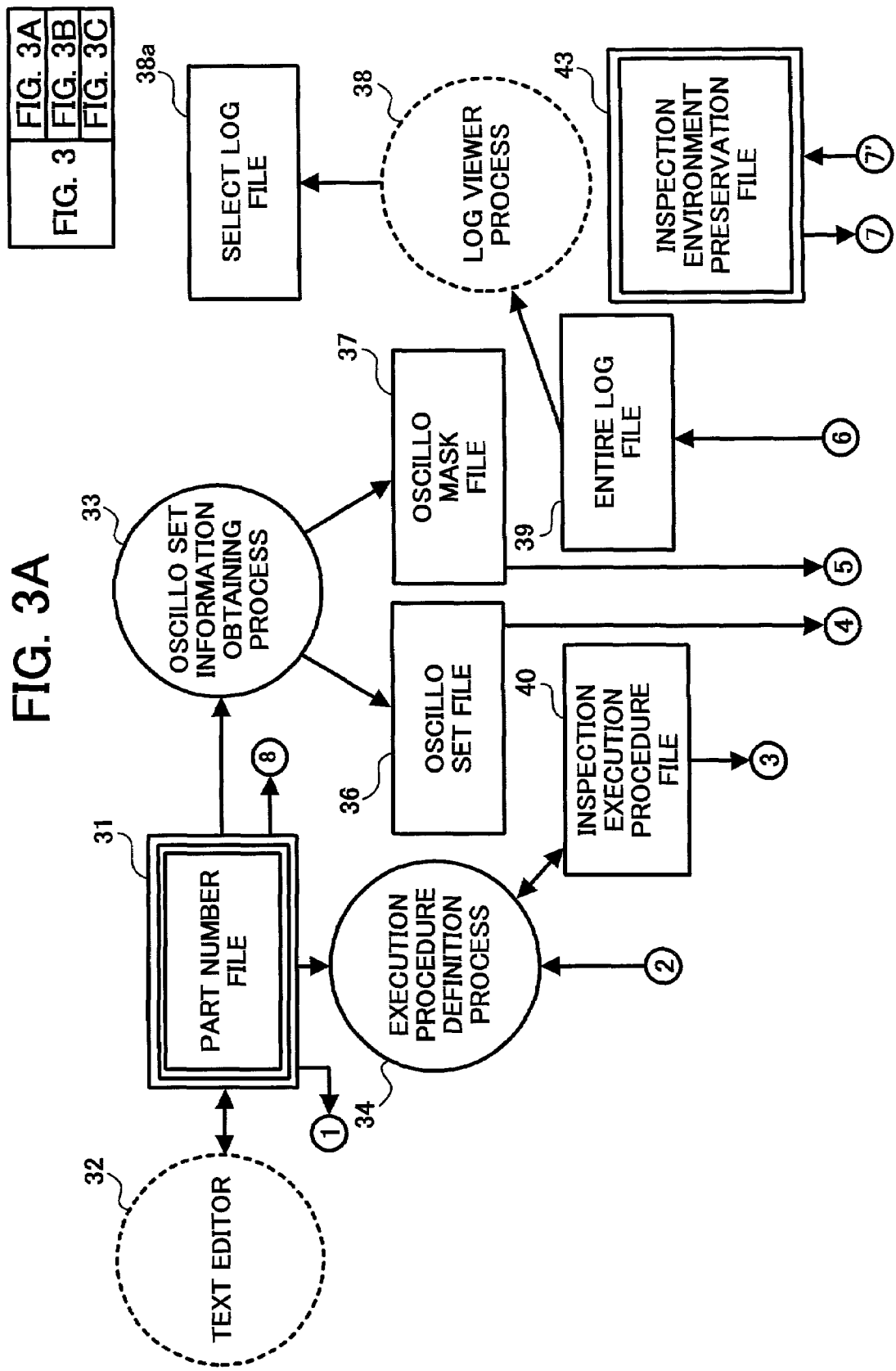

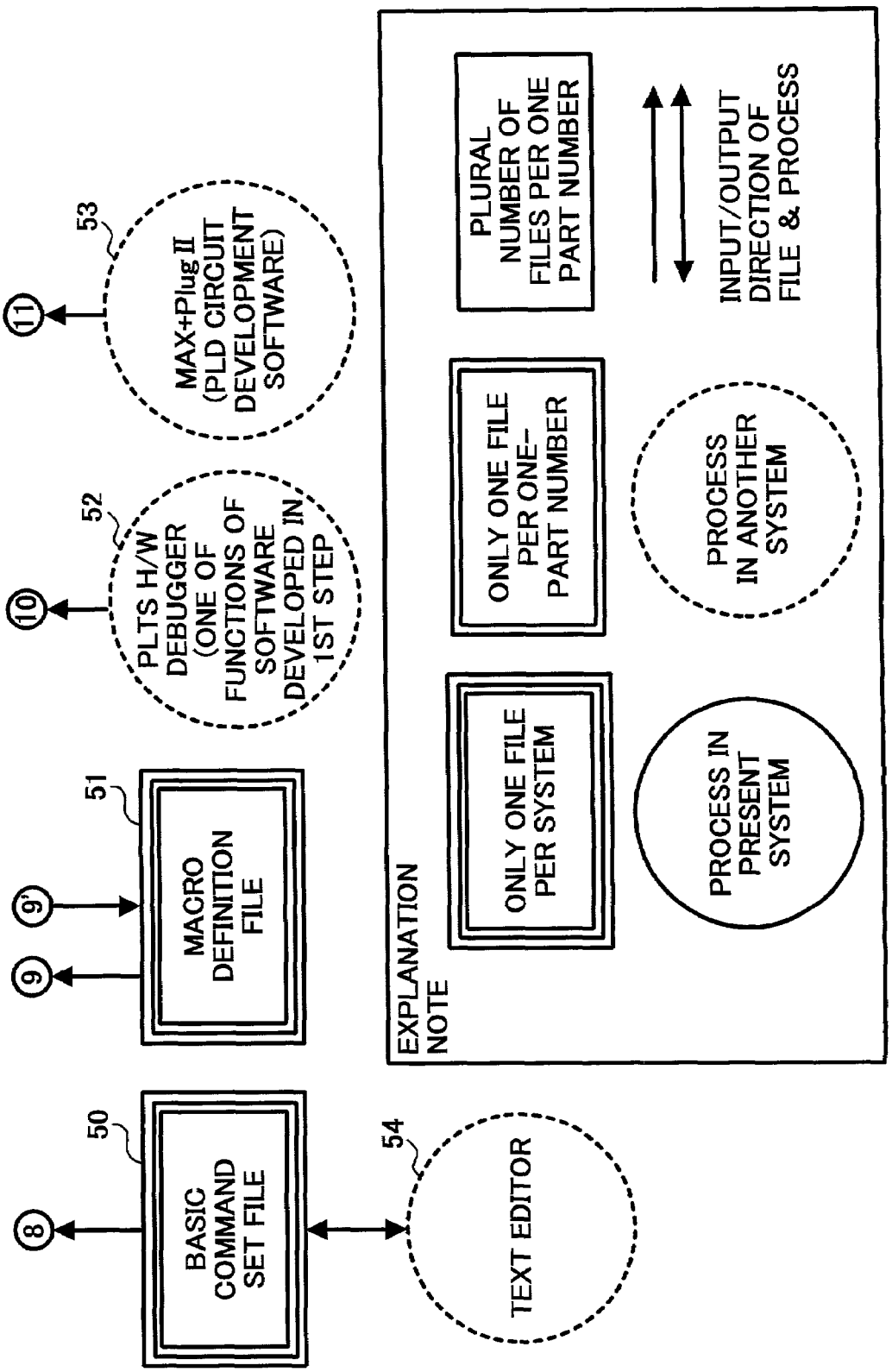

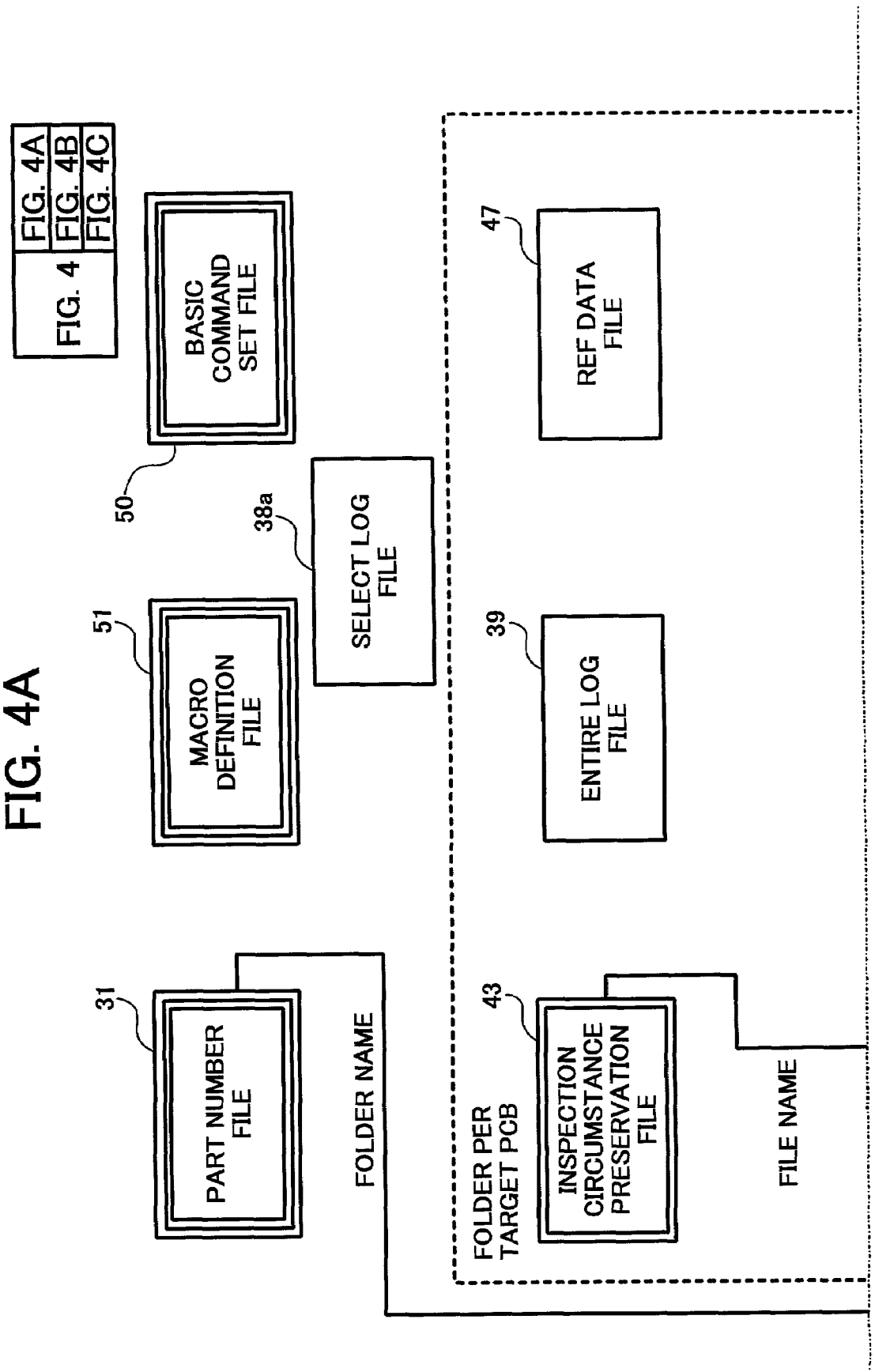

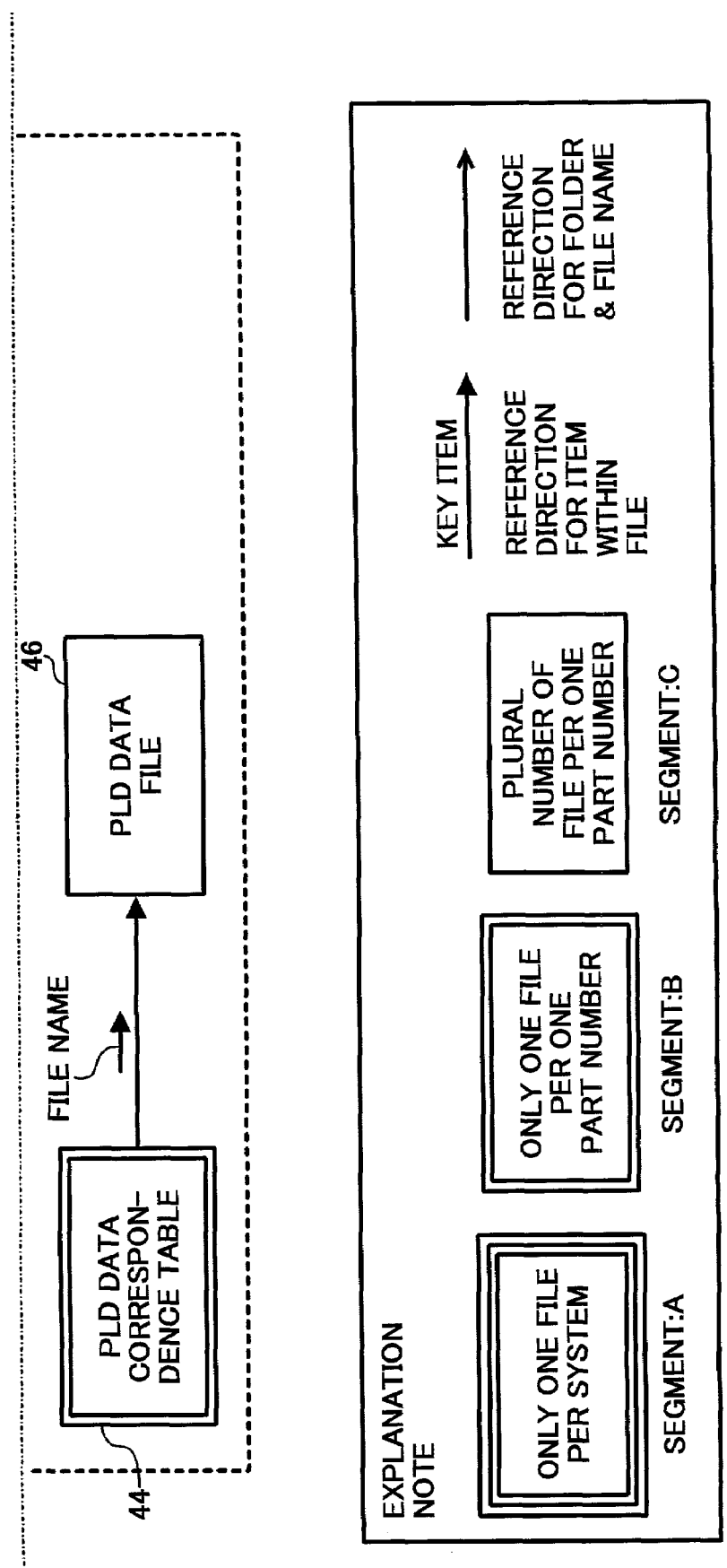

FIG. 5

| | | | TEST01 ☐ | MACR001 △ ☐ | REGWR ☐ ☐ | |
|---|---|---|---|---|---|---|
| t01-01 | CMD_REGWR | P01_01 | P01_02 | P01_03 | P01_04 | |
| t01-02 | CMD_REGWR | P01_01 | P01_05 | P01_06 | P01_07 | |
| t01-02_1 | REG_CLR | P01_01 | P01_08 | | | |
| t01-03 | CMD_REGWR | P01_01 | P01_09 | P01_10 | P01_11 | |
| t01-04 | CMD_WAIT | P01_12 | | | | |
| t01-05 | CMD_REGWR | P01_01 | P01_13 | P01_14 | P01_15 | |
| t01-06 | CHK_CONECT | P01_16 | P01_17 | P01_18 | P01_19 | P01_20 |
| t01-07 | CHK_DATA | P01_21 | P01_22 | P01_24 | P01_24 | P01_24 |
| t01-08 | CMD_REGWR | P01_01 | P01_26 | P01_29 | P01_29 | P01_29 |

EXAMPLE: EDITOR SECTION GUI ①

EXAMPLE: PART NUMBER SELECTION GUI

FIG. 11A

| | FIG. 11 | FIG. 11A |
|---|---|---|
| | | FIG. 11B |
| | | FIG. 11C |

| ITEM NAME | MODEL | BYTE NUMBER | REMARKS |
|---|---|---|---|
| HEADER SECTION | | | |
| FILE ID | BYTE[] | 23 | "BASIC COMMAND SET@HANKS" |
| SEGMENTATION CHARACTER | BYTE | 1 | 0x02C(',') |
| VERSION | BYTE[] | 8 | "V01.00" |
| SEGMENTATION CHARACTER | BYTE[] | 2 | 0x0D,0x0A |
| COMMAND NUMBER | BYTE[] | 3 | 001~999 |
| SEGMENTATION | BYTE[] | 2 | 0x0D,0x0A |
| SEGMENTATION | BYTE[] | 2 | 0x0D,0x0A |
| INTERMEDIATE TOTAL | | 41 | |
| DATA SECTION | | | |
| BASIC COMMAND | | | |
| INTERMEDIATE TOTAL | | | |
| TOTAL | | | |

EXAMPLE: BASIC COMMAND FILE FORMAT

FIG. 11B

BASIC COMMAND FORMAT

| COMMAND | PARAMETER 1 | PARAMETER 2 | ... |
|---|---|---|---|
| COMMAND (A) | P1(B) | P2(B) | ... |

COMMANDS&PARAMETERS ARE COMPARTMENTALIZED BY [','] WHEN SEMI-COLON IS PUT AT BEGINNING, IT IS TREATED AS COMMENTS.

A:PARAMETER NUMBER INCLUDED IN COMMAND
B:PARAMETER INFORMATION  FORMAT(b1:b2:b3:・・・)

b:1 PARAMETER TYPE
    1:NUMERICAL VALUE    4:READ REGISTER NAME    7:INTERNAL TABLE REFERENCE
    2:LETTER STRING    5:PROCESSING MODE NAME    8:OTHER SELECTION
    3:WRITE REGISTER NAME    6:FILE NAME    9:ERROR MESSAGE b:2 MINIMUM VALUE
    * LETTER STRING NUMBER, WHEN b1=b2
    * NOTHING EXISTS SUBSEQUENT TO 3
    * FOLLOWING NUMERICAL VALUE ARE ENTERED WHEN B1=7
      1:CH1  2:CH2  3:EXT  4:SERIAL SELECTION
    * ONE OF OPTIONS WHEN b1=8
    * COLON(:) IS ENTERED BETWEEN b1&b2 WHEN THIS PARAMETER DOES NOT EXIST b:3 MAXIMUM VALUE
    * NOTHING EXISTS AFTER b1=2
    * 8 IS ONE OF OPTIONS

EXAMPLE: BASIC COMMAND FILE FORMAT

FIG. 11C

| USAGE EXAMPLE | |
|---|---|
| COMMAND RESPONDING TEST ID TRANSMISSION TO TARGET<br>T_TESTID(3),testid(2:3),rwait(1:1:99999) | EXAMPLE: BASIC COMMAND FILE FORMAT |
| WRITE COMMAND TO PLTS<br>P_REGWR(3),wrname(3:),wrdt(1:0:255) | |

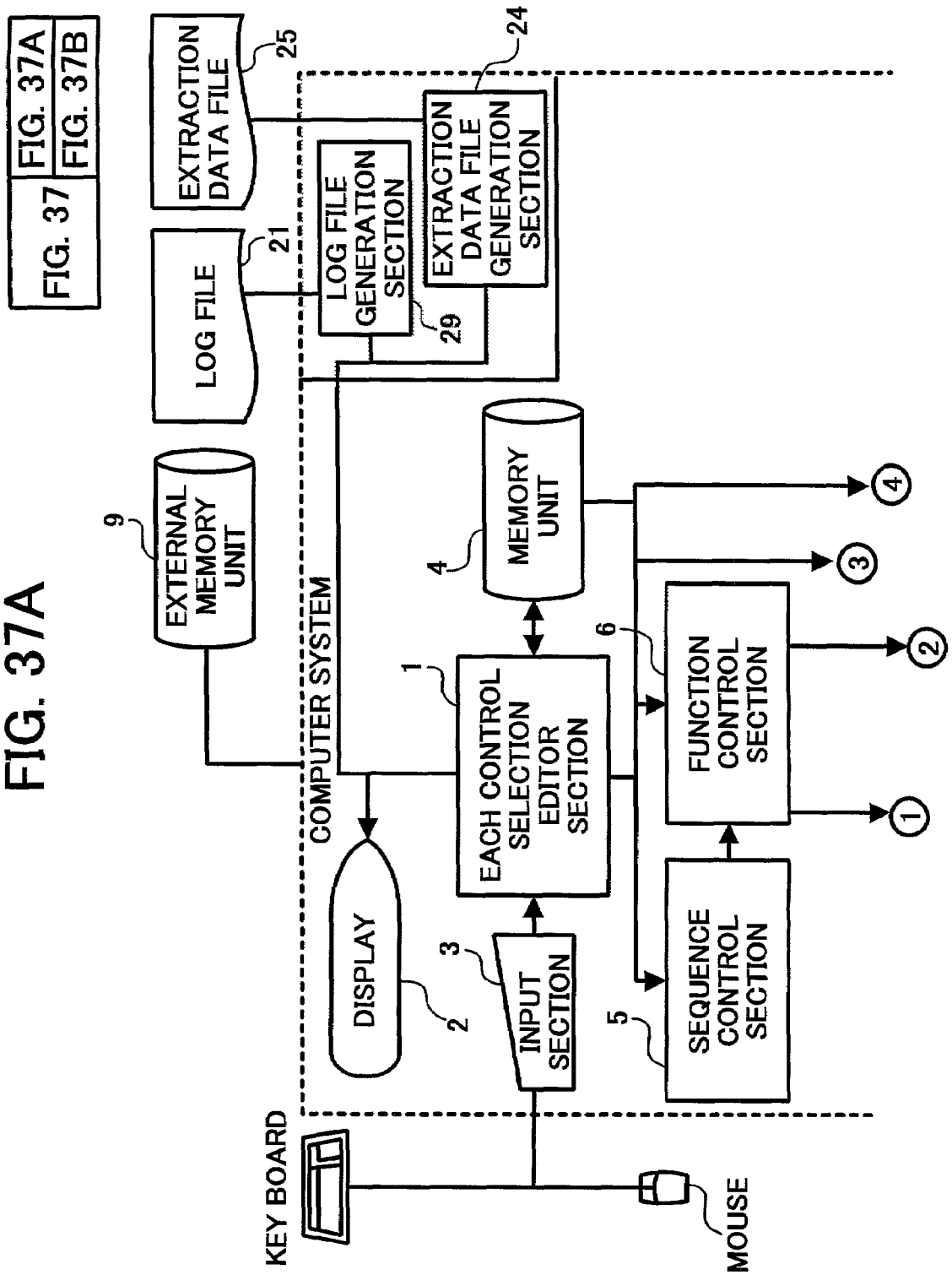

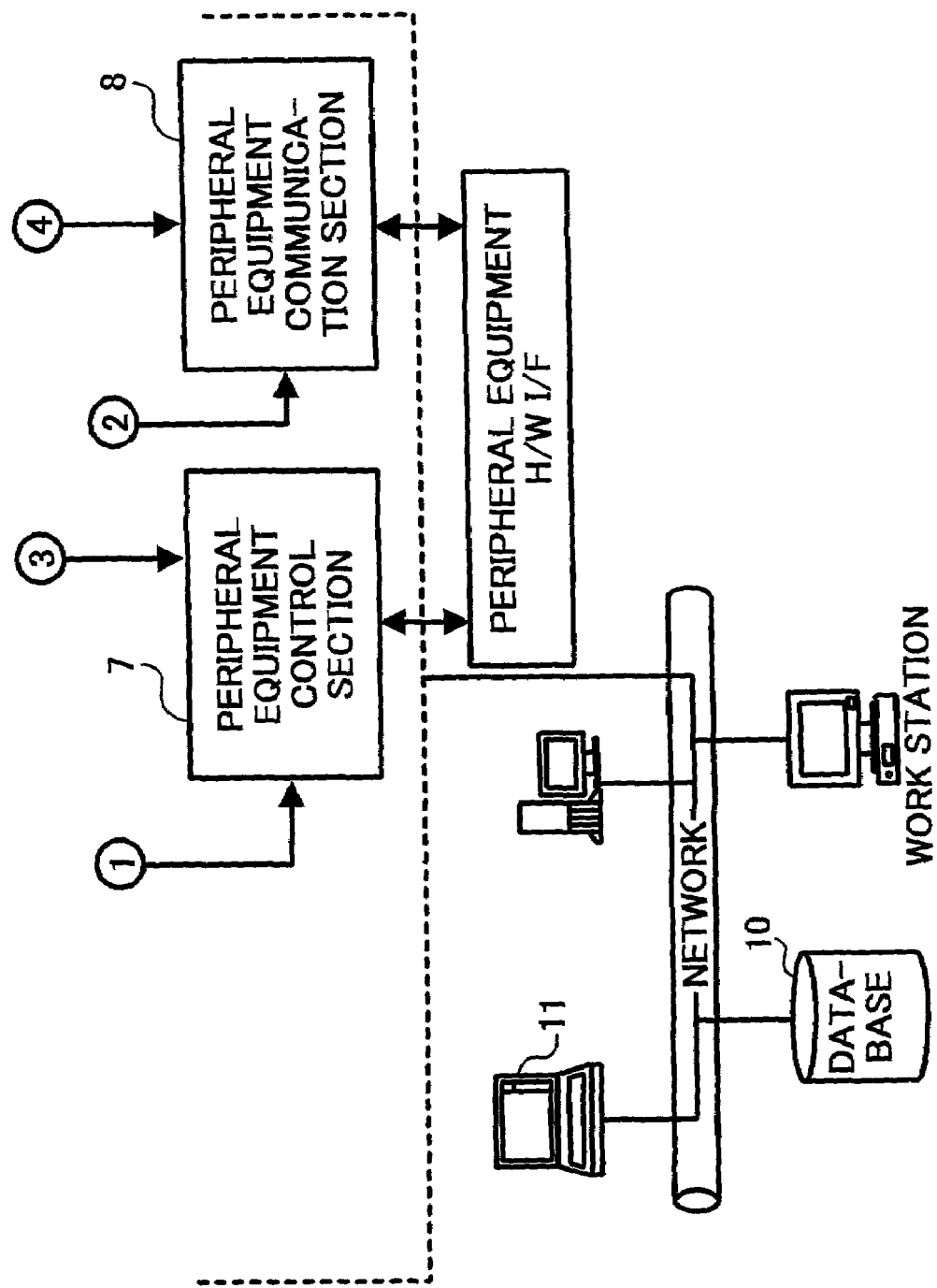

FIG. 38

| | RESULT | NO COUNT | TESTS DATA | TESTS DATA |
|---|---|---|---|---|
| PCB 1 | PASS | | 2.012 | 0xFF93DA01 |
| PCB 2 | PASS | | 2.010 | 0xFF93C72B |
| PCB 3 | FILE | 3 | 2.005 | 0xFF41DB18 |
| PCB 4 | PASS | | 2.011 | 0xFF93DAF6 |
| PCB 5 | PASS | | 2.010 | 0xFF93EE1C |
| PCB 6 | PASS | | 2.013 | 0xFF93DB28 |
| PCB 7 | FILE | 5 | 2.015 | 0xFFA5C4C2 |

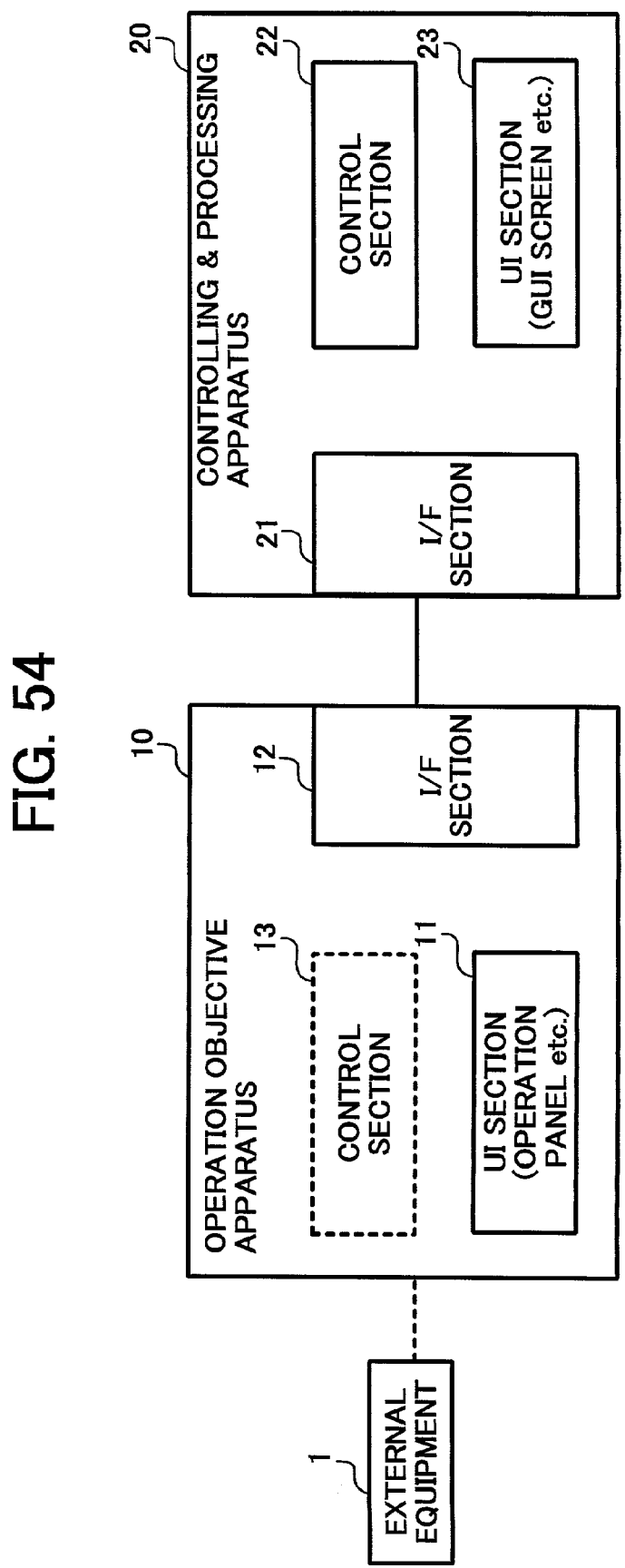

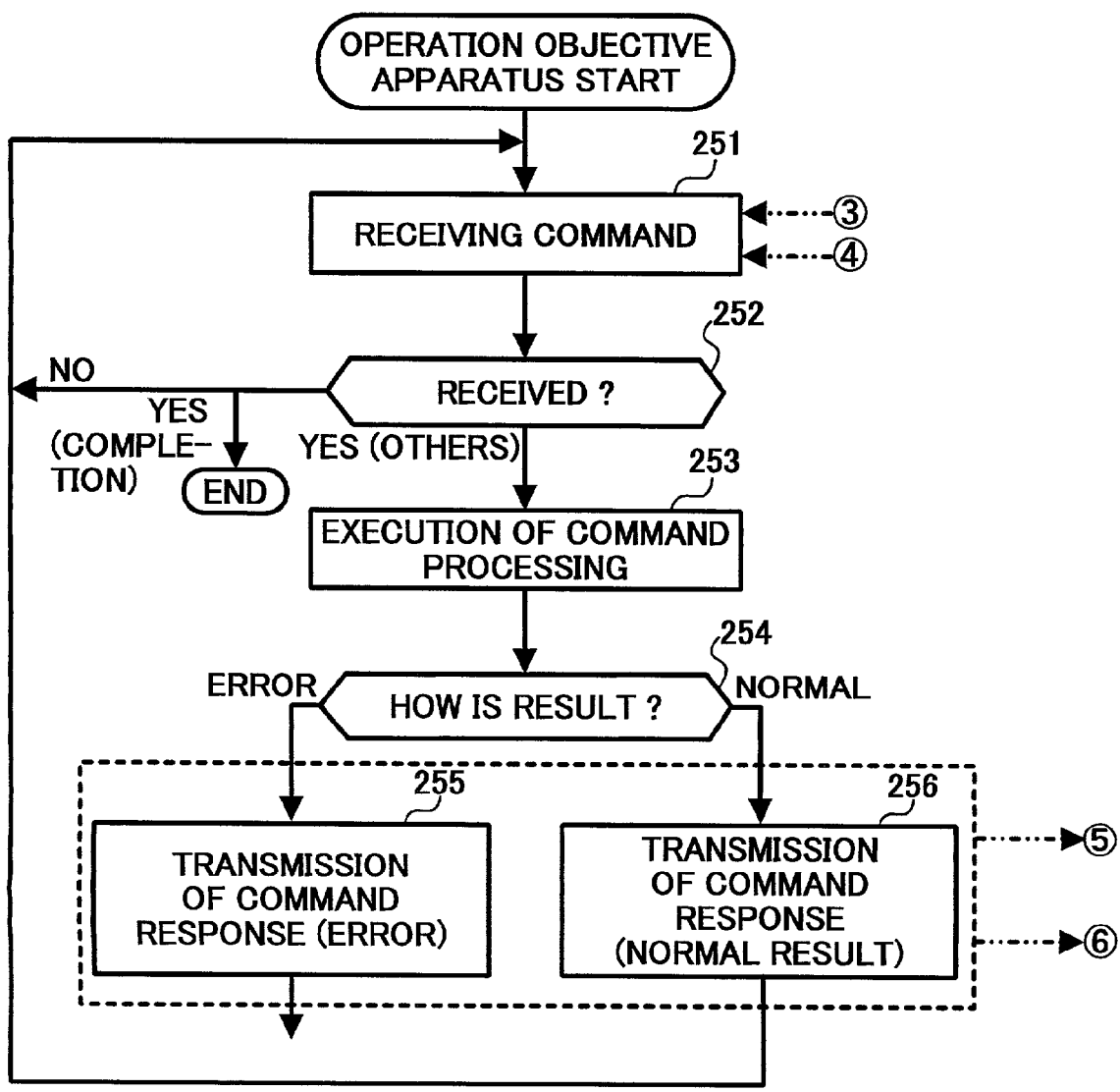

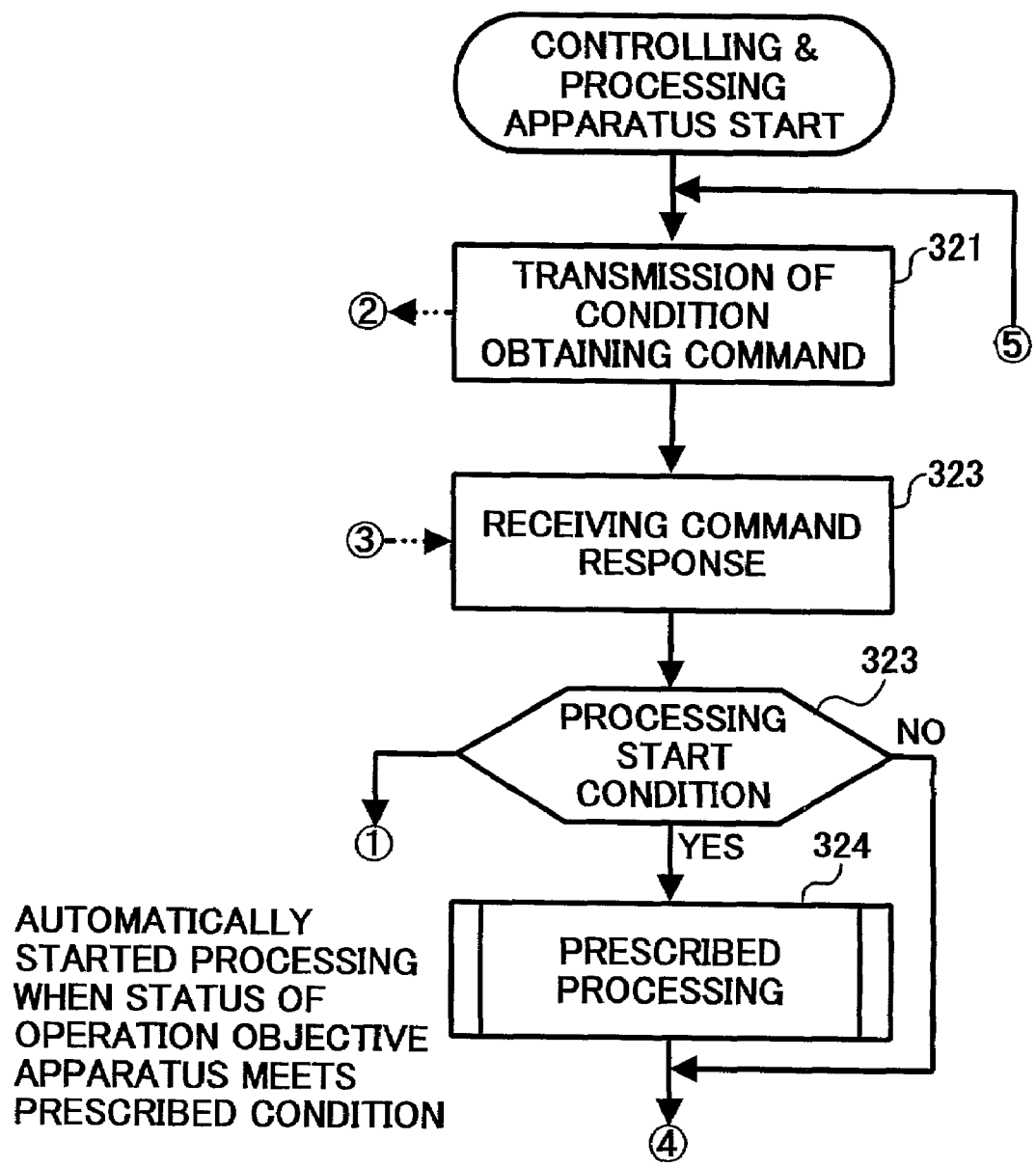

PROCESSING SYSTEM AND METHOD USING RECOMPOSABLE SOFTWARE

CROSS REFERENCE TO A RELATED APPLICATION

This application claims priority under 35 USC § 119 to Japanese Patent Application Nos. 2000-381357, 2001-086172, and 2001-083032, filed on Dec. 15, 2000, Mar. 23, 2001, and Mar. 22, 2001, respectively, the entire contents of which are herein incorporated by reference.

BACKGROUND OF THE INVENTION

Field of the Invention

The present invention generally relates to processing apparati having recomposable software. In particular, the present invention relates to processing apparati and program recomposing methods for use, for example, in an inspecting apparatus and a measuring instrument that inspects and measures a print baseboard and peripheral equipment, and capable of building software with less development cost and knowledge related to programming, while maintaining software (i.e., program) code even when processing and procedure are different.

The present invention also relates to circuit board inspecting apparati that inspect the performance of a circuit baseboard, and in particular to circuit board inspecting apparati suitable for and capable of efficiently inspecting and evaluating the functionality of various kinds of circuit baseboards.

The present invention also relates to general-purpose inspecting systems having a log function capable of facilitating analysis work by sampling only necessary information simultaneously with an execution of an inspecting operation when only necessary information is sampled out of a log file for analysis.

The present invention also relates to general-purpose inspecting systems for inspecting peripheral units such as a PC board while easily constructing a desired inspecting program without requiring a user to have programming knowledge and more particularly to general-purpose inspecting systems, program, and inspecting methods preferable for executing detailed inspection.

The present invention also relates to general-purpose inspecting systems and inspecting methods linked with a fixture and other devices, and more particularly to general-purpose inspecting systems and inspecting methods enabling predetermination of whether a user's operation is invalid and, at least, resuming a status preceding an occurrence of an error.

DISCUSSION OF THE BACKGROUND

Heretofore, prescribed software has been frequently required in order to accomplish a desired object on a computer system that at least includes a processor, a memory, an input apparatus, a display, and an Operating System (OS) that is stored in the memory and read by the processor. Since the software must be programmed each time when software is developed and/or a partial function of the software is added and corrected, a user with less knowledge thereof cannot properly reprogram the software. In addition, a user having sufficient knowledge changes a program code as required to add or correct and then uses a compiler. Further, the user must validate each program, thereby resulting in a problem of large development costs related to the software.

In addition, the development environment should be adjusted so as to build software. The user should be able to rely on the development environment. A setting file to be generated frequently has a staggering volume of information and there is a high probability that the setting file is complex and vexatiously complicated in proportion to the remainder of the multipurpose software. As a result, the user can not entirely comprehend the setting file. Enumerating commands every time subsequent development occurs is exceedingly bothersome. Further, since the user should write the setting details (command options) in accordance with a command with numeral values or the like, it is very bothersome to write the file.

A file band generated in such a manner is also likely to be overly-complex in proportion to of its part of the multiple-purpose software.

As a background technology related to an automatic software generation method and a test-debugging method, there are described a peripheral equipment, a device driver software automatic generation system, and a device driver software in Japanese Patent Application Laid Open No. 9-6702, for example.

The system attempts to make inquiries about and receive a necessary control command together with an inherent parameter to and from a peripheral equipment. The system then automatically generates a target device driver software from the command and the parameter in order to generate device driver software for an objective peripheral equipment. The software is then installed in a host computer. The automatic generation method of device driver software disclosed in Japanese Non-examined Patent Publication No. 9-6702 includes obtaining a control command and an inherent parameter necessary for generating software from a peripheral unit, receiving a control command and an inherent parameter transmitted from the peripheral unit, generating device driver software for the target peripheral unit, and installing the software in the host computer.

As another background example, there is described a testing apparatus of Japanese Patent Application Laid Open No. 9-081416. The testing apparatus includes a quasi-mechanical software apparatus. The quasi-mechanical apparatus inputs test data from a previously prepared file when receiving a command and executes an operation designated by the command. The executed resultant is subsequently output by the quasi-mechanical apparatus.

As still another background example, there are described a debugging apparatus, an information processing apparatus, and an information recordable medium in Japanese Patent Application Laid Open No. 10-301803. In the background example, an applicable apparatus executes a debugging program and transmits an output to a host machine so as to process a command when the host machine transmits the command. The host machine executes the host computer program and transmits the program to an applicable apparatus automatically or upon user command to enable the applicable apparatus to execute the program. In addition, the host machine transmits a command that instructs the reading of a memory to an applicable apparatus and receives and displays its result.

Further, as another background example, there is described a test system in Japanese Patent Application Laid Open No. 7-319950. Such a test system includes a virtual tester that imitates the operation of a tester in a software-like manner, and a program converting device that converts to a test program that may be employed by the virtual tester. Then, after termination of debugging of the virtual test program, the virtual test program is converted to a test program for an arbitrary real tester by the program conversion means and an operation test is actually performed for a circuit.

As still another background example, there is described a test program generating system, a system test automating apparatus, and system for automatic inspection and method for computer software in Japanese Patent Application Laid Open Nos. 10-340201, 11-118889, and 6-139101.

An automatic system test device is disclosed in Japanese Non-examined Patent Publication No. 10-340201, which includes a test data generation section and an automatic test execution section. It first generates a test case, a test procedure, and a test result from system specifications in the test data generation section, performs a test in a test procedure in the automatic test execution section, and compares a test result obtained thereby with a test result generated in the test data generation section to test a display screen.

A test program generation system disclosed in Japanese Non-examined Patent Publication No. 11-118889 generates a procedure necessary for executing existing software for generating a test pattern program by software processing of information stored in a simulation file, a device information file, and a cell information database, generates a test pattern program by executing the procedure, and executes software processing of the program and the information stored in the device information file and the cell information database to generate a main program.

Further, a technology that inspects a performance of a circuit baseboard has been developed and is described, for example, in Japanese Patent Laid Open Application Nos. 05-133992 entitled "Circuit Baseboard Inspecting Method, Inspection Baseboard, and Circuit Baseboard Inspection Apparatus", and 08-32191 entitled by "Electronic Circuit."

In the technology described in the former Official Gazette, a probe terminal disposed on one side surface of an inspection baseboard contacts a measurement receiving land disposed on an inspection receiving circuit baseboard.

Parts to be mounted on the inspection receiving circuit baseboard are loaded on another surface of the inspection baseboard. Thus, the probe terminal and other parts are combined as if the part is mounted on the inspection receiving circuit baseboard, and the inspection receiving circuit baseboard is inspected.

Whereas in technology described in the Official Gazette, a testing apparatus can automatically determine a product class of a baseboard when an electronic circuit baseboard is tested. Thus, the technology can omit manual operation when a baseboard is identified and classified, and testing costs decrease to a large extent.

In such a circuit baseboard inspection apparatus, an inspection circuit should be connected to an inspection receiving circuit baseboard as an inspection objective so as set an input signal thereto in accordance with inspection details and evaluate an output signal. Further, heretofore, an inspection circuit has generally been manufactured per an inspection receiving circuit baseboard as an inspection objective. As a result, large-scale costs are incurred manufacturing an inspection circuit and debugging it.

Conventional technologies cannot efficiently manufacture an inspection receiving circuit baseboard per an inspection receiving circuit baseboard.

Still further, a test device (method C) disclosed in Japanese Non-examined Patent Publication No. 9-81416 involves connecting the test device to a processor having an operating section, a mechanical section, and a control section, inputting test data from a prepared test data file when a pseudo-mechanical device receives a command issued by the control section, and outputting an execution result to a file. In addition, a pseudo-operating section inputs input data from a prepared input data file, displays it on a screen, and transmits operating information displayed for instructions on the screen to the control section.

While there are some cases, however, in which a inspecting operation must be halted or interrupted at an arbitrary point during the inspection if an abnormal portion is examined or if the inspection verifies a design, this general-purpose inspecting system is neither capable of halting nor interrupting execution of the inspection and, therefore, it can perform neither detailed inspection error examination nor design verification.

In addition, since a condition of an operation objective is not previously known, a control side processing apparatus can not prevent a user from his or her erroneous operation. Specifically, the erroneous operation is reported by means of dialog or in a similar manner when an error caused by the erroneous operation occurs.

SUMMARY

Accordingly, an object of the present invention is to address and problems such as those mentioned above-among other, by providing a new inspecting apparatus. These objects are achieved providing a novel inspecting apparatus including a PLD for inspecting a performance of a circuit baseboard. The inspecting apparatus may include a circuit configured to inspect a circuit baseboard based upon a signal from the circuit baseboard, a file storing device configured to store at least one PLD file in a memory, and a correspondence assigning device configured to assign correspondence of a PLD file to a circuit baseboard with the PLD file and register information of the correspondence in the memory. A list displaying device may be provided so as to display a list of a plurality of circuit baseboards. A determining device may also be provided so as to determine a type of a circuit baseboard selected from the list of a plurality of circuit baseboards by a user via the list display. A loading device may also be provided so as to refer to the correspondence information and read and specify an applicable PLD file from the memory. The loading device may load the PLD with the applicable PLD file in accordance with the type of the circuit baseboard.

In another embodiment, a computer system may include a processor, recomposable software, a memory for storing data and program used by the processor, an inputting apparatus for allowing data input, and a display for displaying at least input data and processing resultant. An editing section may be provided so as to select a function of a control section and edit a processing sequence based upon input through the inputting apparatus. A sequence control section may also be provided so as to perform a control operation in accordance with the processing sequence edited by the editing section. A function control section may be provided so as to execute at least controlling of a control section and an internal operation in accordance with a control instruction set by the editing section. A peripheral equipment control section may be provided so as to control a peripheral equipment under control of the function control section in accordance with a control instruction set by the editing section. A peripheral equipment communication section may be provided so as to communicate with the peripheral equipment under control of the function control section in accordance with a control instruction set by the editing section.

In yet another embodiment, a general-purpose inspecting system includes a log function, in which an inspection result is filed as a log and the contents are analyzed by using the file. A data sampling section may be provided so as to sample only necessary information from the file having a bulky volume. A sample data file generation section may be provided so as to generate other files having a smaller size than that of the file and storing the sampled data.

In yet another embodiment, a general-purpose inspecting system may inspect a peripheral unit connected to an input-output interface with recomposable software in accordance with a peripheral unit to be inspected. A debugging means may be provided so as to read inspection operation confirming information during an execution of inspecting the peripheral unit and to display it on a screen.

In yet another embodiment, a general-purpose inspecting system may include a controlled device and a control processor for monitoring a status of the controlled device. The controlled device may be provided with an interface section indicating its own status. The control processor may be provided with means for determining in advance whether an execution result of command processing is abnormal or normal by previously accessing the interface section of the controlled device so as to acquire the status of the controlled device.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein:

FIG. 1 is a schematic chart illustrating the entire configuration of an exemplary processing apparatus including a recomposable software according to the first embodiment of the present invention;

FIG. 2 is a schematic chart illustrating the entire configuration of an inspection system related to the present invention;

FIGS. 3A, 3B and 3C are schematic charts illustrating exemplary relation of software according to the present invention;

FIGS. 4A, 4B and 4C are schematic charts illustrating exemplary relationships of files according to the present invention;

FIG. 5 is a chart for illustrating an exemplary display screen of an editing section GUI1 according to the present invention;

FIGS. 11A, 11B and 11C are explanatory charts illustrating an exemplary basic command file format according to the present invention;

FIGS. 37A and 37B are diagrams illustrating an internal organization of a general-purpose inspecting system having a log function;

FIG. 38 is a diagram illustrating a display of a log data display section in FIG. 37;

FIG. 54 is a block diagram illustrating a general-purpose inspecting system according to the fifth embodiment of the present invention;

FIGS. 60A, 60B and 60C are operation flowcharts illustrating still another general-purpose inspecting method according to the present invention;

FIGS. 62A, 62B and 62C are operation flowcharts illustrating a modification of the general-purpose inspecting method according to the present invention.

DETAILED DESCRIPTION OF THE PREFERRED EMBODIMENT

Figure 3B:
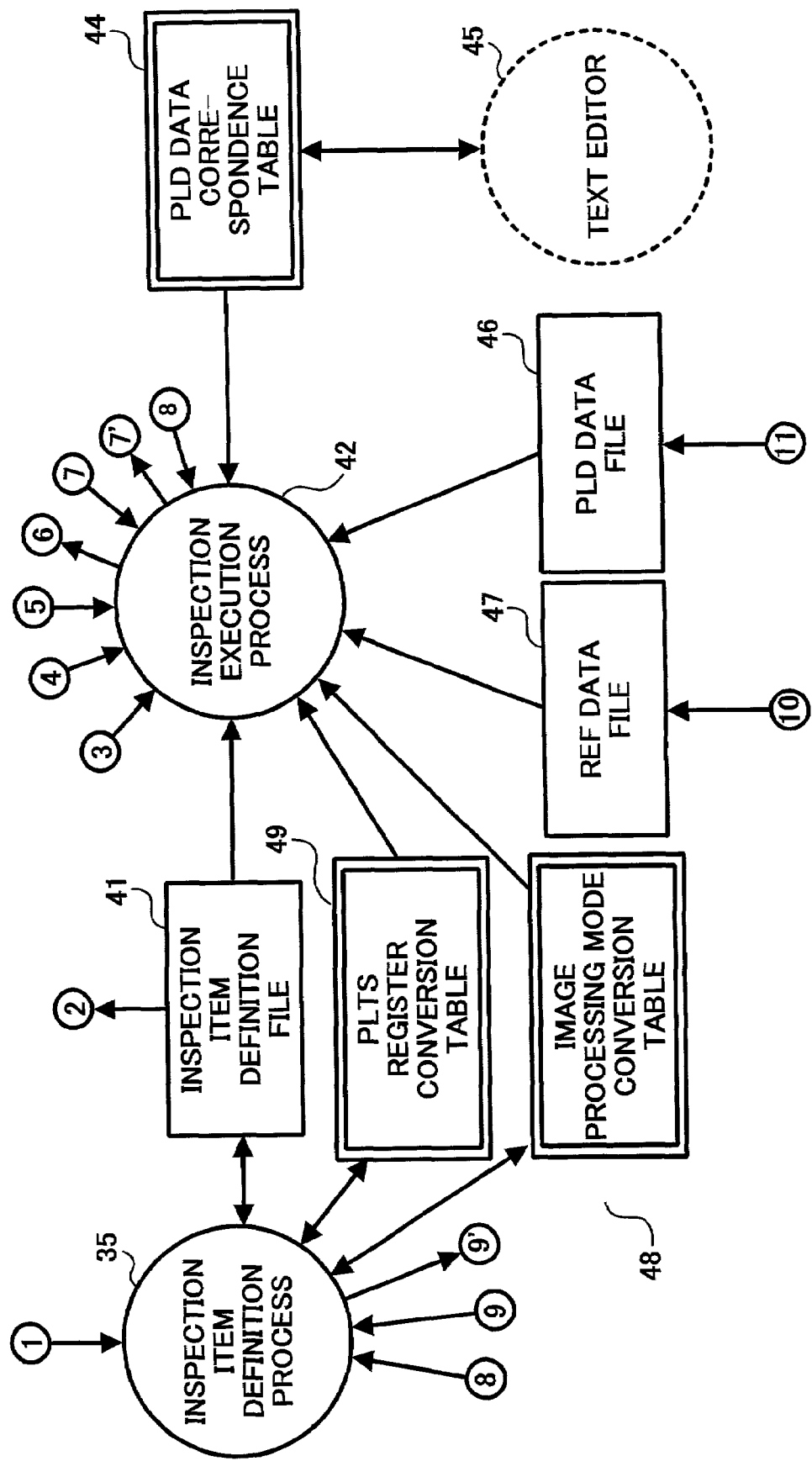

Referring now to the drawings, wherein like reference numerals designate identical or corresponding parts throughout several views, in particular in FIG. 1, a computer system 20 is illustrated within a space circumscribed by a dotted line. The computer system 20 may include among other things, an OS, a memory, a recording medium, a keyboard, a pointing device, and a display function. The present invention may be accomplished with such an infrastructure. An operation executing sequence and a processing function may be built from information (i.e., data) set through an editing section 1, that stored in a file generated through the editing section 1, and that stored in a memory section 4, while a software code of each of the control sections 5 to 8 is not changed. Specifically, the editing section 1 may have functions of selecting a function of each control section 5 to 8 and editing a processing flow (i.e., sequence). A user may then use the editing section 1 and edit both a desired processing operation and execution sequence. In this way, the user may build software appropriate for each purpose.

A display section 2 may be provided so that a user can edit while using the edit or section 1 and viewing the screen. The display section 2 may be a cathode ray tube (CRT) display or the like. An input section 3 may be provided so that a user may utilize it as an inputting device when editing a processing operation and an execution sequence using the edit or section 1. A keyboard 13 or a mouse 14 or the like may constitute the input section 3. A memory section 4 may be provided so as to store one or more information files edited via the edit or section 1 for respective control sections 5 to 7. A storage medium such as a hard disk drive (HDD) or a floppy disk drive (FDD) or a similar device may constitute the memory section 4. A sequence control section 5 may be provided so as to control an operation executing sequence of an apparatus. Specifically, this may be software that is constituted by information set through the editing section 1, that is generated by the editing section 1, and that is stored in the memory section 4. The apparatus may operate in accordance with a processing flow (sequence) of this sequence control section 5. A function control section 6 may be provided so as to control an operation processing of an apparatus. Specifically, this may be software that is constituted by any one of information set through the editing section 1, that generated by the editing section 1, and that stored in the memory section 4. Under control of the function control section 6, a peripheral equipment control section 7 and a peripheral equipment communication section 8 may be operated, and an internal operation may be executed.

The peripheral equipment control section 7 may control peripheral equipment having an external I/F 12 such as one of a parallel port and a digital I/O. The peripheral equipment control section 7 may operate with software that is constituted by any one of information set through a editing section 1, and that generated by the editing section 1 and stored in the memory section 4 under control of the function control section 6. The peripheral equipment communication section 8 may control a peripheral equipment having a communication I/F of a serial communication type such as RS232C to perform communication while performing a handshake. The peripheral equipment communication section 8 may also operate with software that is constituted by any one of information set through the editing section 1, that generated by a editing section 1 and stored in the memory section 4 under control of the function control section 6. Instead of the memory unit 4, an external memory unit 9 or a large capacity database 10 may be used as storage. Respective terminals 11 and 15 may be utilized via a network 17 as an input device. In addition, remote diagnosis may be employable from a workstation 16.

An example configuration of an inspection system that the computer system of FIG. 1 may be applied to may be described with reference to FIG. 2. This represents an example in which the computer system 20 is applied as an inspection system for a printed circuit board (PCB). An inspection host PC 21 may be provided to correspond to the computer system 20 illustrated in FIG. 1. Peripheral equipment control section 7 may control either or both of an inspection circuit 22 and a digital oscilloscope 25 via a parallel I/F 1-2, and a GPIB board 1-3. The peripheral equipment communication section 8 may perform communication performing the handshake with a Jig ROM 4-2 of a target PCB 24 via a serial I/F 1-1. Additionally, the peripheral equipment communication section 8 may communicate with a serial printer 3-1, a bar code reader 3-2, and an inline apparatus 3-3 by switching the serial I/F 1-1 to a parallel I/F 1-2 vice versa. The peripheral equipment control section 7 may perform data transfer between the peripheral equipment communication section 8 and an I/O control block 4-3 in the target PCB 24 via the serial I/F 1-1, or between analogue block 4-4 and an image processing block 4-5 via an inspection circuit 22 and a fixture 26.

Figure 6:
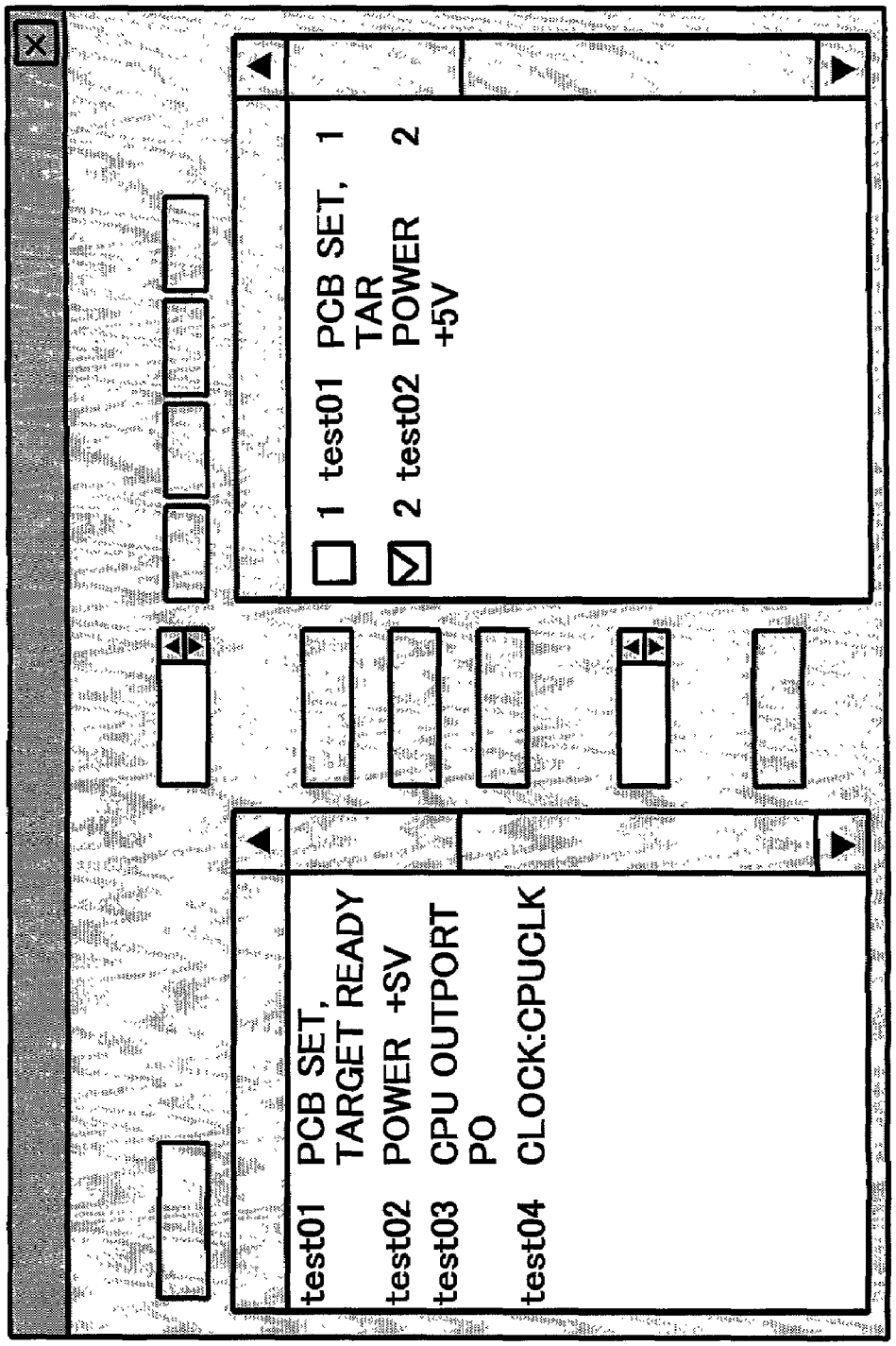
FIG. 6 is also a chart illustrating an exemplary display screen of an editing section GUI2 according to the present invention.

An exemplary screen of the edit or section 1 may be described with reference to FIGS. 5 and 6. An example edit or section GUI-1 is illustrated in FIG. 5. A variety of command names and/or data written in a register may be displayed and recorded per a test sub number in columns P1 to P5 for a test-01. An editing section GUI-2 may be illustrated in FIG. 6. A file name may be recorded per a test ID as a source list. The file name may also be displayed and recorded based on a number of turns as a turn list. In addition, there may exist an operation button region indicating such as a computing list, a main loop, and a repeat number of times.

One configuration example of software and a file may be described with reference to FIGS. 3 to 4. FIGS. 3A-3C illustrate one example of software applied to an inspecting apparatus for a PCB. FIGS. 4A-4C illustrate an example configuration of a file. In FIG. 3, a solid line circle represents a process performed within the present system. A dotted line circle represents a process performed without the present system. A rectangular shape of a triple line (i.e., in FIG. 3A) may be a file that only exists per a system. A rectangular shape of a double line (i.e., in FIG. 3B) represents a file that only exists per one part number. A rectangular shape of a single line (i.e., FIG. 3C) represents a file plural numbers of which exist per one part number. As a process of the present system, there may be four processes such as an inspection executing process 42, an inspection item definition process 35, an execution procedure definition 34, and information to set an oscilloscope obtaining process 33. The inspection execution process 42 may refer, in order to obtain data, to an oscilloscope set file 36, an oscilloscope mask file 37, and a log viewer process 38. Also referred to may be a select log file 38a, an entire log file 39, and an inspection environment preservation file 43. A PLD data correspondent table 44, a PLD data file 46, and a REF data file 47 may be referenced. Also referred to may be an image processing mode conversion table 48, a PLTS register conversion table 49, an inspection item definition file 41, and an inspection execution procedure file 40. The inspection item definition process 35 may refer for data to a part number file 31, the inspection item definition file 41, and a PLTS register conversion table 49. Also referred to may be the image processing mode conversion table 48, a macro definition file 51, and a basic command set file 50.

Figure 4B:
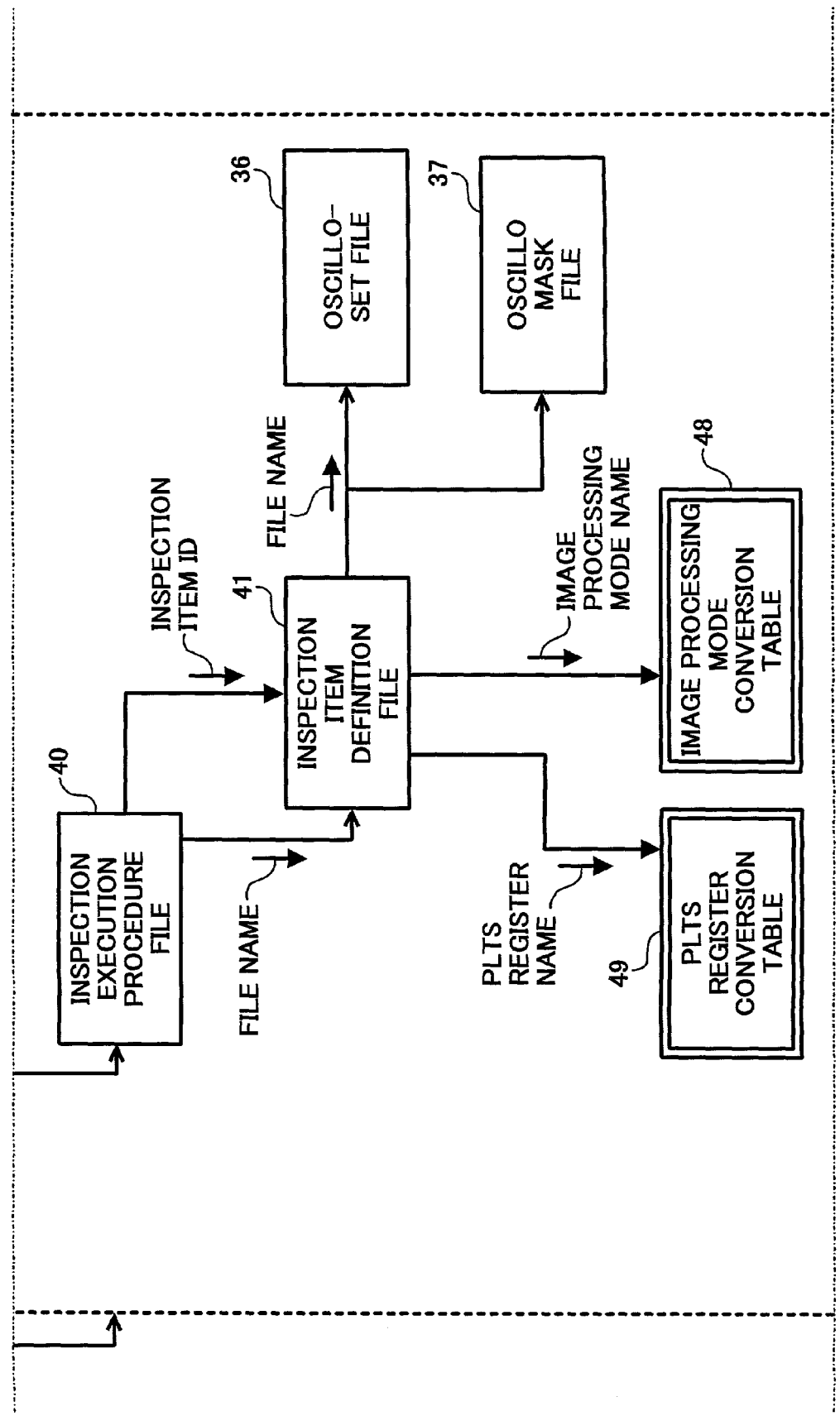

Further, FIGS. 4A-4C illustrate the relationships between files, and refer to an item within a file is indicated by an arrow. In addition, file and folder names may be referred to by an arrow in which the key item is not described. For example, a file name in the inspection environment preservation file 43 may be referred to by the inspection execution procedure file 40. An inspection item ID and a file name in the inspection execution procedure file 40 may be referred to by the inspection item definition file 41. A file name in the inspection item definition file 41 may be referred from the oscilloscope set file 36 and oscilloscope mask file 37. Further, an image processing mode name in the inspection item definition file 41 may be referred from the image processing mode conversion table 48. A PLTS register name in the inspection item definition file 41 may also be referred to by PLTS register conversion table 49.

The first operational example may be described with reference to FIG. 2. Specifically, functional operation is described when the inspection apparatus is used for inspecting a PCB. In this example, an inspection host PC 21 of FIG. 2 corresponds to the computer system 20 of FIG. 1. Initially, a user may apply prescribed settings to those control sections 5 to 7 from the inputting section 3 viewing the display section of FIG. 1. The sequence control section 5 may control a flow of the entire operations in accordance with the set information. The function control section 6 may then control a processing flow of inspection. Under control of the function control section 6, an inspection flow (sequence) may be performed such that the peripheral equipment control section 7 controls the inspection circuit 22, and transmits a test signal to the target PCB 24 via the fixture 26. Subsequently, the peripheral equipment control section 7 receives test resultant data. Simultaneously, the peripheral equipment communication section 8 may perform a handshake with the jig ROM 4-2 of the target PCB 24 so as to perform synchronization with inspection timing. To change an inspection pattern, settings may be changed by adding and correcting at the edit or section 1.

Various modifications of a functional operation may now be described with reference to FIG. 3. In one modification, when a required setting of hardware and a set parameter of its apparatus environment are edited (i.e., selected or set) through the edit or section 1, software may dynamically be changed to at least one prescribed setting in accordance with the apparatus environment in a similar manner to the above-described example. In another modification, an inspection item definition file 41 may be provided to define and set one or more inspection items in an inspection item definition process 35 as shown in FIGS. 3A-3C. An inspection execution process 42 may read and interpret the inspection item definition file 41. Then, the inspection execution process 42 may set individual details of one or more inspection items, and execute the one or more inspection items in sequence.

Yet another modification may be described with reference to FIGS. 7 and 8. The modification may employ an execution procedure process for setting an inspection procedure in addition to the above-described modification. Thus, as noted from FIGS. 3B and 8, an inspection item definition process 35 may read a basic command set file 50 that stores operational parameter information for each inspection in step S91. As illustrated in FIG. 8, the inspection item definition process 35 may then define operational definition based on editing results for each inspection item in step S92, and thereby preserve the definitions as an inspection item definition file in step S93.

Figure 7:
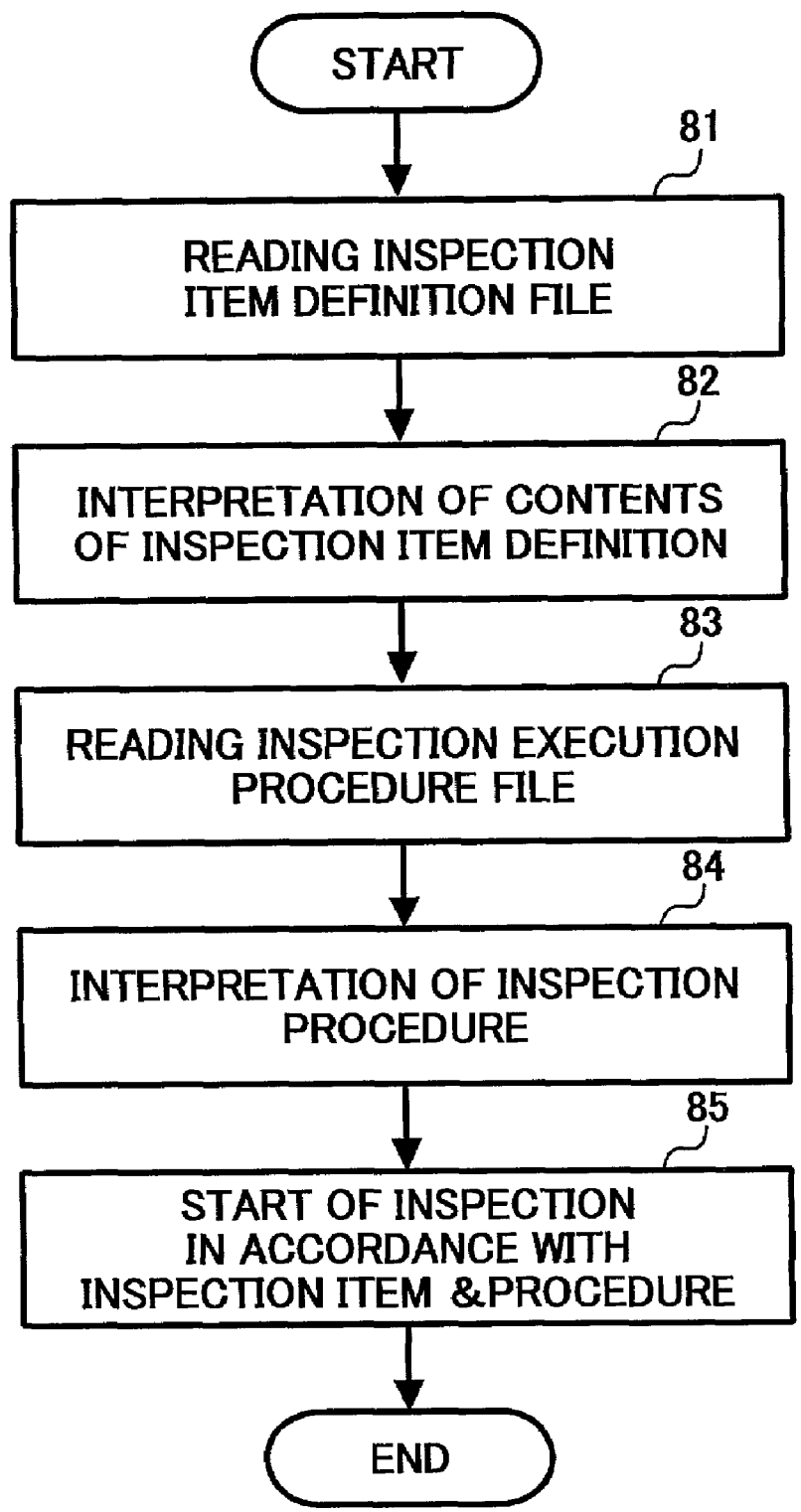
FIG. 7 is a flowchart illustrating an exemplary operational sequence related to beginning with reading an inspection definition file through starting inspection according to the present invention.
Figure 8:
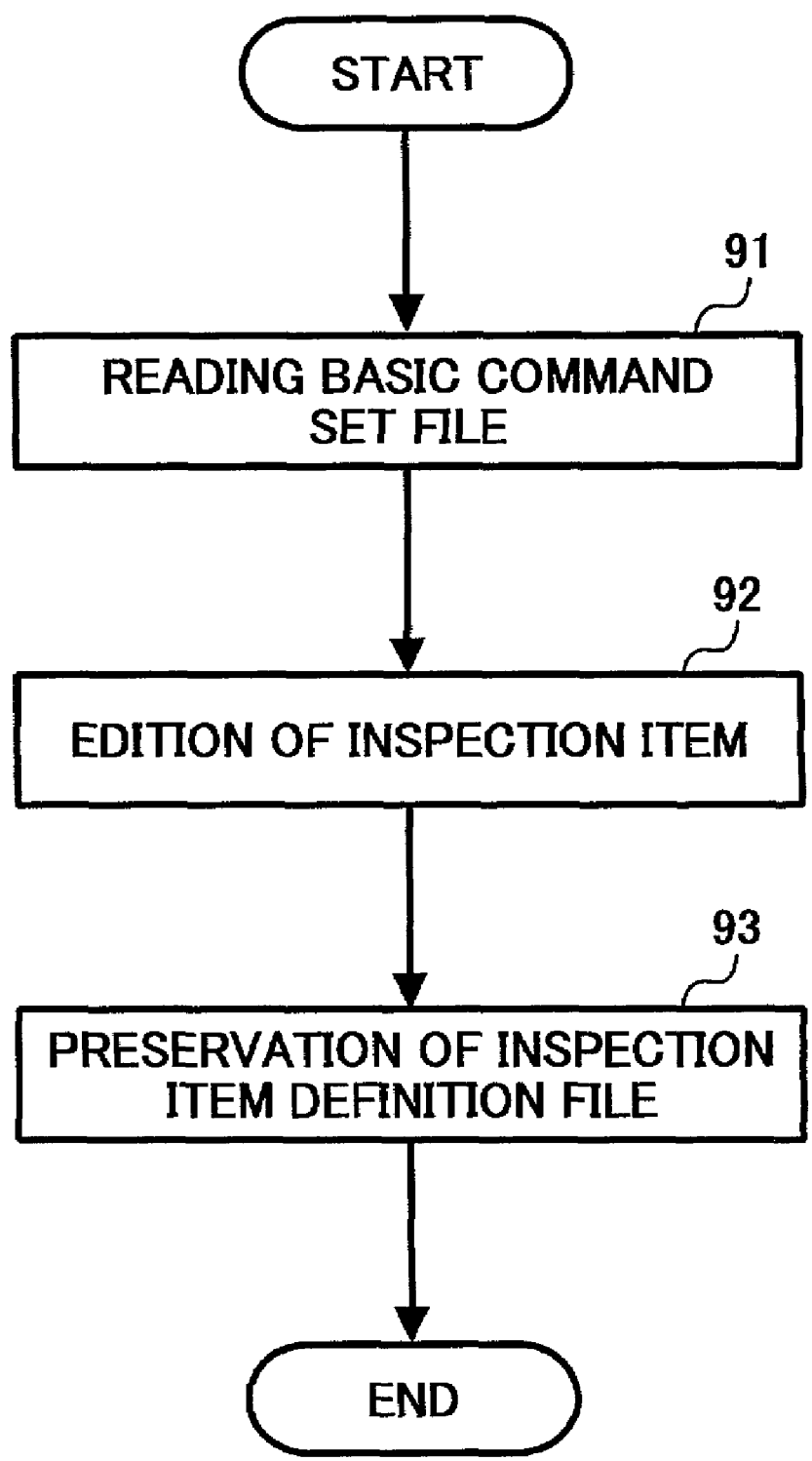
FIG. 8 is a flowchart illustrating an exemplary operational sequence begun when an inspection item is edited from a basic command and ending when an inspection item definition file is preserved according to the present invention.

Subsequently, the execution procedure definition process 34 may set a prescribed inspection procedure as illustrated in FIG. 7. Such an inspection procedure may set an operation flow for determining that which inspection items are executed by how many times in what order. As illustrated in FIG. 7, an inspection item definition file 41 previously generated may be referred to in step S81. Prescribed inspection items may be detected, an order may be reshuffled, and an execution number of times or the like may be performed in step S82. The information may then be preserved in an inspection execution procedure file 40. Operable software may be part of the inspection execution process 42, and may execute inspection based upon the inspection execution procedure file 40 previously set and preserved. One or more inspection items may be sequentially called from execution procedure file 40 in step S83, and an inspection procedure may be interpreted in step S84. Inspection may then be performed in accordance with processing information of an inspection item stored in the corresponding inspection item definition file 41 in step S85. When the designated number of iterations has been completed, the next inspection item may be called, and processing similar to that as illustrated in FIG. 7 may be performed.

Still other modifications may be described with reference to FIGS. 8 and 9. The above-described modification may be accomplished in a manner similar to that which is illustrated by a flowchart in FIG. 8 using a basic command set file 50 that defines primitive command bands (including control command bands for controlling at least one peripheral device) together with an inspection item definition file 41 that defines inspection items. In FIG. 8, a prescribed primitive basic command band may be read from the basic command set file 50 in step S91. A single basic command or multiple basic commands may be set out as a unit of inspection item details on the editor 1 in step S92. Subsequently, the details may be preserved in the inspection item definition file 41 in step S93. The editing operation performed in step S92 may be illustrated on the editing section GUI-1 in FIG. 5 as one example.

Figure 9:
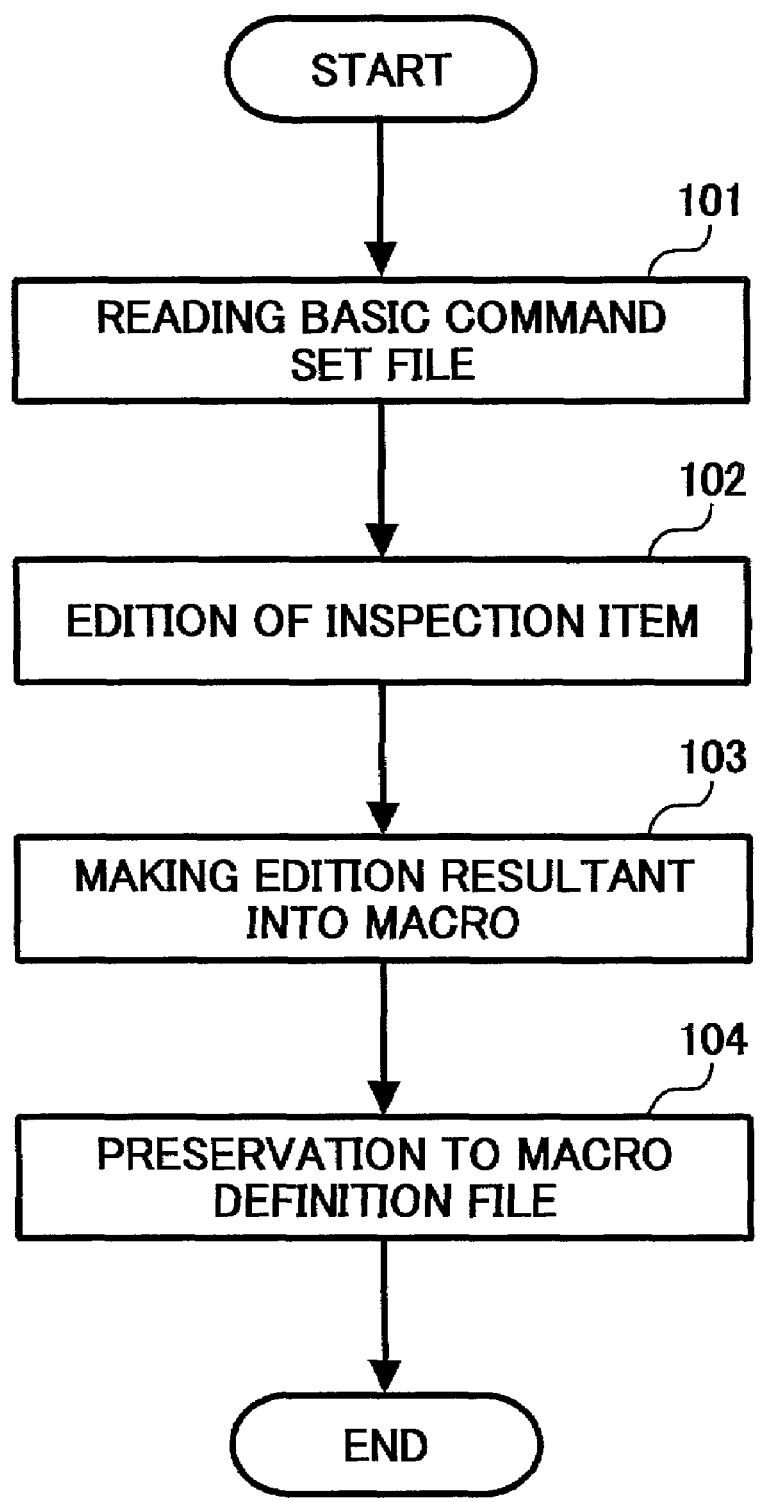
FIG. 9 is a flowchart illustrating an exemplary operational sequence during which an inspection item is edited from a basic command, a edition resultant is made into a macro, and a macro definition file is preserved according to the present invention.

FIG. 9 is a flowchart illustrating (a process) up to preservation to a macro definition file. This modification may accomplish the function illustrated in FIG. 3 by using a macro definition file 51 which defines a prescribed combination of basic commands, called a macro, through a process illustrated in FIG. 9 in addition to the basic command set file 50 defining the primitive command band. Specifically, as noted from FIG. 9, a prescribed primitive basic command band may be read from the basic command set file 50 in step S101, and a single or multiple basic commands may be set out on the editor as a unit of inspection item details in step S102. A macro name may be put to the set out basic command band so as to set the macro in step S103, and then preserved in the macro definition file 51 in step S104.

Still another modification may be described with reference to FIGS. 11A-11C, which illustrate a basic command file format. In the modification, parameter information included in each command may be previously defined, and various informational characteristics related to a number of parameter of commands, a version of parameter, the minimum and maximum values, and selection information or the like may be set in the basic command set file 50. The editorial function 1 may then realize its editorial function based upon this information. Thus, when an applicable parameter is selected, the screen may enable a user to input one of the alternatives, a value, and character strings thereon within a designated range. The format of the basic command file may include a header section having a file ID, a version, a command number and similar information, as well as a data section having a basic command or the like. The basic command format may adopt a format such as "command"+"parameter 1"+"parameter 2".

Figure 10:
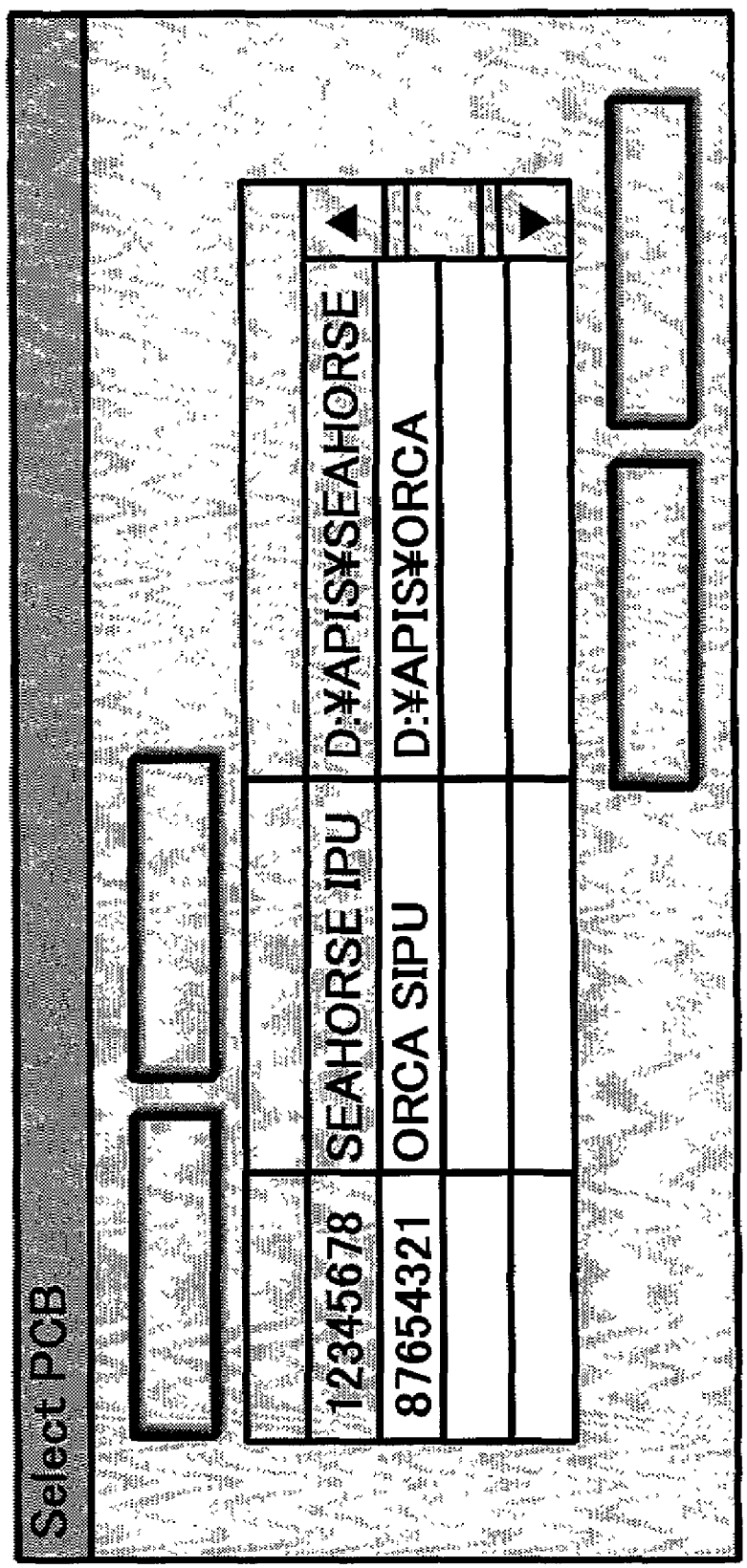
FIG. 10 is a chart illustrating a display screen of an exemplary part number selection GUI according to the present invention.

Yet another modification may now be described with reference to FIG. 10. FIG. 10 illustrates a part number selection GUI. In an exemplary inspection system, a PCB may be inspected by referring to the necessary one or more files. Specifically, a variety of files may be supervised per an inspection receiving PCB, and automatically set in a directory. Editing of each control section may be performed by respective processes of an inspection execution definition process 42, an execution procedure definition process 34, an oscilloscope set information obtaining process 33, and an inspection execution process 42 for executing software performing inspection as illustrated in FIG. 3. Such setting and execution of such processes may be started when an applicable PCB (e.g. part number) is selected through the setting screen of FIG. 10.

A file generated by the editing section 1 may always be stored in a file directory having a selected part number. A control section (i.e., an inspection execution process 42) may select a part number of an inspection objective PCB when it is started, and obtain an applicable directory. Then, data of a necessary parameter file may be referred to based upon the directory in accordance with the PCB, and software may be executed. A variety of segments "B" and "C" of an exemplary file construction illustrated in FIG. 4 may automatically be stored in a directory per a PCB, and linked thereafter.

Figure 12:
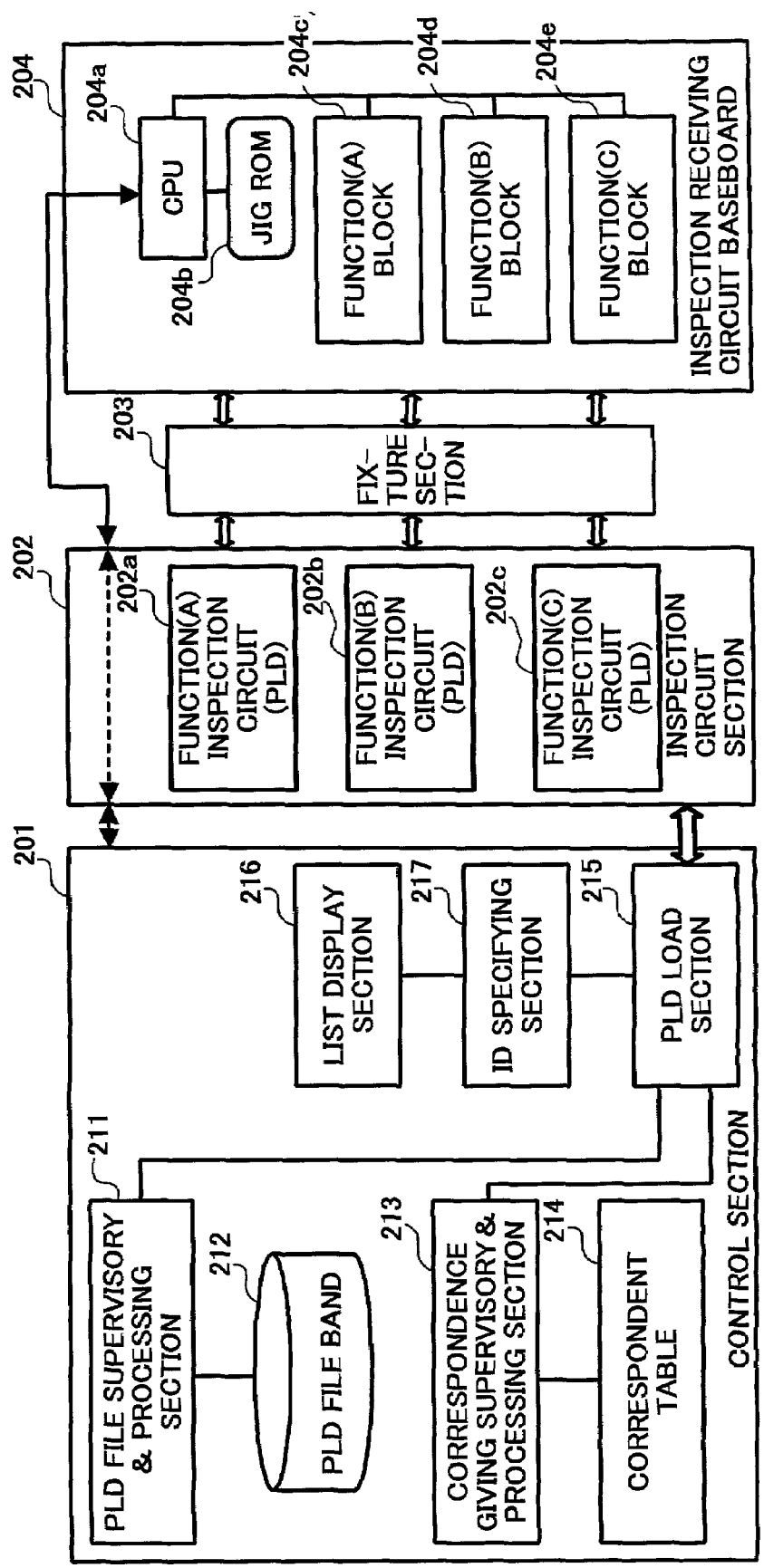
FIG. 12 is a schematic block chart illustrating an exemplary configuration of a circuit baseboard inspection apparatus according to the third embodiment of the present invention.
Figure 13:
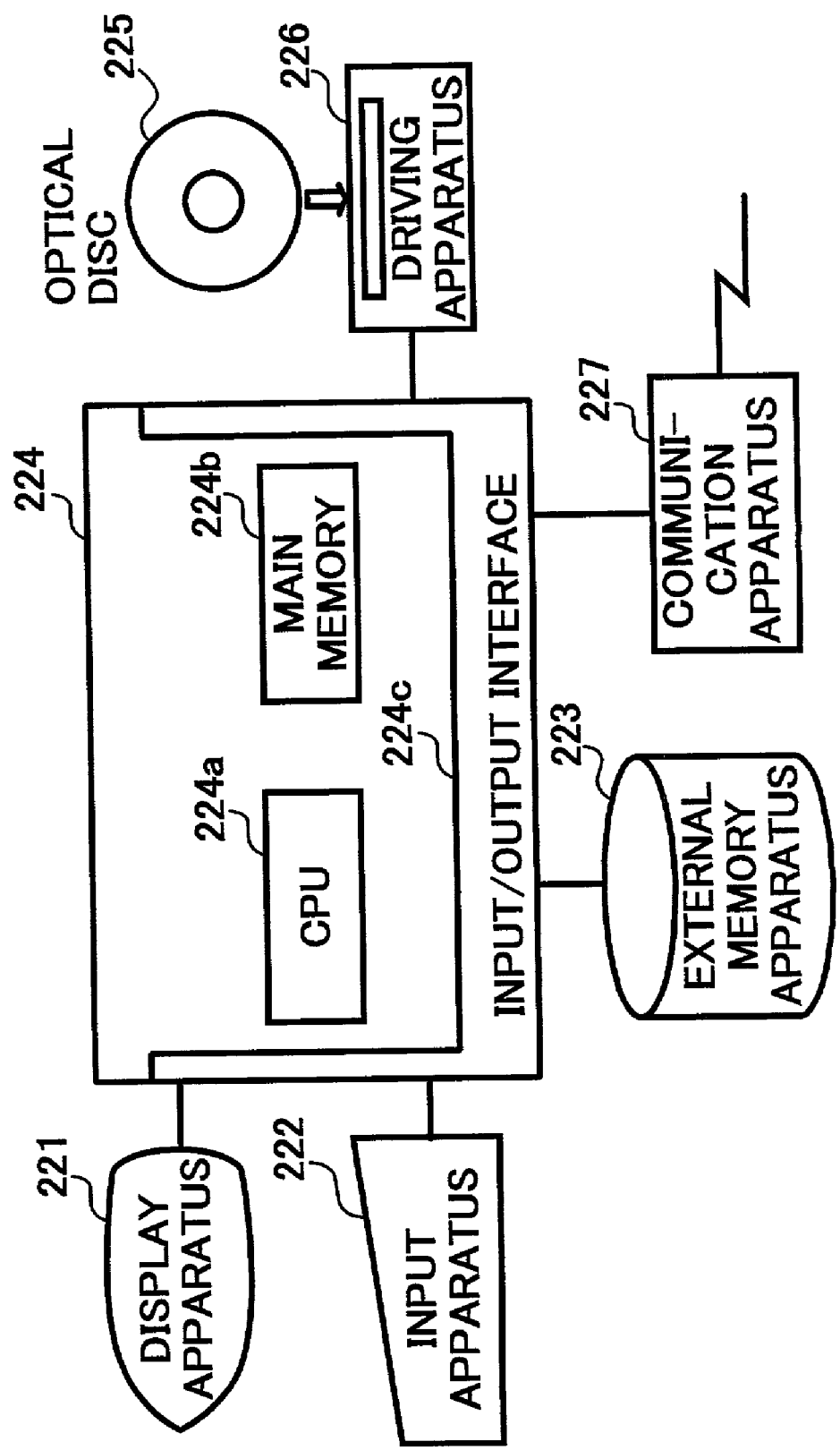
FIG. 13 is a schematic block chart illustrating an exemplary hardware of a control section disposed in the circuit baseboard inspection apparatus illustrated in FIG. 12.

In FIGS. 12, 13, 15 and 18, the numbers described herein correspond to the last two digits (i.e., 202 refers to 2) of the number shown in those figures. The second embodiment of the present invention may be described in detail with reference to FIGS. 12 to 39. FIG. 12 is a block diagram illustrating an exemplary configuration of a circuit baseboard inspection apparatus of the second embodiment. FIG. 13 is a block diagram illustrating a hardware configuration example of a control section of the circuit baseboard inspection apparatus of FIG. 1.

In FIG. 13, reference numeral 21 denotes a display such as one of a Cathode Ray Tube CRT, an Liquid Crystal Display LCD, or the like devices. Reference numeral 22 denotes an input apparatus such as a keyboard, a mouse and so on. Reference numeral 23 denotes an external memory unit with Hard Disc Drive (HDD) or the like. Reference numeral 24 denotes an information processing apparatus that may include a Central Processing Unit (CPU) 24a, a main memory 24b, and an input/output interface 24c or the like so as to perform computer processing. Reference numeral 25 denotes an optical disc that may include, for example, a Compact Disc-Read Only Memory (CD-ROM), and a Digital Video Disc/Digital Versatile Disc (DVD) or the like, in which program and data may be recorded. Reference numeral 26 denotes a driving apparatus for reading the program and data which may be recorded in the optical disc 25. Reference numeral 27 denotes a communication apparatus including a Local Area Network LAN card, a modulator-demodulator (MODEM), or similar devices.

The program and data stored in the optical disc 25 may be installed in the external memory unit 23 by the information processing apparatus 24 via the driving apparatus 26. Subsequently, these may be read from the external memory unit 23 to the main memory 24d, and processed by the CPU 24a. A control section 1 may be constructed by the information processing apparatus 24 so as to control the circuit baseboard inspection apparatus illustrated in FIG. 12.

Figure 14:
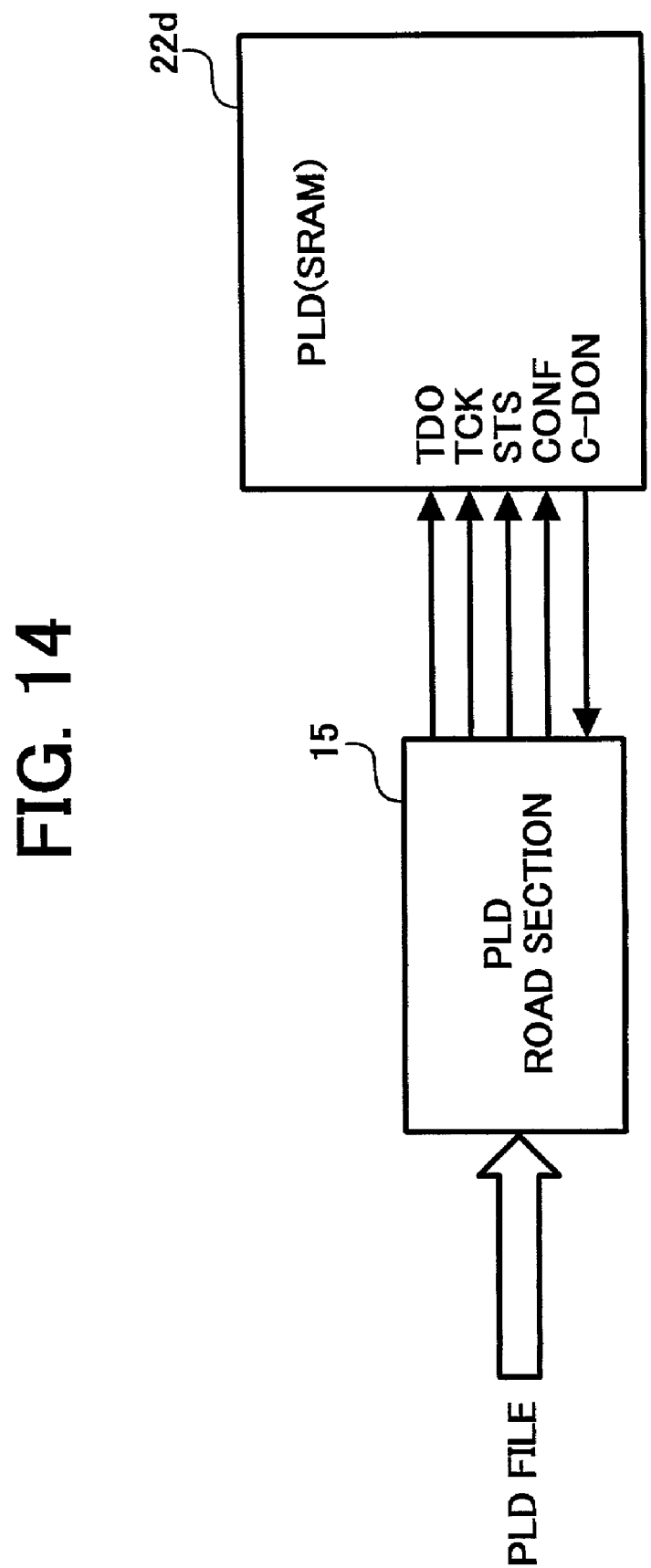
FIG. 14 is a schematic block chart for illustrating a configuration example of a system that rewrites a PLD internal circuit formed in an inspection circuit section disposed in the circuit baseboard inspection apparatus of FIG. 12.

As illustrated in FIG. 12, the circuit baseboard inspection apparatus of this example may include the control section 1 of the computer system construction of FIG. 14 and an inspection circuit section 2, and a fixture section 3 performing as an interface with a target to be inspected. Thus constructed circuit baseboard inspection apparatus may communicate signals with an inspection receiving circuit baseboard 4 serving as the target through the fixture section 3 in the inspection circuit section 2 under control of the control section, and may inspect the performance of the inspection receiving circuit baseboard 4.

The inspection receiving circuit baseboard 4 may have multiple function blocks, such as a function A block 4c, a function B block 4d, and a function C block 4e, in this example. A signal required for inspection per a function block may be transmitted to the inspection circuit section 2 via the fixture section 3.

The control section 1 may generally control the entire inspection apparatus. Specifically, the control section 1 may control both of the inspection circuit section 2 and the inspection receiving circuit baseboard 4 via the CPU 4a and a device ROM 4b in accordance with an inspection purpose.

The inspection circuit section 2 may include hardware required for inspection in accordance with inspection details for each of the function blocks of the inspection receiving circuit baseboard 4. Such an inspection circuit section 2 may time input/output signals of the inspection receiving circuit baseboard 4 and determine a result of the inspection.

In such cases, because a number and timing of a signal may vary per a product class of an inspection receiving circuit baseboard, a separate inspection circuit baseboard 2 should be utilized per such a product class even if it has a similar function.

In this example of the circuit baseboard inspection apparatus, either this inspection circuit section 2 or a portion of it may be configured by a PLD (PLD) such as a fuse type, a ROM type, or an SRAM type. Then an internal circuit of the PLD or the like may be rewritten and a plurality of different product class inspection receiving circuit baseboards 4 may be one inspection circuit section 2.

In this example, each of a function A inspection circuit 21, a function B inspection circuit 22, and a function C inspection circuit 23 of the internal PLD circuit may be provided in accordance with the function A block 4c, function B block 4d, and function C block 4e of the inspection receiving circuit baseboard 4, respectively.

In addition, the inspection circuit may be made into a module per a function. A portion of the circuit variable per a product class of the inspection receiving circuit baseboard 4 may be configured by a PLD. Specifically, the portion may be changed to a PLD with an internal logic in accordance with a difference in an inspection receiving circuit baseboard. Thus, inspection regarding a plurality of models of inspection receiving circuit baseboards 4 is possible without changing a hardware of an inspection circuit section.

In this way, inspection for multiple product classes of an inspection receiving circuit baseboard 4 may be realized without changing the hardware of an inspection circuit section 2 by forming at least a portion of an inspection circuit section 2 with a PLD, and changing to the PLD with a prescribed internal logic in accordance with a difference in an inspection receiving circuit baseboard.

As a result, a period of time taken to manufacture and debug a circuit baseboard inspection apparatus may be greatly reduced. In addition, since commonality of an inspection circuit portion may be enabled only one circuit baseboard inspection apparatus is required to inspect multiple product classes of an inspection receiving circuit baseboard.

Further, in order to efficiently change a PLD so as to have an internal logic correspond to a difference in an inspection receiving circuit baseboard, this example of a circuit baseboard inspection apparatus may employ a PLD file supervisory processing section 11, a PLD file band 12, and a correspondence assigning supervisory processing section 13. Also employed may be a correspondent table 14, a PLD load section 15, a list display section 16, and an identification determination section 17 in the control section 1.

By means of the PLD file supervisory processing section 11, a PLD file to be loaded to a PLD may be stored and supervised in the external memory unit 23 or the like as the PLD file band 12. By means of the correspondence assigning supervisory processing section 13, correspondence assigning information that assigns correspondence of a PDL file to an inspection receiving circuit baseboard 4 that accepts loading of the PDL file and inspection may be previously registered and supervised in the external memory unit 23 or the like as a correspondent table 14.

The PLD load section 15 may refer to a correspondent table 14 and may extract an applicable PLD file in accordance with an inspection receiving circuit baseboard from the PLD file band 12 and load it in the PLD. In this example, a plurality of versions of an inspection receiving circuit baseboard may be displayed and listed on the display apparatus 21 of FIG. 2 by means of list display section 16. From this list, for example, a prescribed PLD file may be specified by referring to the correspondence assigning information in the correspondent table 14 in accordance with an inspection receiving circuit baseboard whose ID is determined by the identification determining section 17 through a selecting operation performed via an inputting apparatus 22 of the user site. The specified PLD file may then be extracted from the PLD file band 12 and loaded in the PLD.

FIG. 14 is a block diagram illustrating an example configuration of a system in which a PLD internal circuit is rewritten.

Reference numeral 2d, as shown in FIG. 14, may be a PLD of a SRAM type (PLD(SRAM)) that serves as a function inspection circuit (i.e., a function A inspection circuit 2a, a function B inspection circuit 2b, and a function C inspection circuit 2c) instituted in the inspection circuit section 2. The PLD load section 15 may read a PLD file in accordance with an inspection receiving circuit baseboard type from the PLD file band 12 and may write it in the PLD 2d.

In this way, multiple product classes of an inspection receiving circuit baseboard 4 may be inspected without replacing the PLD 2d by instituting both a recordable PLD 2d of a SRAM type and a PLD load section 15. In addition, preparation of a plurality of PLDs in conformity to an inspection receiving circuit baseboard is generally not required. Further, it is possible to suppress an increase in errors caused by storage and replacement of a PLD. Further, a time period during a change in a preparatory plan is substantially not necessitated, thereby it is possible to change an inspection circuit quickly.

Figure 15:
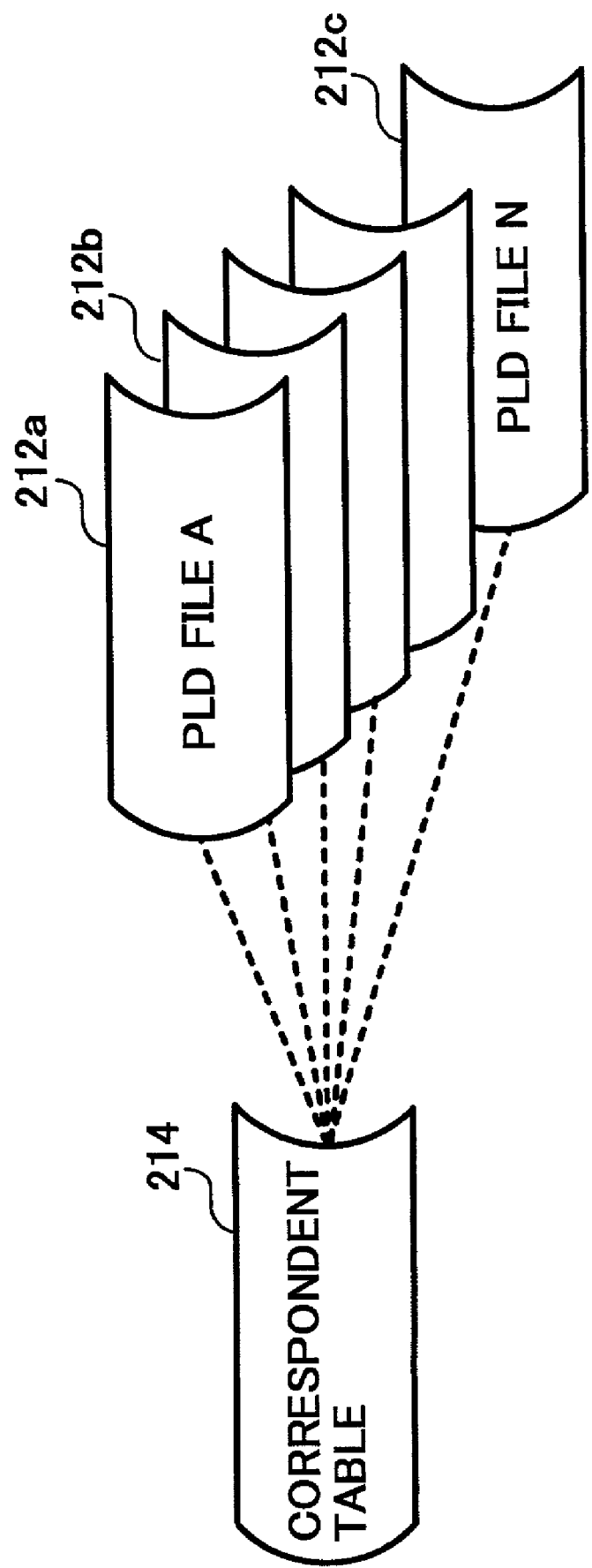
FIG. 15 is an explanatory chart illustrating exemplary correspondence given by a correspondent table in FIG. 12.

FIG. 15 is an chart illustrating an example of a correspondence assigning fashion with the correspondent table in FIG. 12.

As illustrated in FIG. 15, identification information given to a PLD file "A" through "N" may be previously registered in accordance with the inspection receiving circuit baseboard in the correspondent table 14. The PLD load section 15 may specify one or more PLD files in accordance with an inspection receiving circuit baseboard based upon the identification information.

Figure 16:
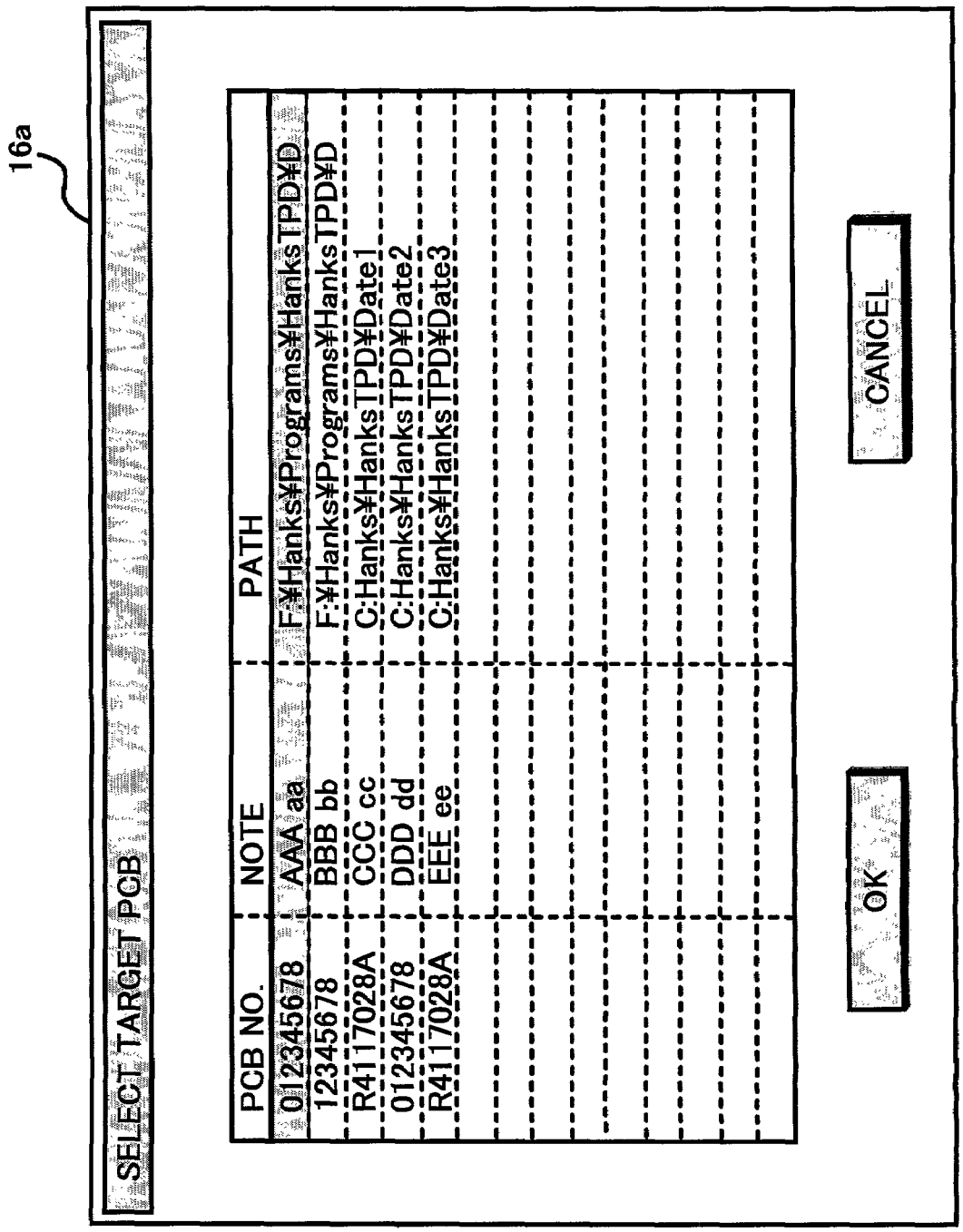
FIG. 16 is an explanatory chart illustrating an exemplary display of a list of inspection receiving circuit baseboards and displayed on a list display section of FIG. 1.

FIG. 16 is an explanatory chart for illustrating an exemplary list of inspection receiving circuit baseboards displayed by the list display section.

As noted from FIG. 16, the list display 16 may display a window 16a displaying respective items (i.e., messages) of "PCB No," "Note," and "Path" on the display apparatus 21. In this example, a user may select all of a record on the first line and the PLD load section 15. The identification determination section 17 may start upon click of the "OK" button.

Figure 17:
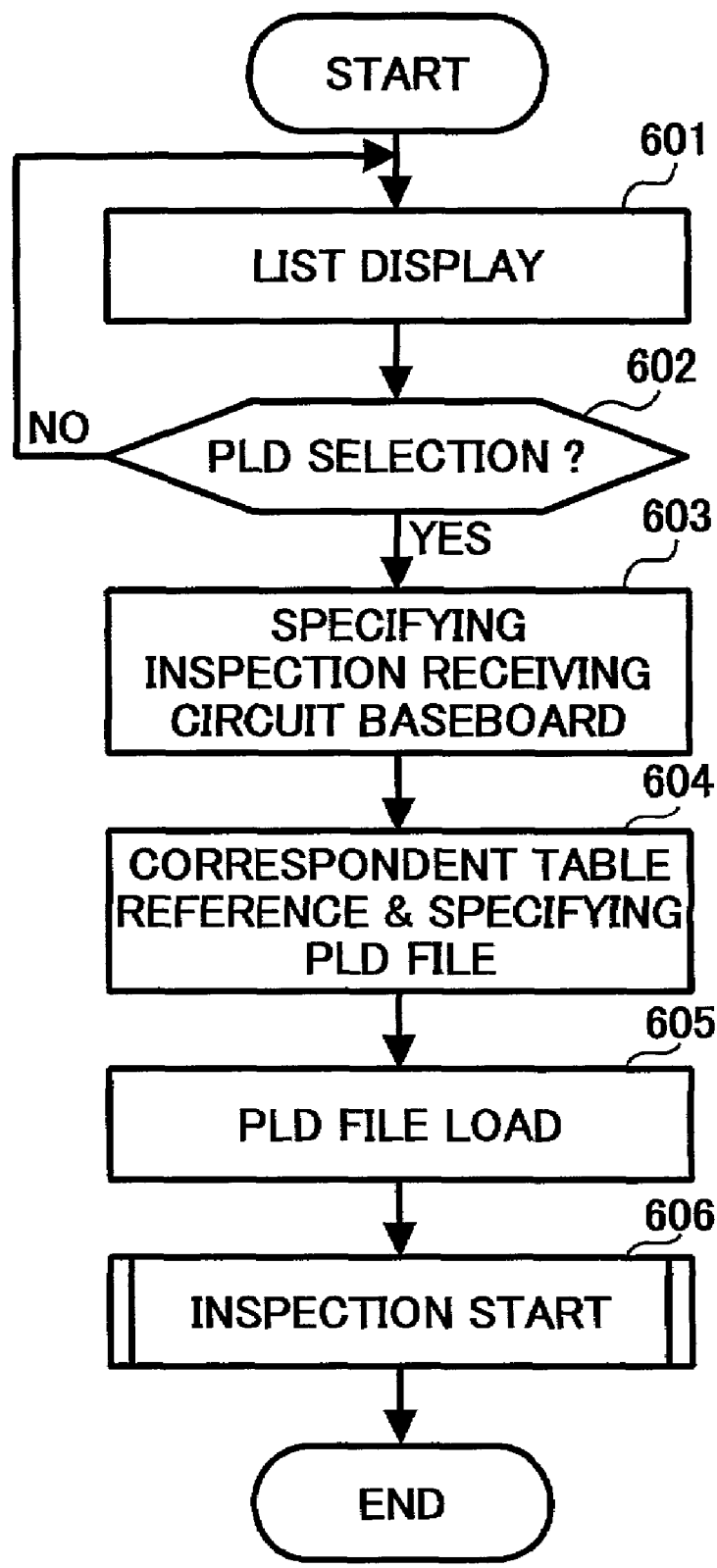
FIG. 17 is a flowchart illustrating an exemplary processing sequence performed by the circuit baseboard inspection apparatus of FIG. 12.

FIG. 17 is a flowchart illustrating an example of a processing operation performed by the circuit baseboard inspection apparatus of FIG. 12.

The list display section 16 may display the list window 16a on the screen of the display apparatus 21 in step S601. If, for example, a user selects a prescribed inspection receiving circuit baseboard in step S602, the identification determining section 17 may determine the inspection receiving circuit baseboard in step S603.

Subsequently, the PLD file section 15 may specify a PLD file in accordance with the inspection receiving circuit baseboard determined by the identification determining section 17 by referring to the correspondent table 14 in step S604. The specified PLD file may be read from the PLD file band 12 and loaded in the PLD in step S605. Subsequently, inspection may begin in step S606.

In this way, according to the circuit baseboard inspection apparatus described with reference to FIGS. 12 to 17, since an appropriate PLD file is automatically loaded in a PLD through selection of an operation of an inspection objective from a list by a user, it is possible to minimize improper loading caused by user error. Simultaneously, hassles, such as loading while confirming one by one, are reduced.

However, even if a PLD may be rewritten while a PLD file is loaded therein in accordance with an inspection receiving circuit baseboard 4, if a user erroneously performs selection through the screen, the inspection receiving circuit baseboard 4 cannot correspond to a PLD internal circuit in the inspection circuit section 2. As a result, abnormal operation and load on the user may result.

An exemplary circuit baseboard inspection apparatus capable of dealing with this type of a problem will be described with reference to FIG. 18.

Figure 18:
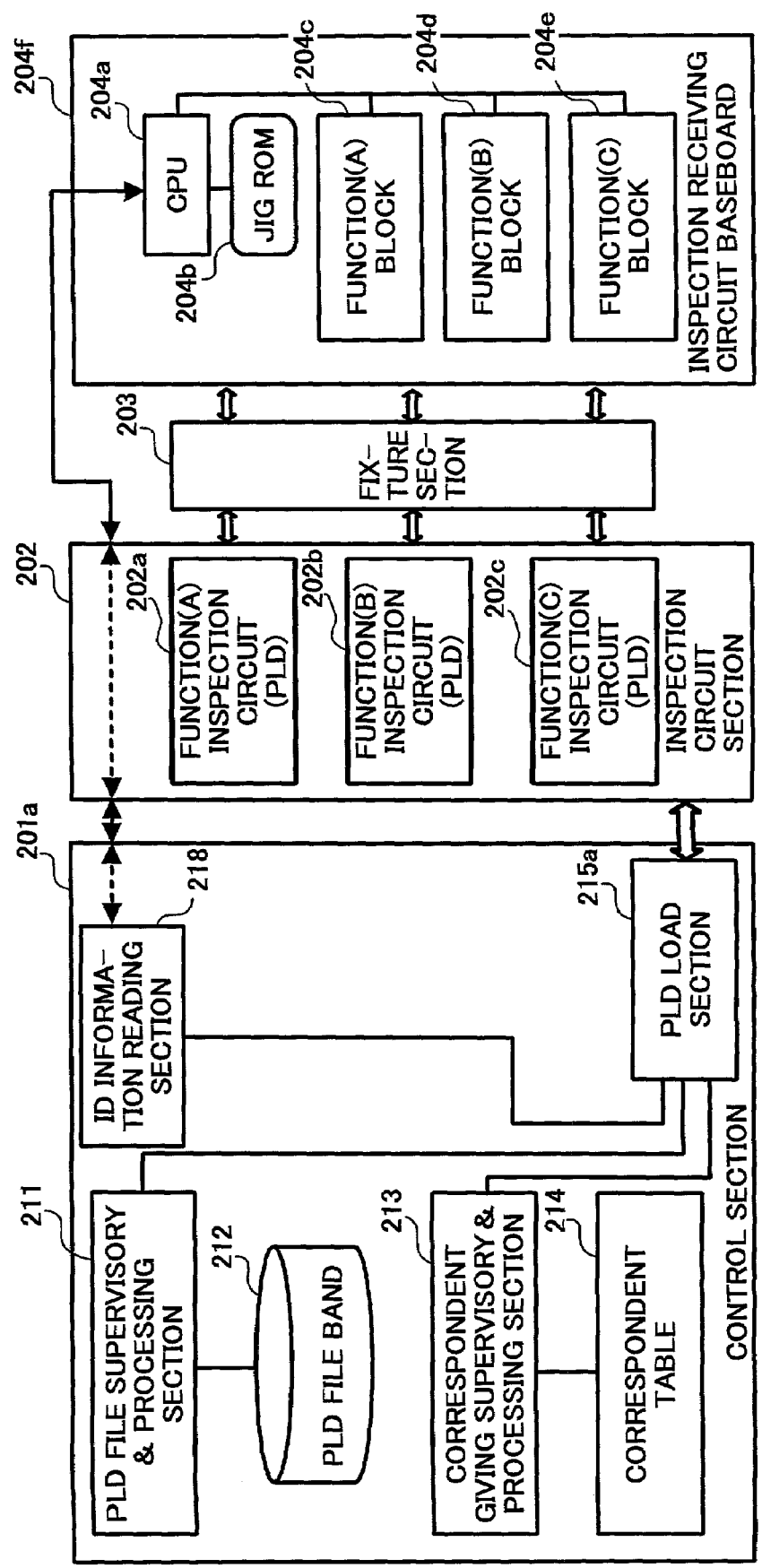
FIG. 18 is a block diagram illustrating the second exemplary configuration of a circuit baseboard inspection apparatus in the present invention.

FIG. 18 is a block chart illustrating an exemplary configuration of a modified circuit baseboard inspection apparatus.

A circuit baseboard inspection apparatus of the type shown in FIG. 18 may additionally institute an identification information reading section 18 to the circuit baseboard inspection apparatus of FIG. 12 in a control section 1a and may omit both of the list display section 16 and identification determining section 17 therefrom. The identification information reading section 18 (see FIG. 19) may communicate with a CPU 4a of an inspection receiving circuit baseboard 4f and may read identification information of an inspection receiving circuit baseboard 4f stored therein. Then a version or the like of the inspection receiving circuit baseboard 4f may be determined.

The PLD load section 15 may specify a PLD file in accordance with the inspection receiving circuit baseboard 4f determined by the identification information reading section 18, while referring to the correspondent table 14. The specified one or more PLD files may then be read from the PLD file band 12 and loaded in the applicable one or more PLDs of the inspection circuit section 2.

Figure 19:
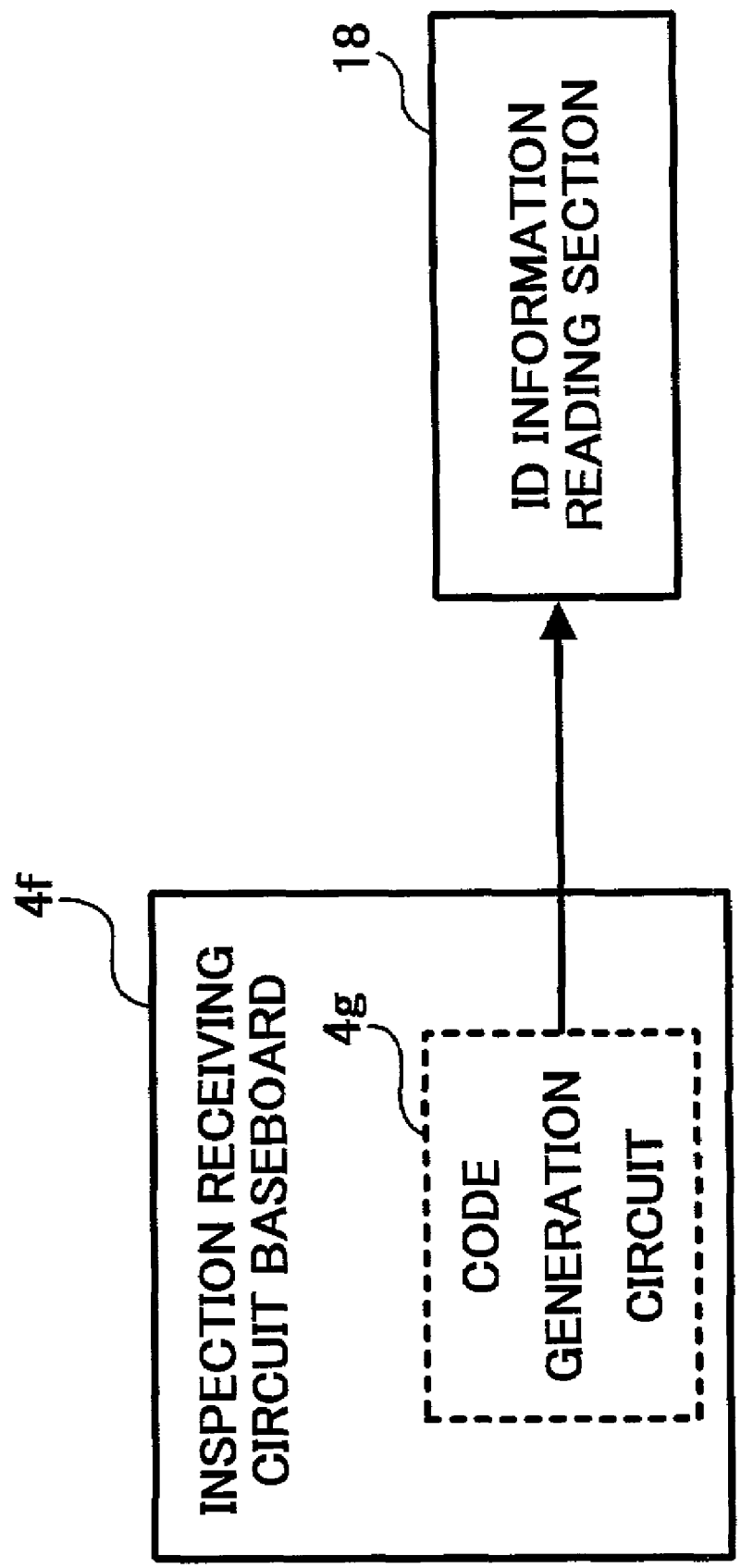
FIG. 19 is a block diagram illustrating an exemplary configuration of a system that determines an inspection receiving circuit baseboard in the circuit baseboard inspection apparatus of FIG. 18.

FIG. 19 is a block diagram illustrating an exemplary configuration of a system of the circuit baseboard inspection apparatus of FIG. 18, which determines an inspection receiving circuit baseboard.

In the inspection receiving circuit baseboard 4f there may be provided a code generation circuit 4g. From one or more codes generated by the code generation circuit 4g, the circuit baseboard inspection apparatus may determine a version of the inspection receiving circuit baseboard 4f with the identification information reading section 18.

Figure 20:
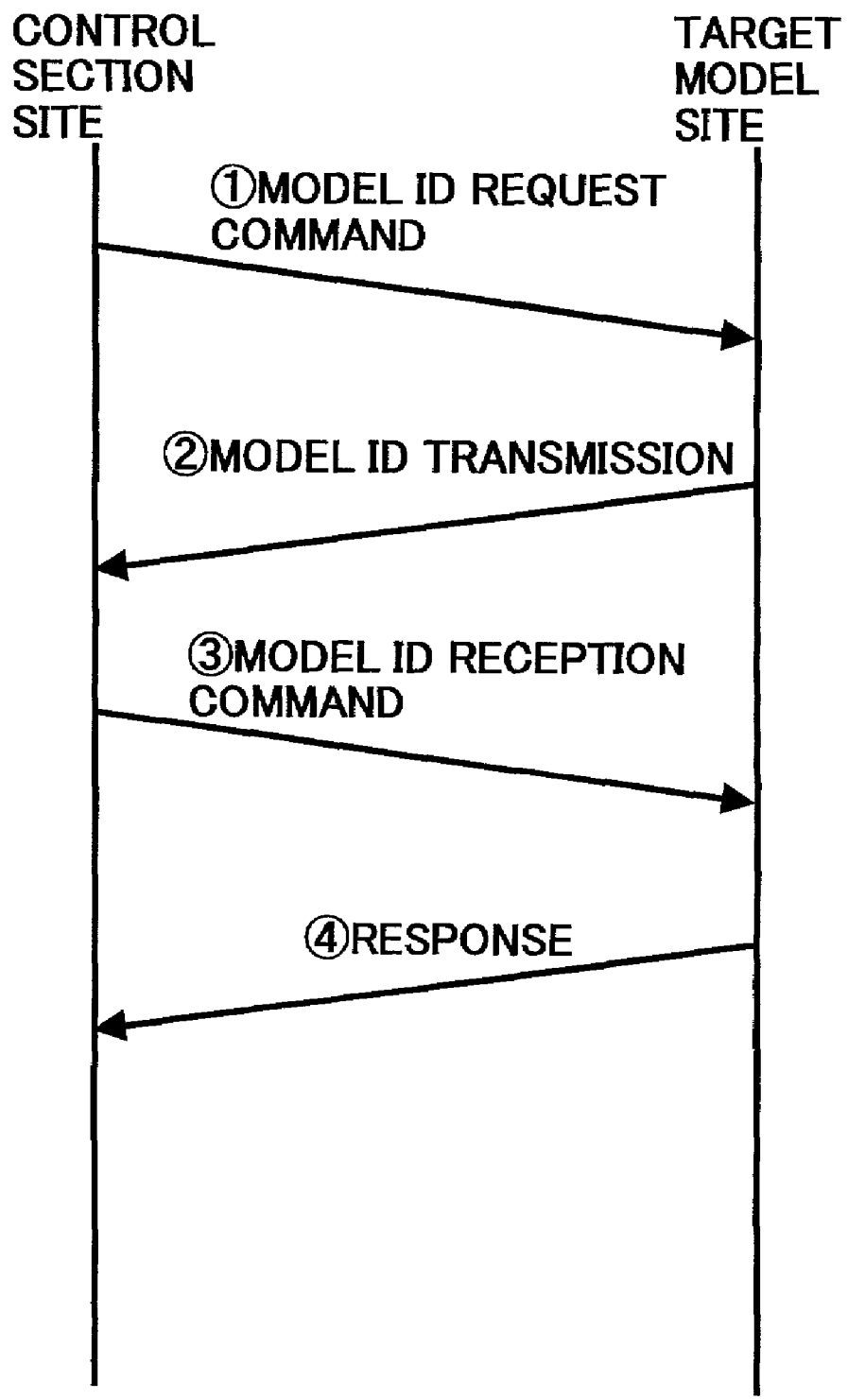
FIG. 20 is a sequential chart for illustrating an exemplary communication performed between the circuit baseboard inspection apparatus and the inspection receiving circuit baseboard of FIG. 18.

FIG. 20 is a sequential chart for illustrating an exemplary communication processing operation method performed between the circuit baseboard inspection apparatus of FIG. 18 and the inspection receiving circuit baseboard 4f.

The example of FIG. 20 may also employ the identification information reading section 18 of FIG. 19 and the code generation circuit 4g. When the circuit baseboard inspection apparatus of a control section site transmits a model ID request command to the CPU site (target model site in the drawing) of the inspection receiving circuit baseboard, the CPU of the inspection receiving circuit baseboard may transmit a code generated by the code generation circuit 4g as a model ID.

The control section of the circuit baseboard inspection apparatus that has received the model ID informs the CPU of the inspection receiving circuit baseboard that it has received the model ID using a model ID reception command. Responsive to such information, the CPU of the inspection receiving circuit baseboard may return a response to the control section of the circuit baseboard inspection apparatus. After that, the process is complete.

In this way, since a PLD file to be loaded is automatically specified by the exemplary circuit baseboard inspection apparatus described with reference to FIGS. 18 to 20, a selection operation of a user may be omitted or reduced when compared with the exemplary circuit baseboard inspection apparatus described with reference to FIGS. 12 to 17. In addition, erroneous inspection operation caused by user error may largely be avoided, thereby improving inspection quality.

Figure 21:
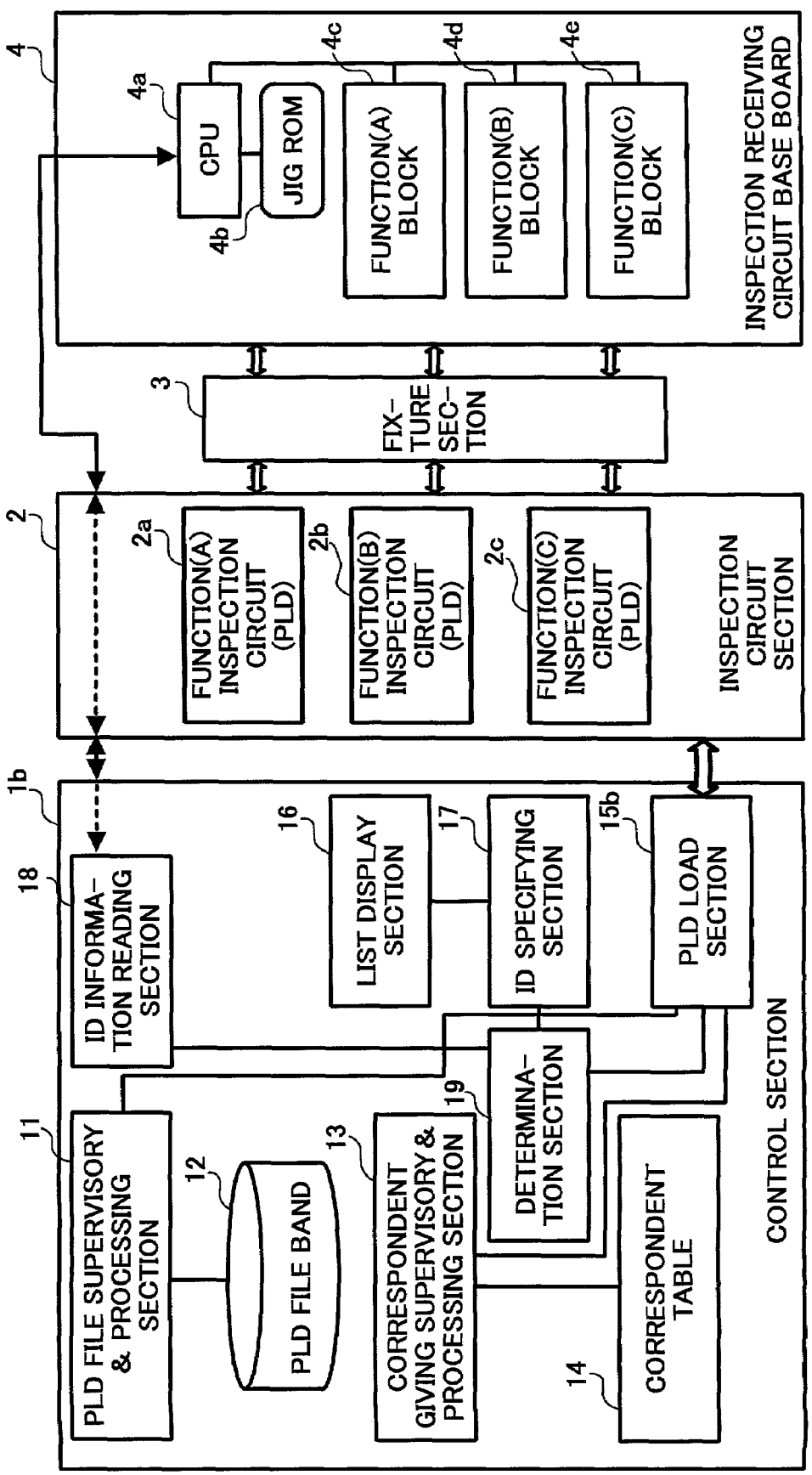
FIG. 21 is a block chart for illustrating another modification of the circuit baseboard inspection apparatus according to the present invention.
Figure 22:
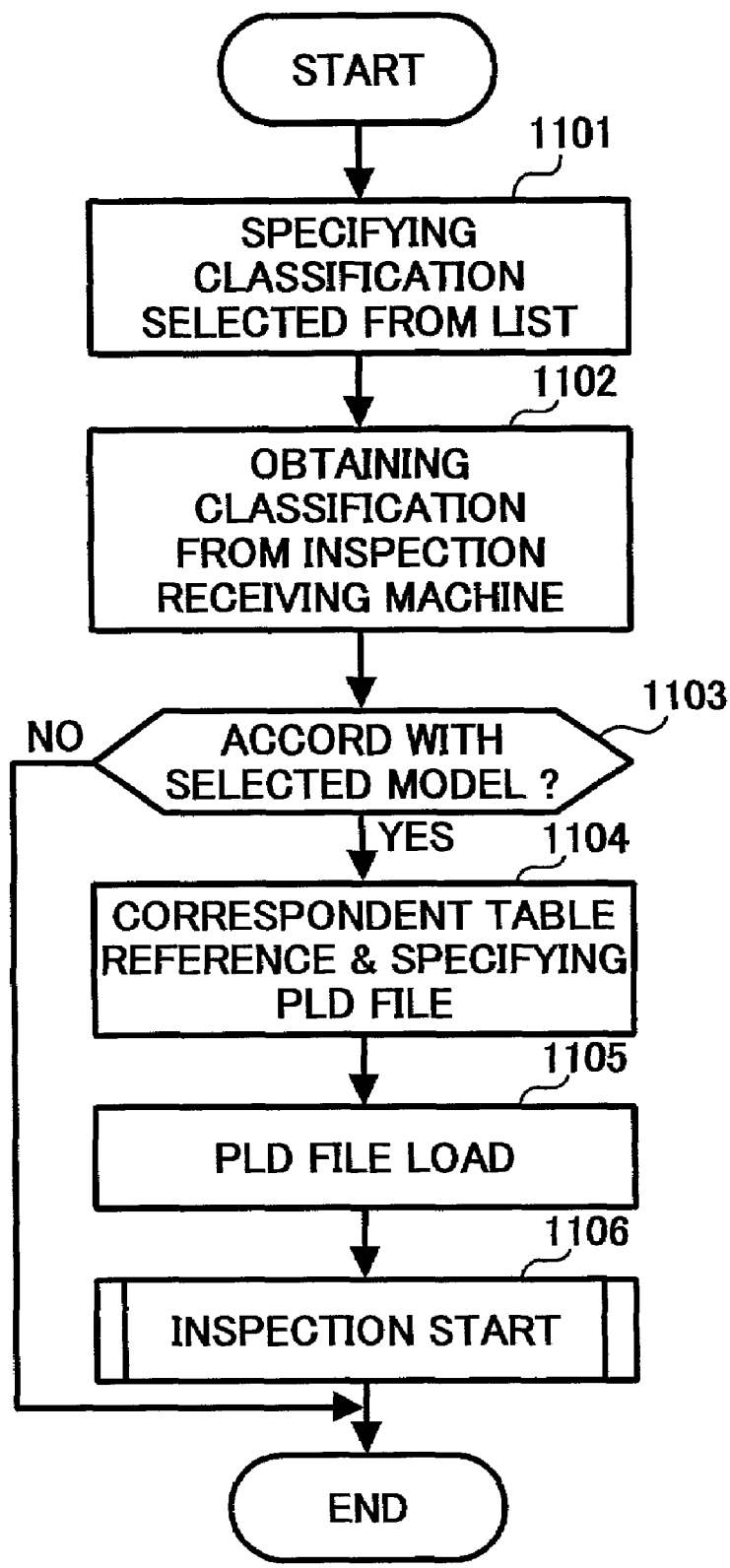
FIG. 22 is a flowchart illustrating exemplary processing of the circuit baseboard inspection apparatus of FIG. 21.

Another exemplary circuit baseboard inspection apparatus capable of obtaining such advantage may be described with reference to FIGS. 21 and 22. FIG. 21 is a block diagram illustrating an exemplary configuration of still another circuit baseboard inspection apparatus. FIG. 22 is a flowchart r illustrating an exemplary processing and operational sequence of the circuit baseboard inspection apparatus of FIG. 21.

A circuit baseboard inspection apparatus of FIG. 21 may again include the identification information reading section 18 of FIG. 18 in the circuit baseboard inspection apparatus of FIG. 12 in a control section, and may newly employ a determination section 19. The determination section 19 may determine if an inspection receiving circuit baseboard read by the identification information reading section 18 matches an inspection receiving circuit baseboard selected, for example, by a user from an inspection receiving circuit baseboard displayed on a list of the display control section 16. If the determined inspection receiving circuit baseboard matches that which was selected, a PLD load section 15b may be started. Simultaneously, a PLD file in accordance with an inspection receiving circuit may be specified, and loaded to one or more applicable PLDs.

Specifically, as may be noted in FIG. 22, a version of an inspection receiving circuit baseboard selected from the list may be specified in step S1101. The identification information reading section 18 may then automatically determine the version in step S1102. If these versions accord with each other in step S1103, the PLD load section 15b may specify a PLD file in accordance with the version specified in step S1101 by referring to the correspondent table 14 in step S1104. The specified PLD file may then be read from the PLD file band 12 and loaded in the PLD in step S1105. Then, inspection may begin in step S1106.

In this way, since loading of a PLD file to a PLD by the exemplary circuit baseboard inspection apparatus described with reference to FIGS. 12 to 18 is similarly enabled in the exemplary circuit baseboard inspection apparatus described with reference to FIGS. 21 and 22, user error may largely be avoided. In addition, credibility of the inspection can be improved.

Next, still another modified circuit baseboard inspection apparatus may be described with reference to FIGS. 12 to 22 is now described with reference to FIGS. 12 to 25.

Figure 23:
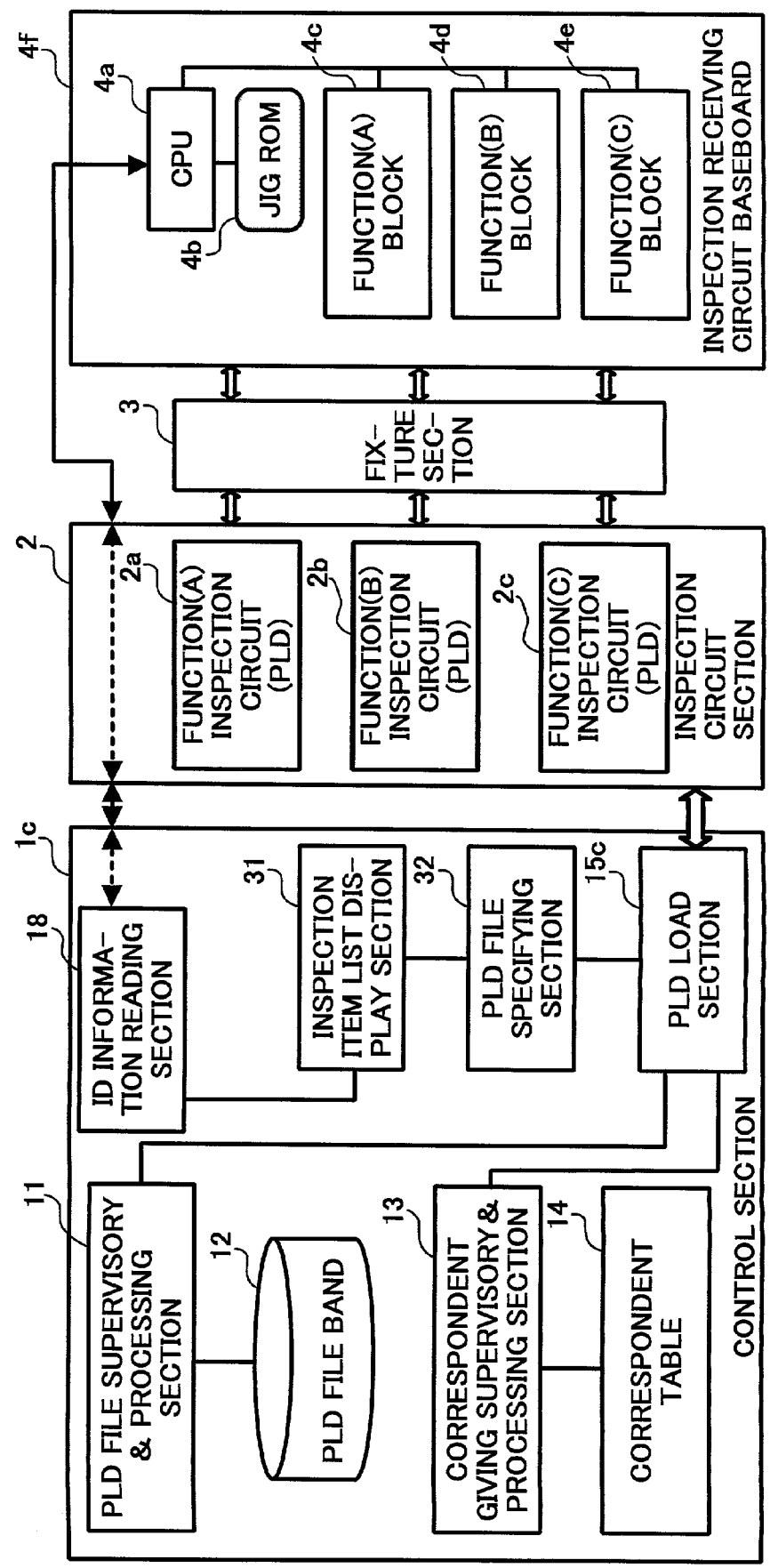
FIG. 23 is a block chart illustrating still another modification of the circuit baseboard inspection apparatus according to the present invention.
Figure 24:
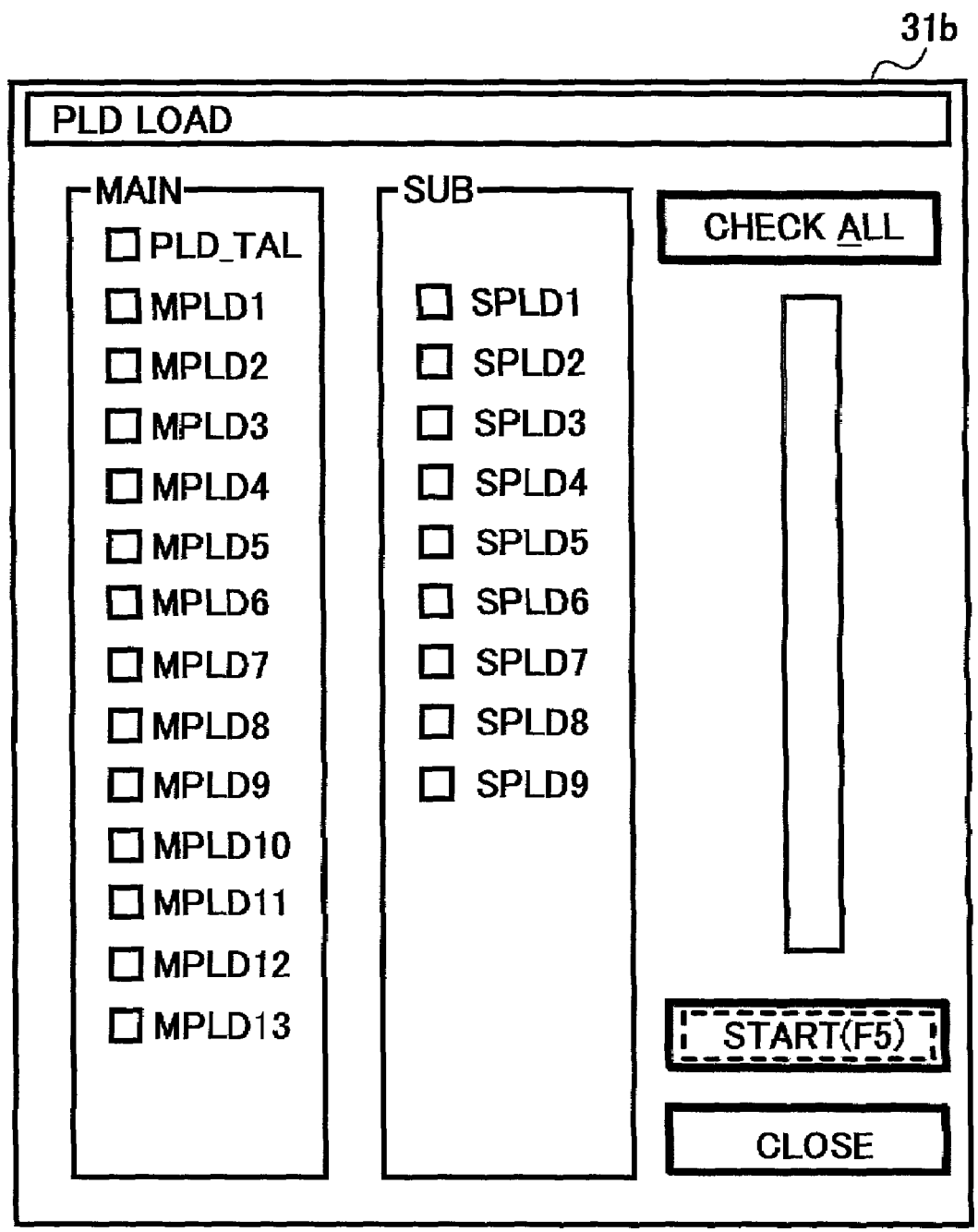
FIG. 24 is an exemplary configuration of a PLD file list displayed in the circuit baseboard inspection apparatus of FIG. 12.
Figure 25:
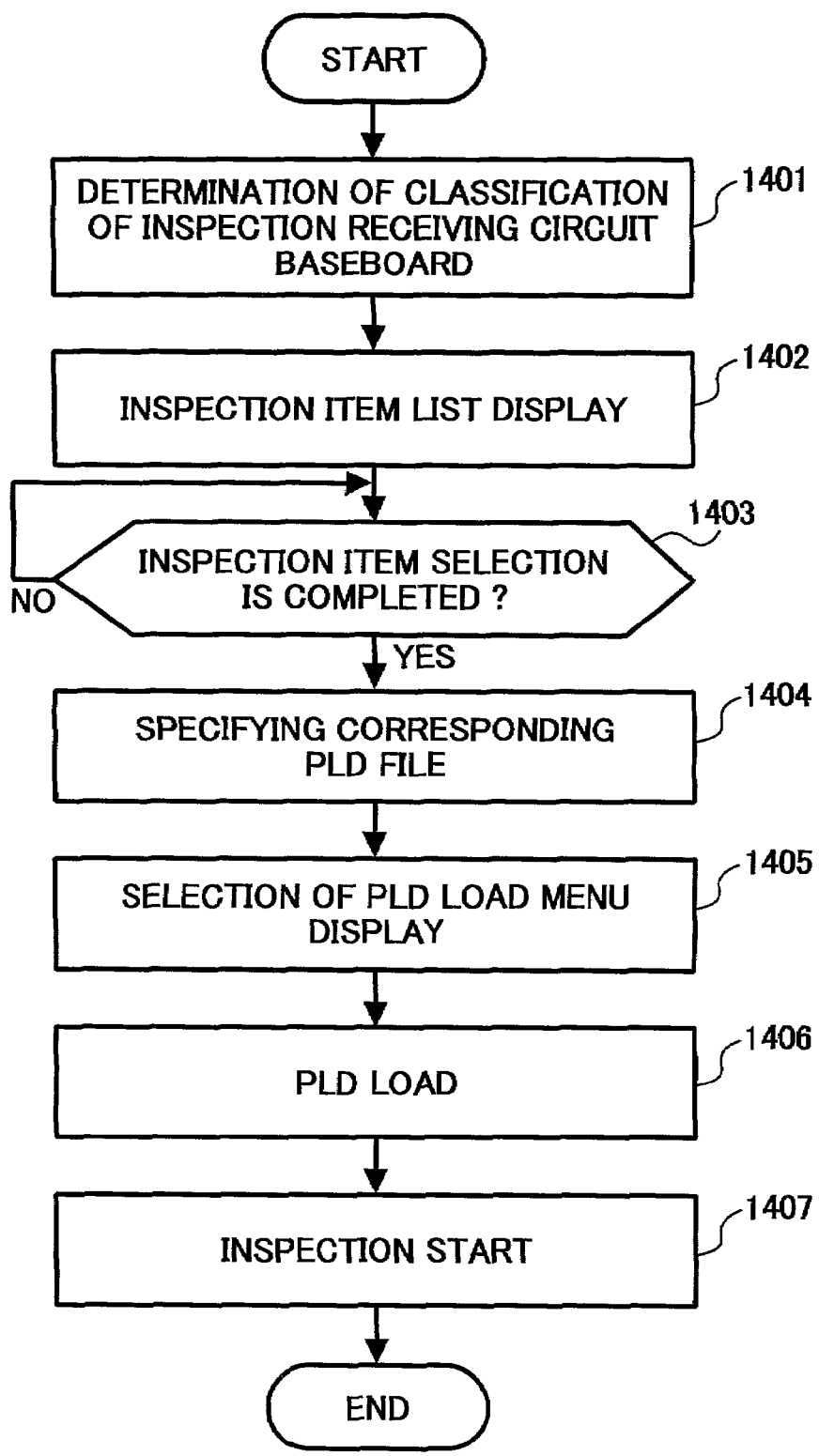
FIG. 25 is a flowchart for illustrating exemplary processing of the circuit baseboard inspection apparatus of FIG. 23.

FIG. 23 is a block chart for illustrating an exemplary configuration of the modified circuit baseboard inspection apparatus. FIG. 24 is an exemplary configuration of a PLD file list displayed on the circuit baseboard inspection apparatus of FIG. 23. FIG. 25 is a flowchart for illustrating an exemplary processing operation of the circuit baseboard inspection apparatus of FIG. 23.

When inspecting an (inspection receiving) circuit baseboard and only a prescribed function, for example, is to be tested, there may exist surplus or more test circuits (i.e., PLD) depending upon details of the inspection. In such a situation, loading the PLD with entire PLD files wastes time by constructing unnecessary inspection environment and unnecessary electrical power consumption. To deal with such problems, the circuit baseboard inspection apparatus of FIG. 23 may newly employ an inspection item list display section 31 and a PLD file specifying section 32 in addition to the circuit baseboard inspection apparatus of FIG. 18 in a control section 1c.

The inspection item list display section 31 may display a list of inspection items for a version of an inspection receiving circuit baseboard 4f which is read by the identification information reading section 18 with a construction displayed on a selection list screen 31b illustrated in FIG. 24. The PLD file specifying section 32 may specify prescribed one or more PLD files in accordance with an inspection item that is selected, for example, by a user from the selection list screen 31b.

In this example, the PLD load section 15c may read only a PLD File specified by the PLD file specifying section 32 as a loading objective in the PLD. Specifically, inspection may be performed only for an inspection item selected by the user from the selection list screen 31b illustrated in FIG. 24.

Specifically, as noted from FIG. 25, the identification information reading section 18 of FIG. 23 may determine a version of an inspection receiving circuit baseboard connected to a device (I/F) in step S1401. Simultaneously, the inspection item list display section 31 may display a list of corresponding inspection items on the screen in step S1402.

From this list, when the user selects one or more desirable inspection items in step S1403, the PDL file specifying section 32 may specify one or more PLD files in accordance with the selected inspection item in step S1404. In addition, the PDL file specifying section 32 may display the PLD file on the screen in a list so as to enable the user to confirm or additionally perform selection in step S1405.

Subsequently, the PDL load section 15c may read one or more PLD files selected by the user from the PLD file band 12 and may load the PLD in step S1406. Inspection may begin in step S1407.

In this way, since the exemplary modified circuit baseboard inspection apparatus described with reference to FIGS. 23 to 25 may pick only a required PLD file up and load an applicable PLD therewith based upon a user's selecting operation, a wasteful loading operation can substantially be omitted with regard to a disused PLD in view of test details. As a result, shortening of the required set up time for inspection may be facilitated, and a constructional scale of the inspection circuit itself can be downsized.

Figure 26:
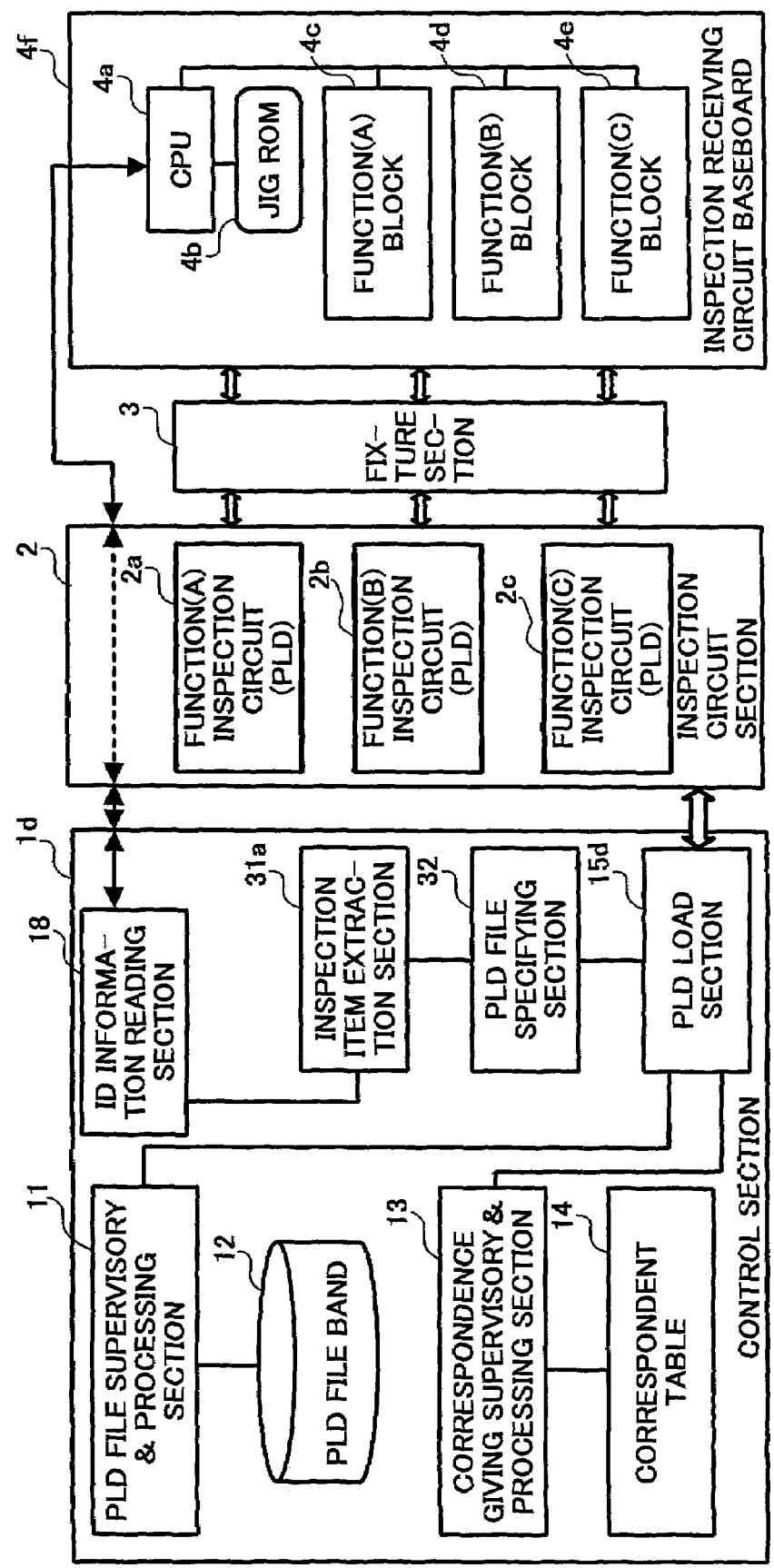
FIG. 26 is a block chart illustrating yet another modified configuration of the circuit baseboard inspection apparatus according to the present invention.
Figure 27:
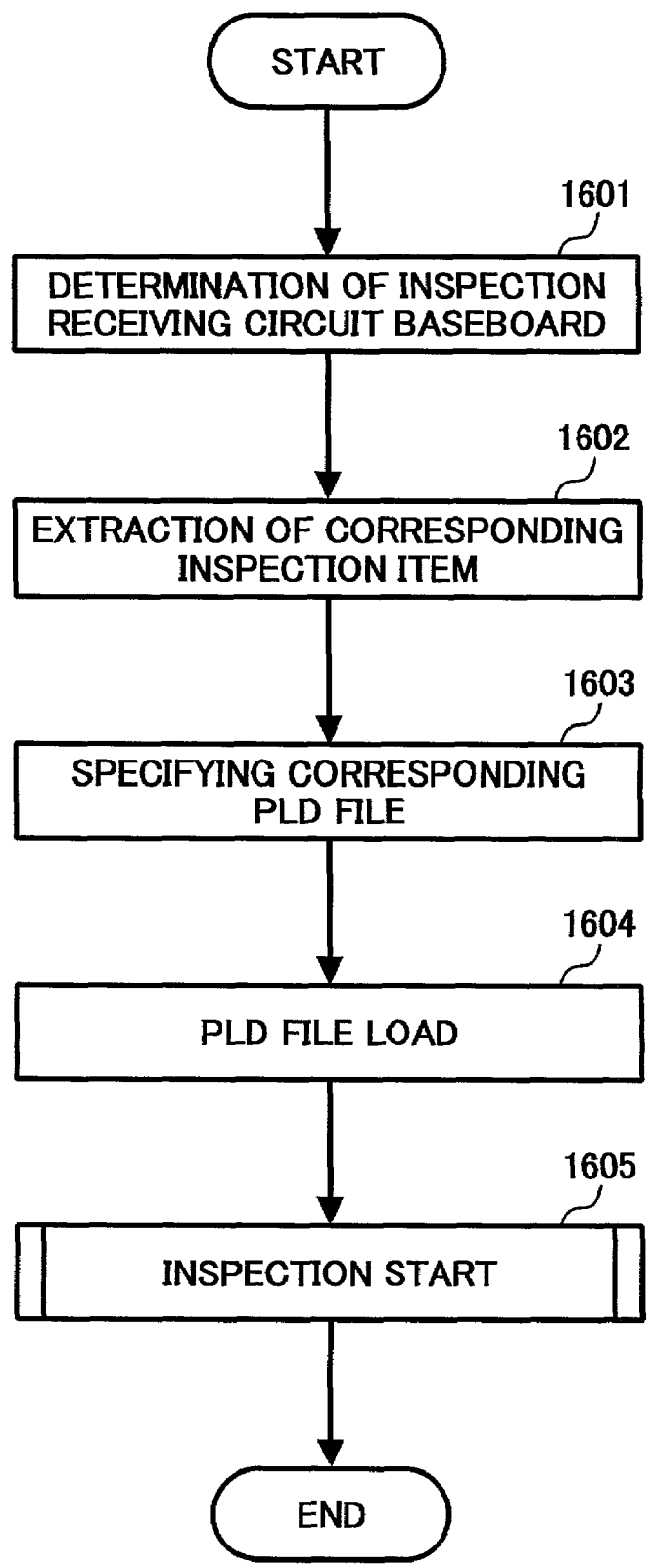
FIG. 27 is a flowchart illustrating exemplary processing and operation of the circuit baseboard inspection apparatus of FIG. 26.

Further, a more credible circuit baseboard inspection apparatus than that of the modification described with reference to FIGS. 23 to 25 is now described with reference to FIGS. 26 and 27. FIG. 26 is a block chart illustrating an exemplary configuration of the modified circuit baseboard inspection apparatus. FIG. 27 is a flowchart illustrating an exemplary processing operation of the circuit baseboard inspection apparatus of FIG. 26.

In order to remove load on a user caused when selecting and setting an inspection item and to avoid erroneous inspection operation caused by user error, the circuit baseboard inspection apparatus of FIG. 26 may employ an inspection item extraction section 31a in the control section 1d as an alternative to using the inspection item list display 31 of the circuit baseboard inspection apparatus of FIG. 23.

The inspection item extraction section 31a may extract only a requisite inspection item for an inspection receiving circuit baseboard 4f that is read by the identification information reading section 18. The PLD file specifying section 32 may then specify one or more PLD files in accordance with the inspection item extracted by the inspection item extraction section 31a.

Specifically, as noted from FIG. 27, the identification information reading section 18 of FIG. 26 may determine a type of an inspection receiving circuit baseboard connected to the fixture in step S1601. The inspection item extraction section 31a may then extract one or more inspection items required when the inspection receiving circuit baseboard is inspected in step S1602.

In accordance with the extracted inspection item, the PLD file specifying section 32 may specify one or more PLD files in step S1603. The PLD load section 15d may then read an applicable one ore PLD files from the PLD file band 12 and load applicable one or more PLDs therewith in step S1604. The inspection may then begin in step S1605.

In this way, the circuit baseboard inspection apparatus described with reference to FIGS. 26 and 27 may remove operational load on the user caused when an inspection item is selected. In addition, an erroneous selection operation of a user can substantially be avoided, thereby improving inspection quality.

Still another modified circuit baseboard inspection apparatus suitable for relieving load caused during inspection of a plurality of inspection receiving circuit baseboards is now described with reference to FIGS. 28 and 29.

Figure 28:
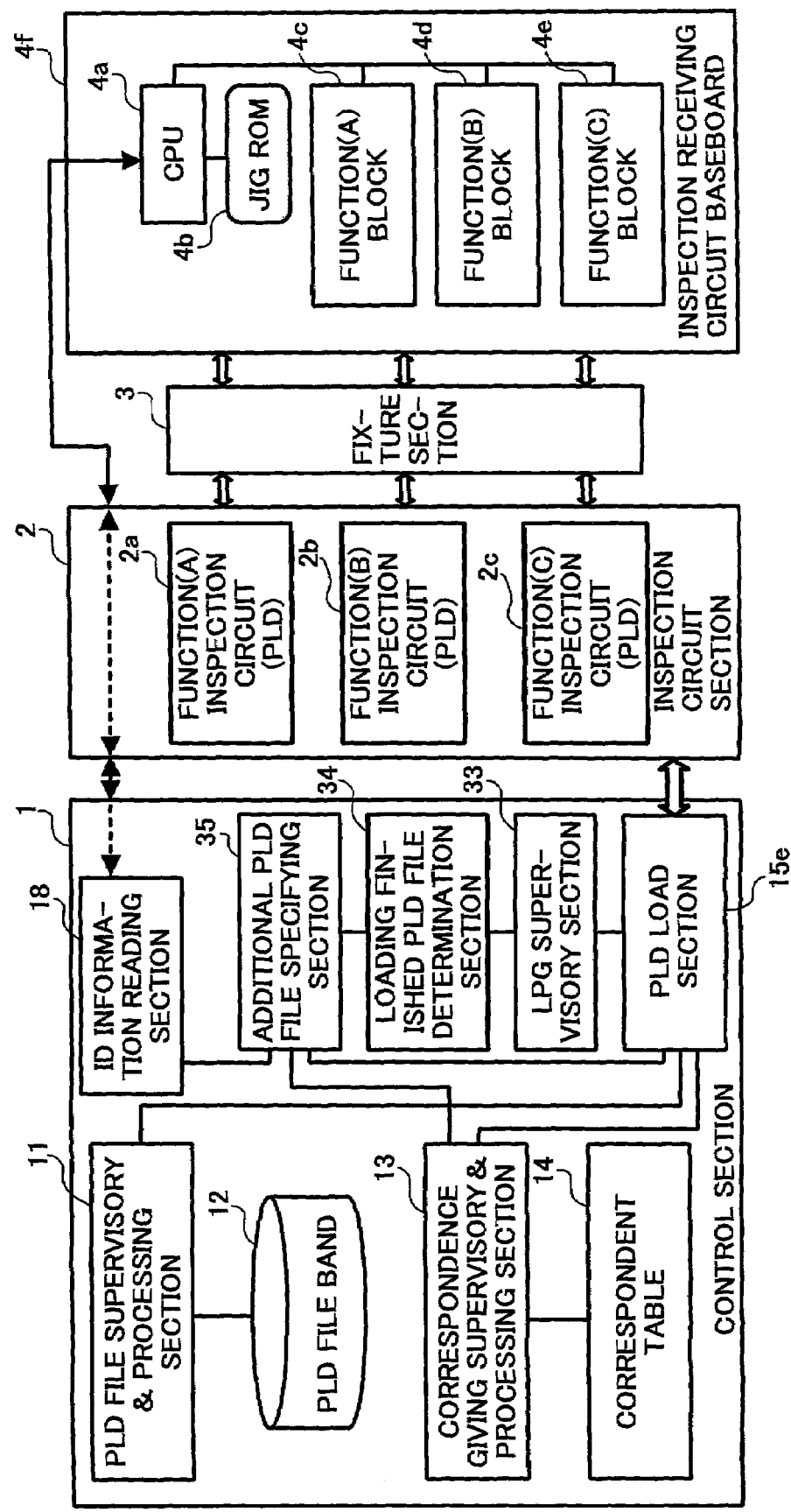
FIG. 28 is a block chart illustrating yet another modified configuration of the circuit baseboard inspection apparatus according to the present invention.

FIG. 28 is a block diagram illustrating an exemplary configuration of the modified circuit baseboard inspection apparatus. FIG. 29 is a flowchart illustrating exemplary processing and an operation performed by the modified circuit baseboard inspection apparatus of FIG. 28.

When inspecting a plurality of inspection receiving circuit baseboards, loading a PLD with a PLD file should be repeated in order to reconstruct inspection environment each time a different version appears. Accordingly, resetting load and time elapse occurs. Then the modified circuit baseboard inspection apparatus of FIG. 28 may be configured so as to employ a log supervisory section 33, a load completed PLD file determination section 34, and an additional file specifying section 35 in a control section 1e in addition to the circuit baseboard inspection apparatus of FIG. 18 in order to substantially omit such a load.

The log supervisory section 33 may correct log information when the PLD load section 15e load a PLD with a PLD file. The load completed PLD file determination section 34 may determine and specify one or more PLDs file having been loaded to applicable one or more PLDs of the function inspection circuit section 2 that is currently performing inspection based upon the log information.

The additional file specifying section 35 may specify one or more PLD files to be added when an inspection receiving circuit baseboard 4f currently connected to the fixture and whose ID is determined by the identification information reading section 18 based upon the result of the determination by the load completed PLD file determination section 34. The additional file specifying section 35 may then perform additional loading thereof.

Figure 29:
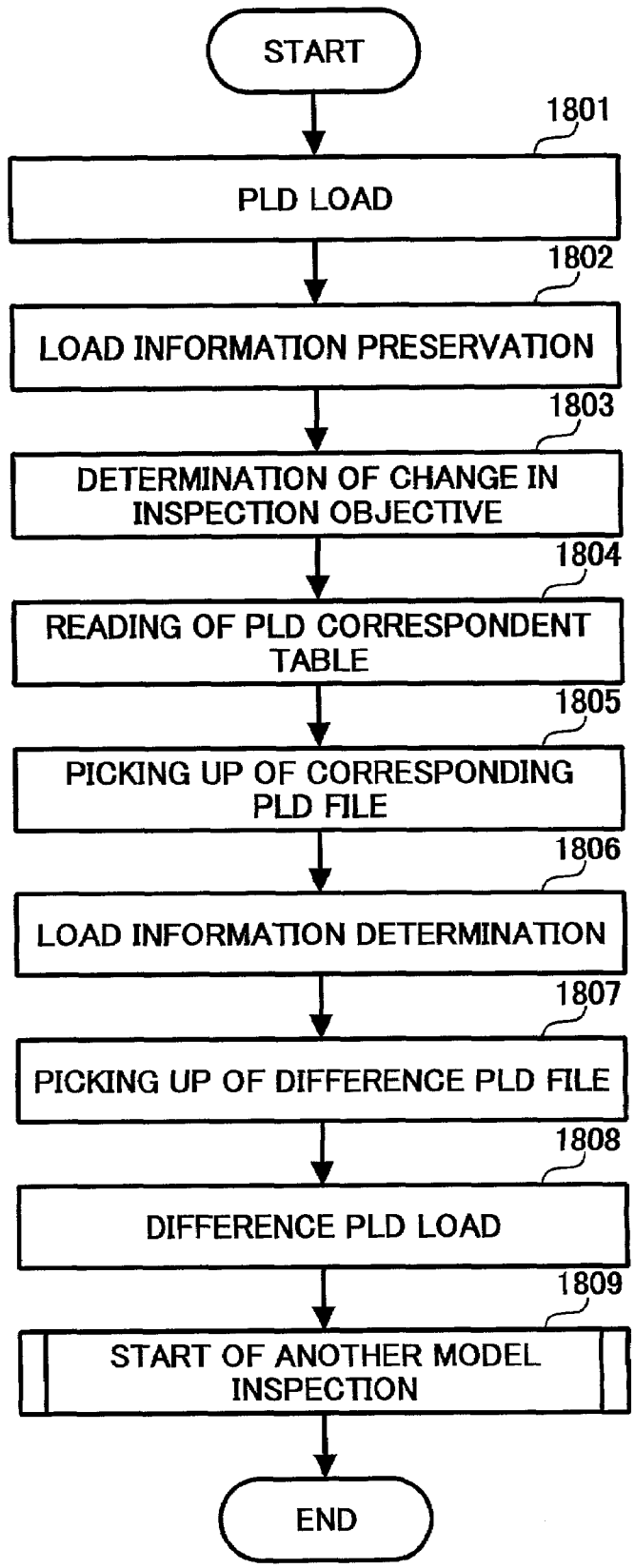
FIG. 29 is a flowchart illustrating exemplary processing and operation performed by the circuit baseboard inspection apparatus of FIG. 28.

As may be noted from FIG. 29, the modified circuit baseboard inspection apparatus with such a configuration may correct and preserve applicable log information using the log supervisory section 33 in step S1802, when a prescribed PLD load section 15e loads an applicable PLD with a PLD file (in step S1801).

Subsequently, when an inspection receiving circuit baseboard is changed, the identification information reading section 18 may determine a version of the changed inspection receiving circuit baseboard 4f in step S1803. In accordance with the determination, the additional file specifying section 35 may refer to the correspondent table 14 in step S1804, and may specify one or more PLD files to be used when the changed inspection receiving circuit baseboard 4f is inspected, as in step S1805.

Subsequently, the additional file specifying section 35 may be activated and may cause the loading of the completed PLD file determination section 34 to determine and specify a PLD file having been loaded in an applicable PLD of the function inspection circuit of the currently operating inspection circuit section 2 in step S1806. Based upon the determination result, newly addition required one or more PLD files (i.e., difference in a PLD file) may be specified and picked up in step S1807.

The PLD load section 15e may read only the difference of the PLD file specified by the additional file specifying section 35 from the PLD file band 12, and load applicable one or more PLDs therewith in step S1808. Then, inspection may be started in step S1809.

In this way, the exemplary modified circuit baseboard inspection apparatus described with reference to FIGS. 28 and 29 may not require reloading of one or more PLD files in the entire PLDs even when a plurality of inspection receiving circuit baseboard is inspected. As a result, inspection efficiency may be improved.

Similar to the modified circuit baseboard inspection apparatus described with reference to FIGS. 23 to 25, still another modified circuit baseboard inspection apparatus capable of performing efficient inspection is now described with reference to FIGS. 30 and 31.

Figure 30:
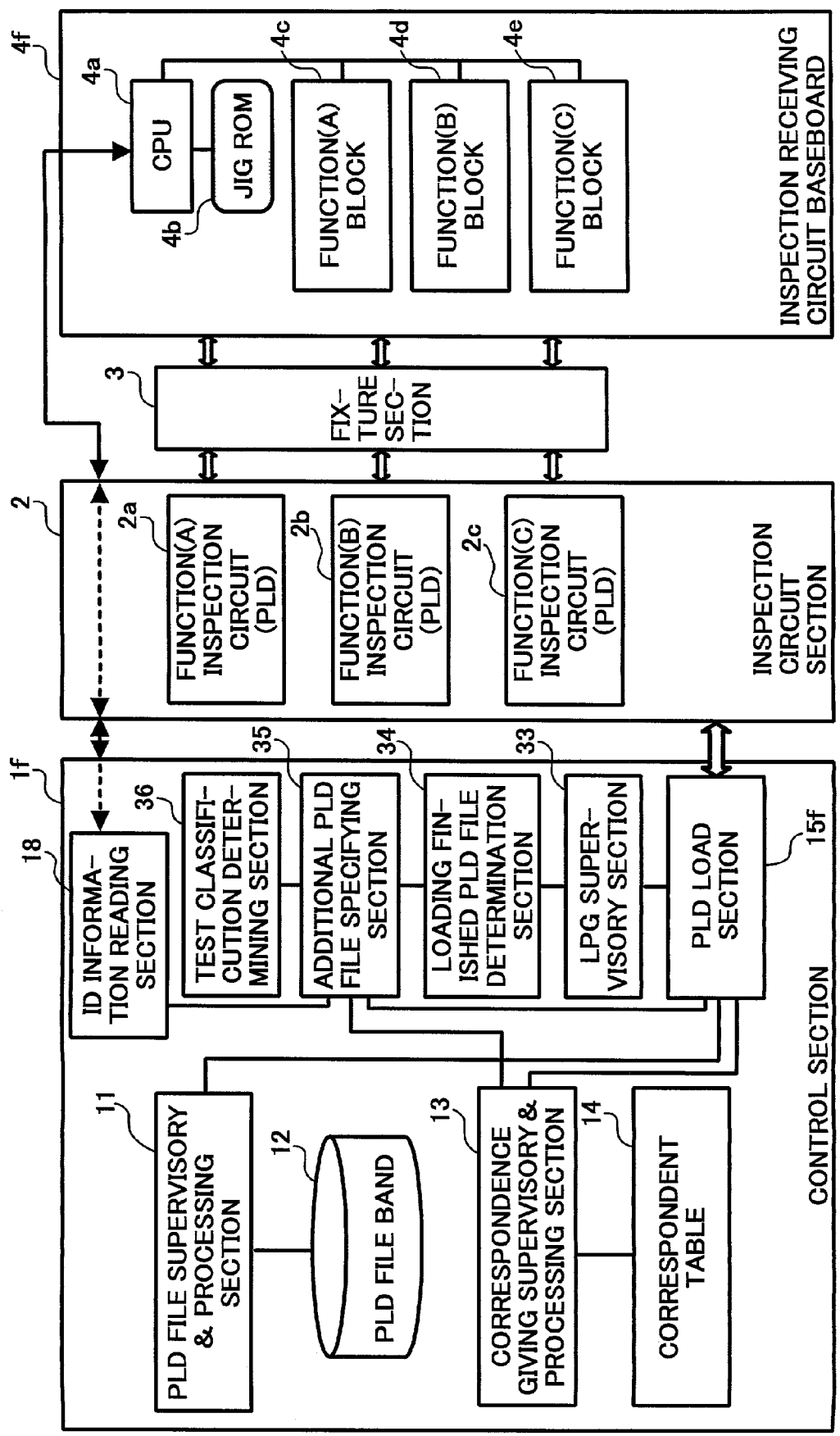
FIG. 30 is a block diagram illustrating yet another modified configuration of a circuit baseboard inspection apparatus according to the present invention.

FIG. 30 is a block chart for illustrating an exemplary configuration of the modified circuit baseboard inspection apparatus. FIG. 31 is a flowchart for illustrating an exemplary processing and operation of the modified circuit baseboard inspection apparatus of FIG. 30.

The circuit baseboard inspection apparatus of FIG. 30 may be configured to employ an inspection version determining section 36 in a control section 1f in addition to the circuit baseboard inspection apparatus of FIG. 28. The inspection version determining section 36 may determine details of a test subsequently performed during current inspection execution. The additional PLD file specifying section 35 may narrow PLD files down and may specify only one or more PLD files required for the test determined by the inspection version determining section 36.

Figure 31:
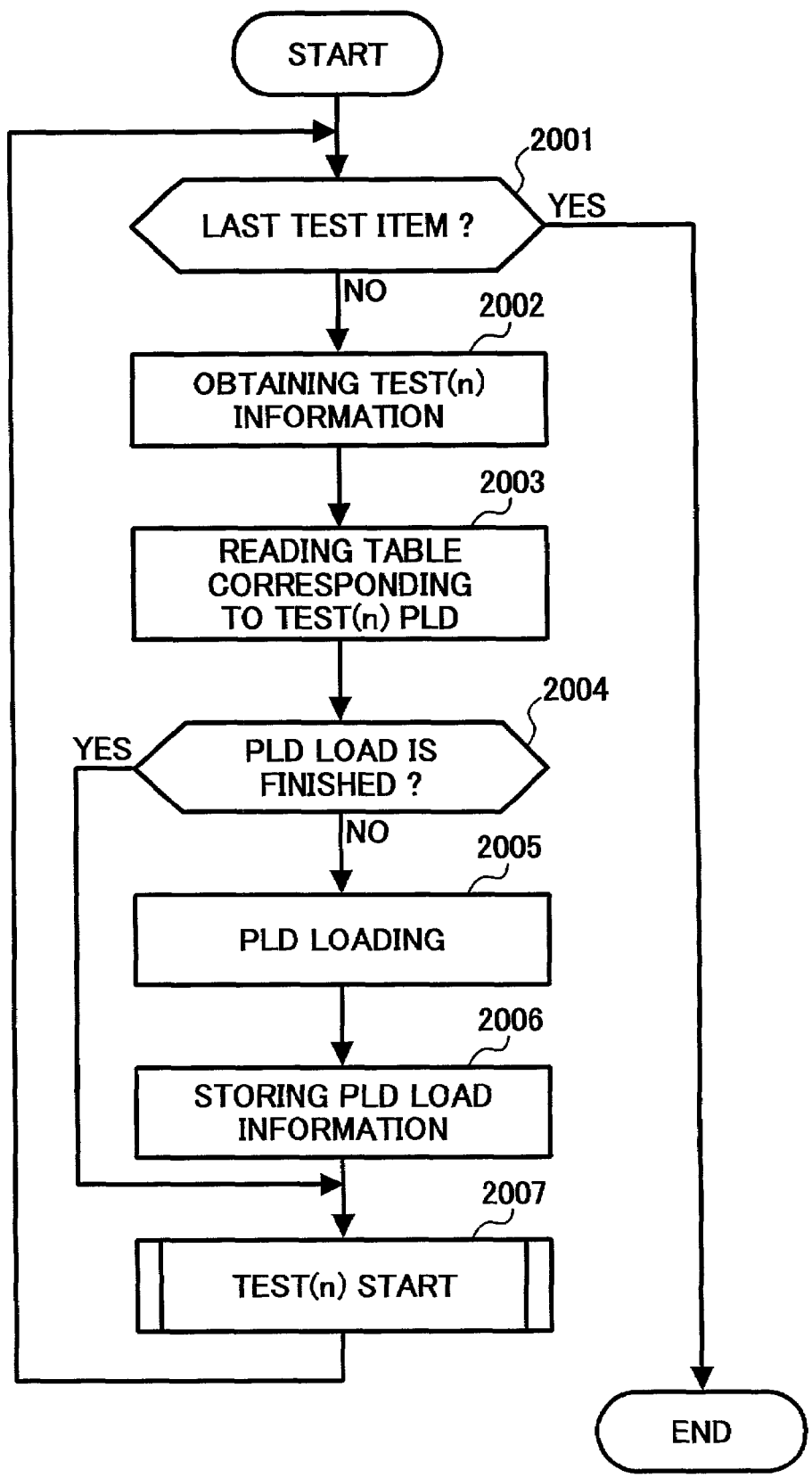
FIG. 31 is a flowchart illustrating an exemplary processing and operation of the circuit baseboard inspection apparatus of FIG. 30.

Specifically, as illustrated in FIG. 31, a PLD file required by a test item may sequentially be determined in steps S2001 to S2003. If this PLD file has already been loaded in an applicable PLD, inspection is started in step 2007. If this PLD file has not yet been loaded in the applicable PLD, the PLD load section 1f of FIG. 30 may read only the necessary one or more PLD files for the test receiving item from the PLD file band 12, and may additionally load the applicable PLD therewith in step S2005. Then applicable log may be stored in step 2006, and inspection may begin in step 2007.

In this way, since the modified circuit baseboard inspection apparatus described with reference to FIGS. 30 and 31 may pick up and load an applicable PLD with only a necessary PLD file, wasteful loading of an unused PLD may largely be avoided, depending on inspection details. Similarly to the circuit baseboard inspection apparatus described with reference to FIGS. 23 and 25, a set up time period needed before inspection may be efficiently minimized, and a constructional scale of the inspection circuit section itself may be reduced.

When plural versions of inspection receiving circuit baseboards are streamed along an inspection line, for example, an inspection system should be reactivated each time when the version varies in order to rebuild inspection environment. As a result, problems such as user error may arise during complicated resetting operations Moreover, this process is very time consuming.

Figure 32:
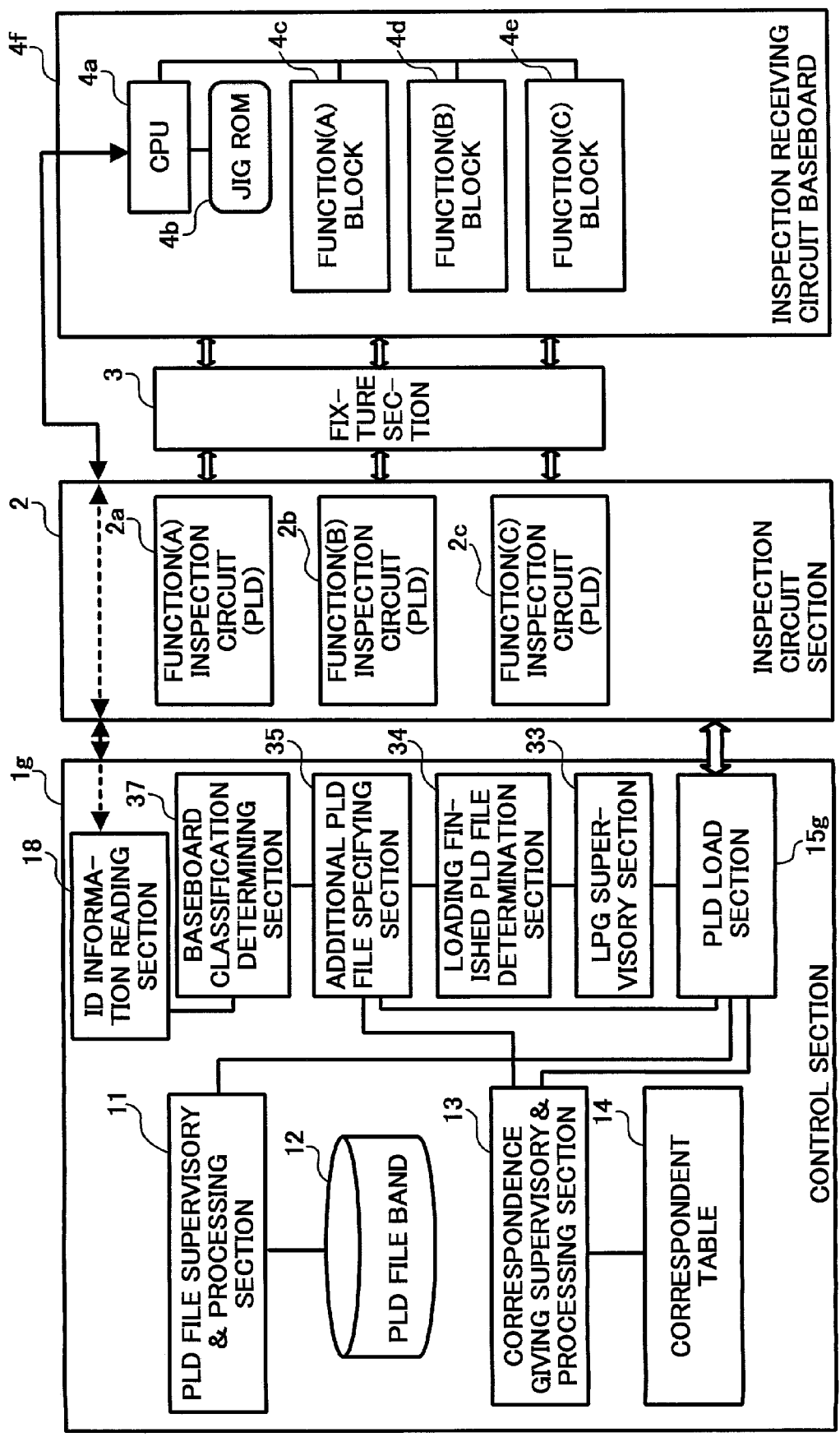
FIG. 32 is a block diagram illustrating yet another modified configuration of the circuit baseboard inspection apparatus.
Figure 33:
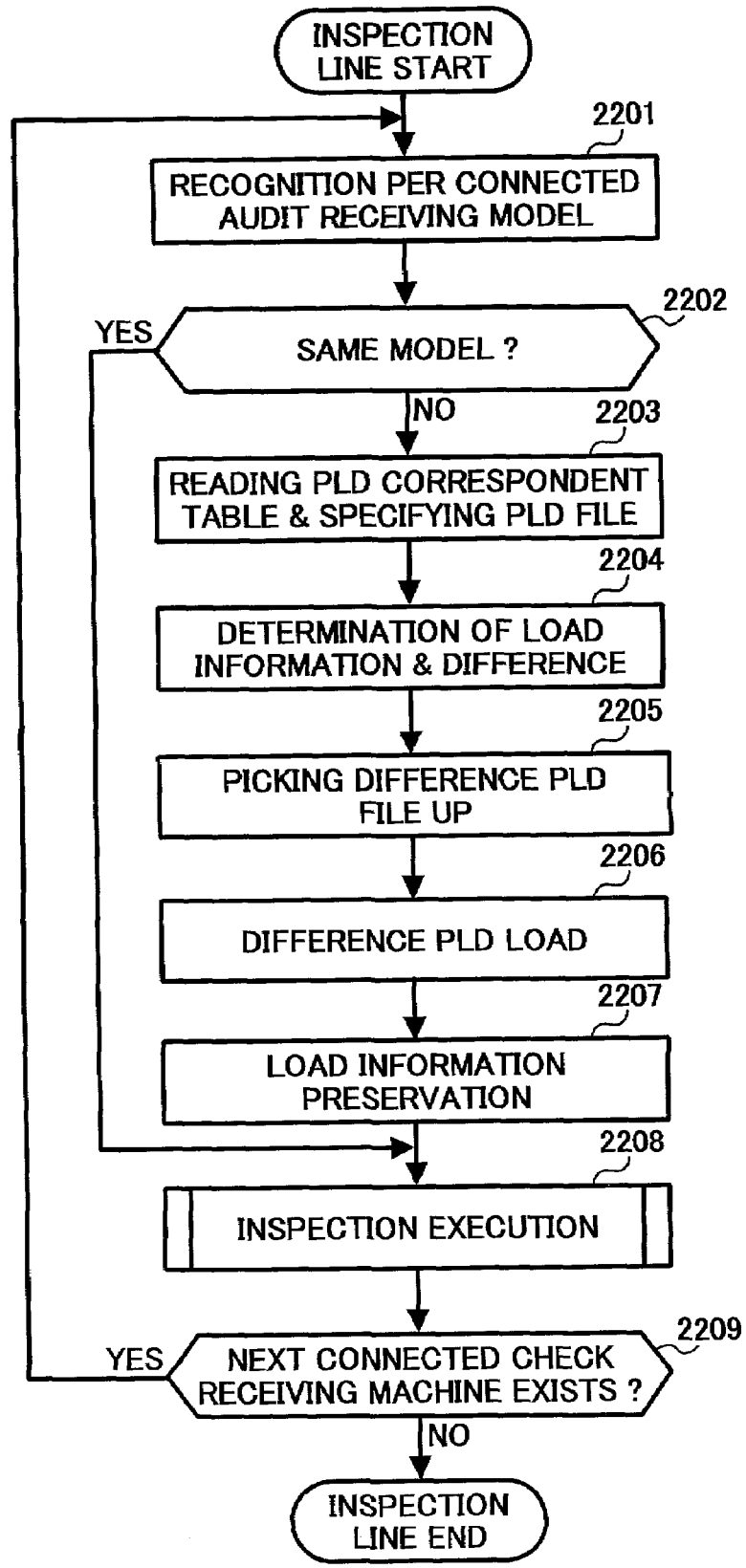
FIG. 33 is a flowchart illustrating exemplary processing and operation performed by the circuit baseboard inspection apparatus of FIG. 32.
Figure 34:
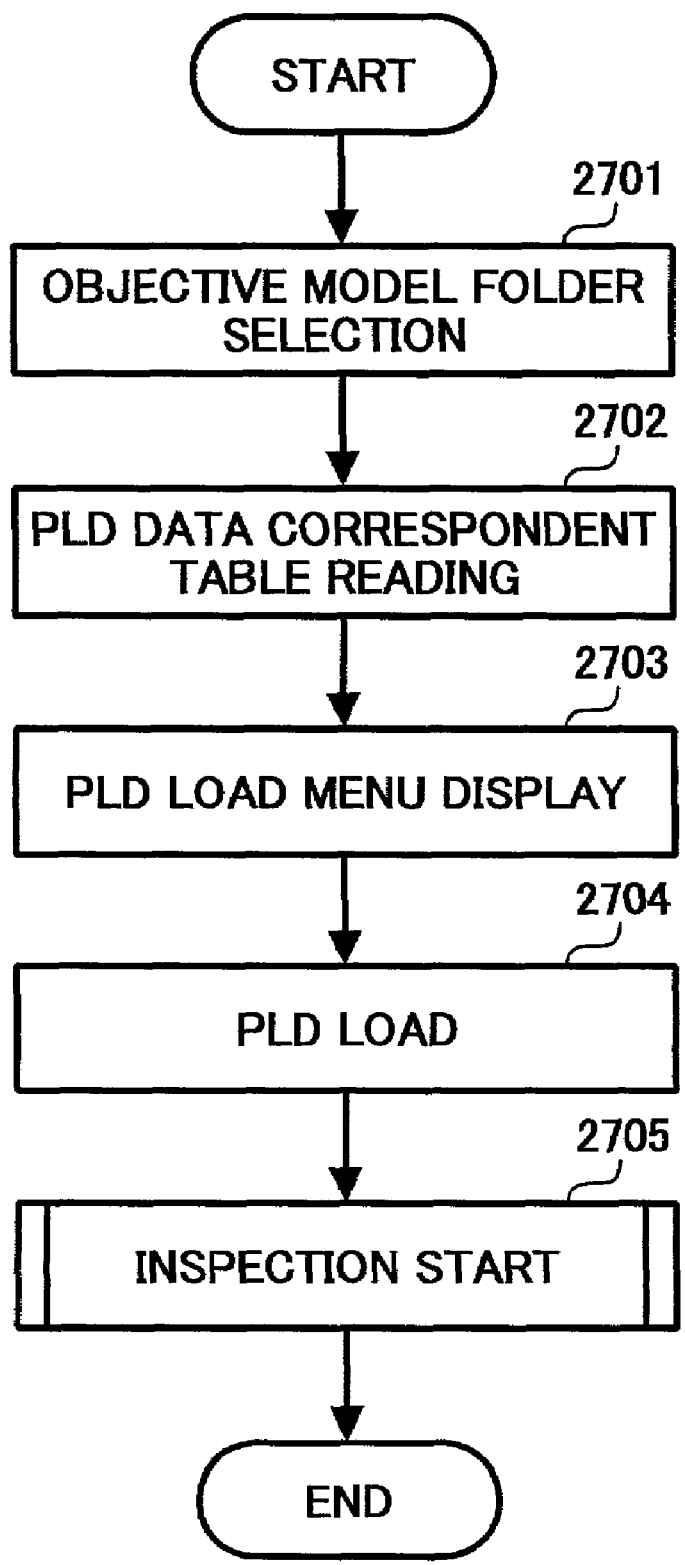
FIG. 34 is a flowchart illustrating exemplary processing and operation of the circuit baseboard inspection apparatus by the system of FIG. 30.

Thus, still another modified circuit baseboard inspection apparatus that deals with such problems has been developed and will be described with reference to FIGS. 32 and 33. FIG. 32 is a block diagram illustrating an exemplary configuration of the modified baseboard inspection apparatus. FIG. 33 is a flowchart illustrating an exemplary processing and operation of the modified circuit baseboard inspection apparatus.

The circuit baseboard inspection apparatus of FIG. 32 may be configured to employ a baseboard version determination section 37 as an alternative to the inspection version determining section 36 of the circuit baseboard inspection apparatus of FIG. 30 in a control section 1g. The baseboard version determination section 37 may determine a difference in a PLD file to be used both in the inspection just finished and the next inspection receiving circuit baseboards during inspection for plural versions of inspection receiving circuit baseboards. The additional PLD file specifying section 35 may further delimit PLD files and may specify only one or more PLD files determined by the baseboard version determination section 37 in order to be added to the inspection circuit section 2.

Specifically, as may be noted from FIG. 33, when the identification information reading section 18 of FIG. 32 determines a version of a prescribed inspection receiving circuit baseboard connected to the fixture as the next inspection objective in step S2201, the baseboard version determination section 37 may determine if the version is identical to that of the previously inspected inspection receiving circuit baseboard in step S2202.

If they are the same, the previously loading finished PLD file may perform inspection in step S2208, and wait connection of the next inspection objective in step S2209.

By contrast, if they are not identical, the additional PLD file specifying section 35 may refer to the correspondent table 14 and may specify a PLD file to be used in inspection for the new inspection receiving circuit baseboard in step S2203. The additional PLD file specifying section 35 may simultaneously compare the specified PLD file with result of the determination made by the loaded finished PLD file determination section 34 based upon the log information corrected by the log supervisory section 33, and may narrow down and specify a PLD file whose loading is newly required in step S2204.

The PLD load section 15g may then read only the newly required PLD files for inspection of an applicable inspection receiving circuit baseboard from the PLD file band 12 in step S2205, and may additionally load applicable one or more PLDs therewith in step S2206. The log may then be stored in step S2207, and inspection may begin in step S2208.

In this way, the modified circuit baseboard inspection apparatus described with reference to FIGS. 32 and 33 does not require reactivation of an inspection system itself, even when plural versions of inspection receiving circuit baseboards are streamed on an inspection line and these versions of inspection objectives vary one by one on the inspection line. Accordingly, inspection for the next inspection receiving circuit baseboard can be started, thereby the inspection line process can be automated and efficient.

The above-described several types of the circuit baseboard inspection apparati may be used in a computer system that inspects the performance of a circuit baseboard. Specifically, the computer system may include a circuit baseboard inspection apparatus, software, and a variety of files similar to those described with reference to FIGS. 1, 2, 3A, 3B, 3C, 4A, 4B, and 4C, respectively. Specifically, the computer system may perform inspection in a prescribed sequence as described in FIG. 34.

The third embodiment of the present invention will now be described with reference to FIGS. 35 to 42.

Figure 35:
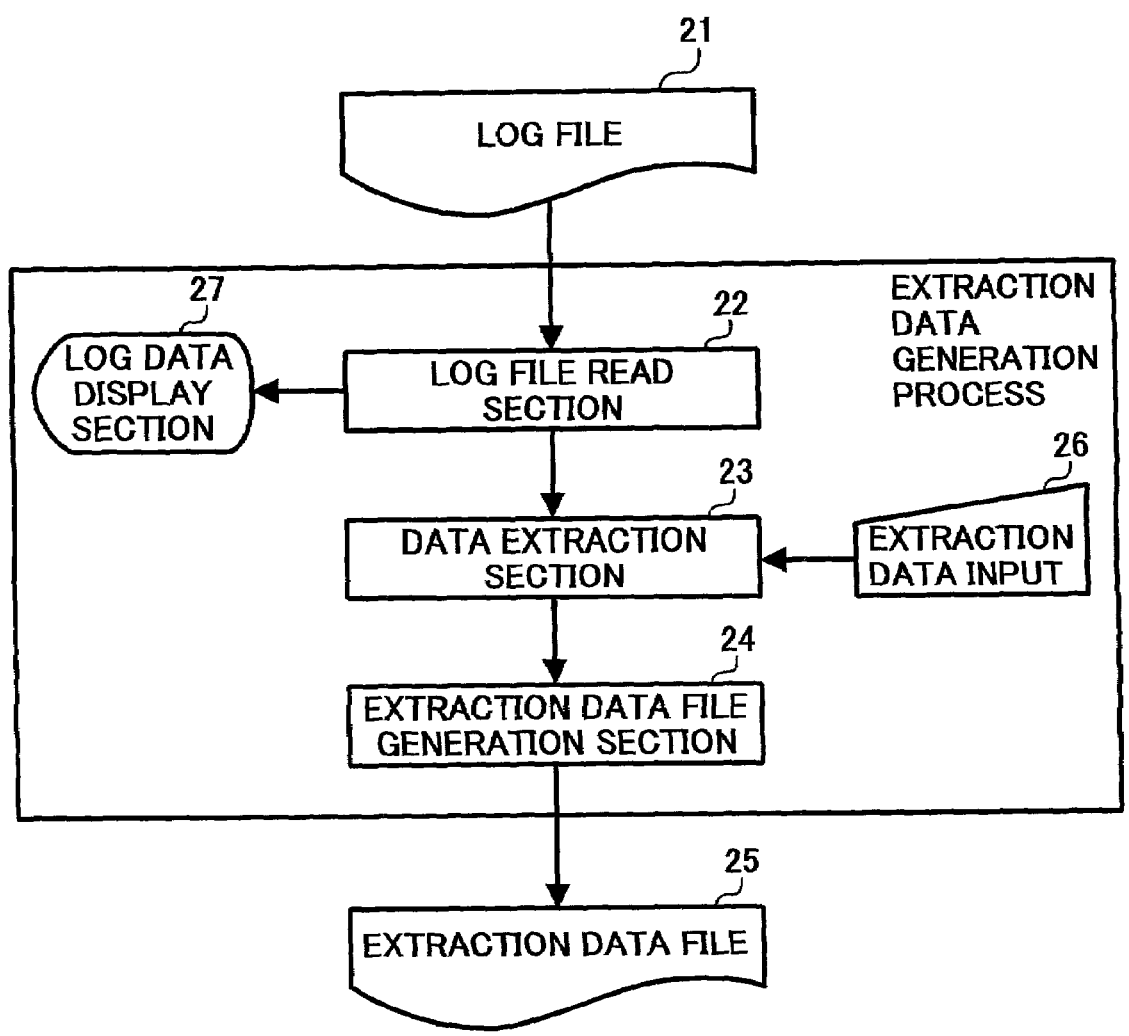
FIG. 35 is a diagram illustrating an internal organization of a sample data generation processing unit according to the third embodiment of the present invention.

In FIG. 35, there is shown an internal compositional diagram of a sample data generation process unit according to the third embodiment of the present invention. A general-purpose inspecting system having a log function is provided with a sample data generation process unit for sampling necessary information. This unit includes a log file reading section 22 for reading a log file 21, a log data display section 27 for displaying log data, a data sampling section 23 for sampling only required data from the read data, a sample data input section 26 for selecting required data by inputting selecting conditions, and a sample data file generating section 24 for filing the sampled data. Reference numeral 25 designates the sample data file that has been sampled out.

Figure 39:
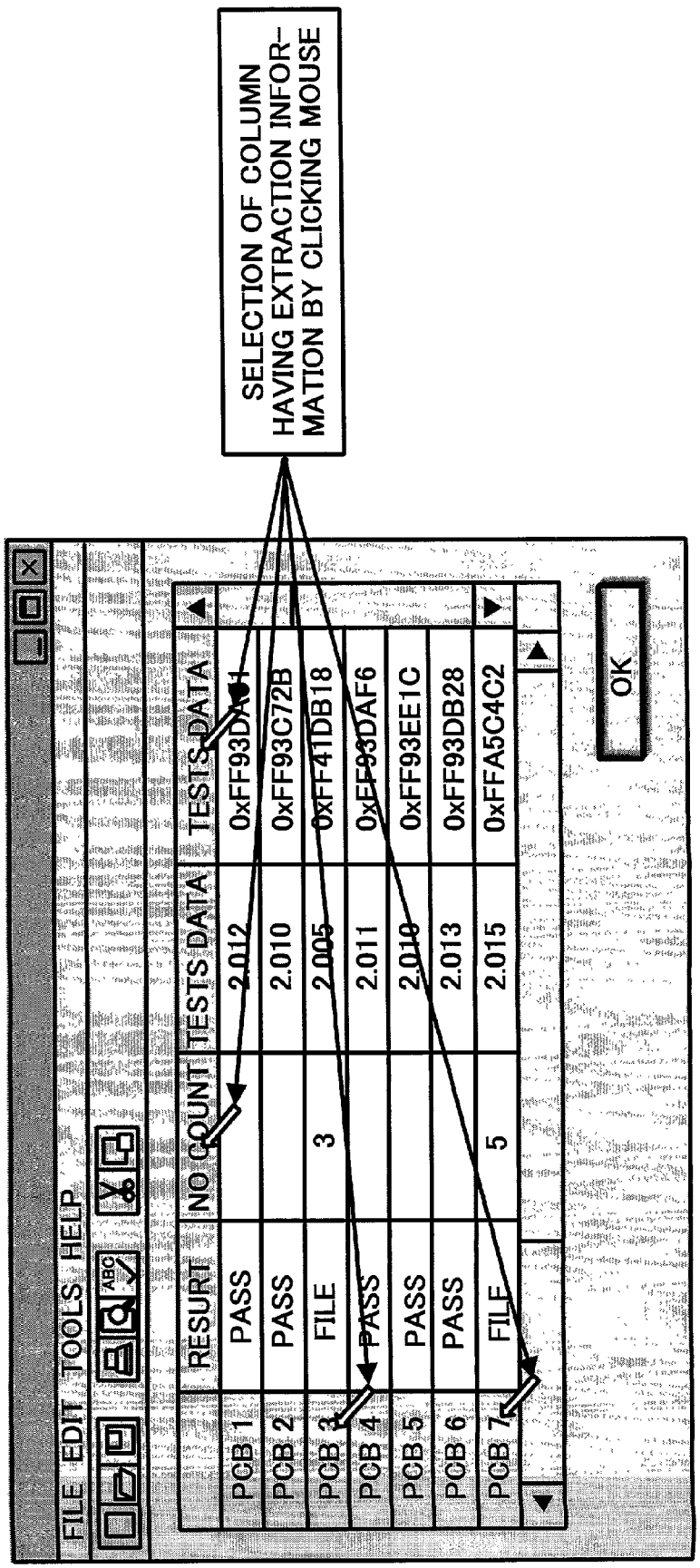
FIG. 39 is a chart illustrating exemplary inputs to the sample data input section in FIG. 37.

In FIG. 38, there is shown a diagram of a display illustration of a log data display section in FIG. 35. In this diagram, there are shown a result of PASS or FAIL, the number of count failures, and test A data and test B data, for example, regarding as chemical synthetics PCBs 1 to 7 on a display screen. Referring to FIG. 39, there are shown exemplary inputs to the sample data input section in FIG. 35. In this diagram, the same screen may be displayed in the sample data input section as for the screen of the log data display section. Therefore, it is possible to sample out only selected information when a prescribed column having sample information is selected with mouse clicking of portions as indicated by arrows.

Figure 36:
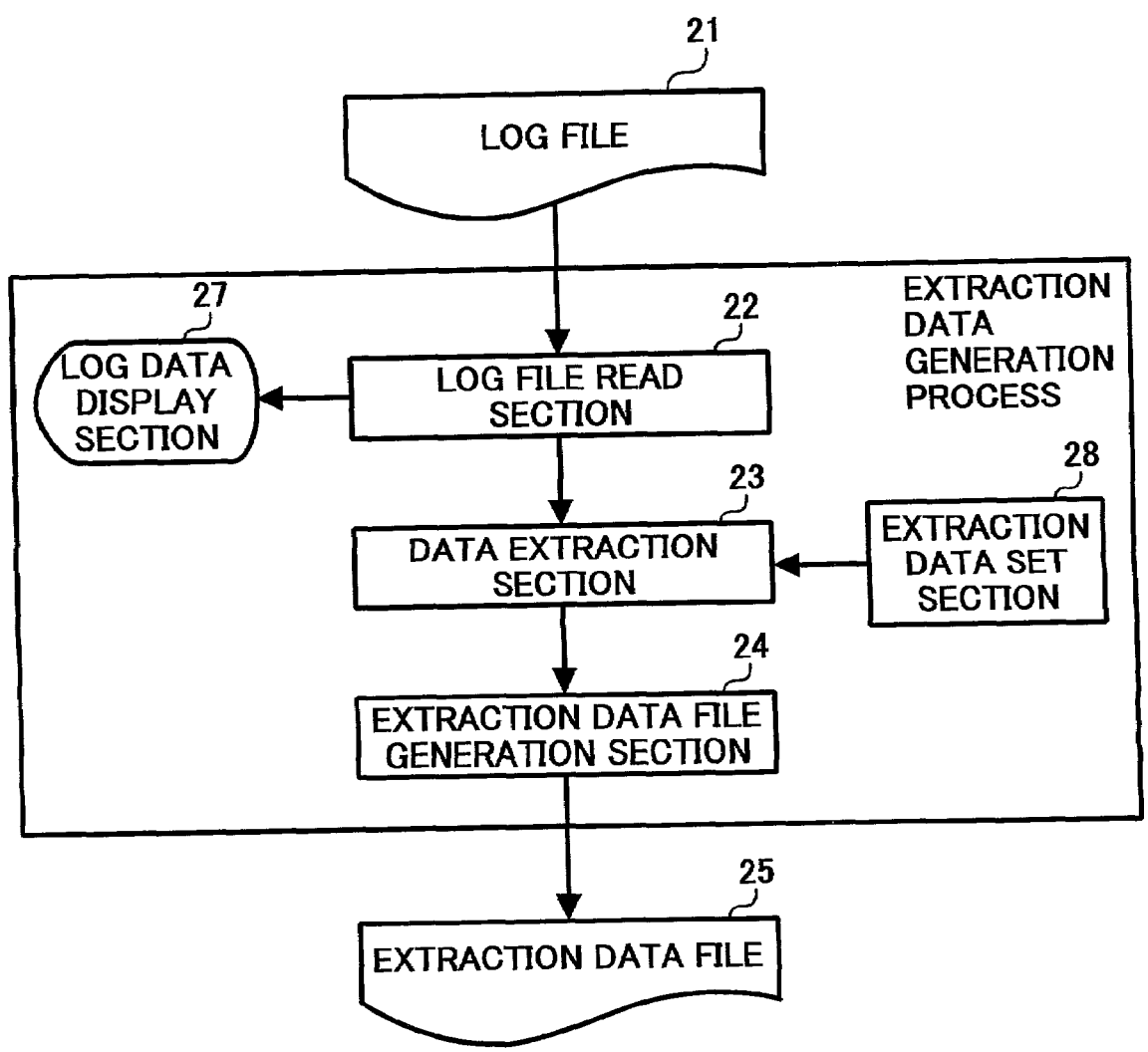
FIG. 36 is a diagram illustrating an internal organization of a sample data generation processing unit.

In FIG. 36, there is shown an internal composition diagram of a sample data generation process unit. Specifically, the process unit may again include the log file reading section 22 for reading a log file, the log data display section 27 for displaying log data, the data sampling section 23 for sampling required data, a newly employed sample data setting section 28 for setting required data, and the sample data file generation section 24 for filing sampled data. As apparent therefrom, it may differ from the above-described constitution in that the sample data setting section 28 is arranged for the sample data input section 26. The sample data setting section 28 may set predetermined data stored in a ROM or a RAM using a prescribed program. A display screen of the log data display section 27 is shown in FIG. 38.

In FIG. 37, there is shown an internal constitutional diagram of a general-purpose inspecting system having a log function. As may be noted therefrom, the contents of a file may be transmitted and displayed on the screen of the display section 2 from the sample data file generation section 24 and the log file generation section 29 through a display path. In addition, this system may be connected to a personal computer 11 for controlling a database 10 via a network (LAN). Additional workstations may also be connected to the network, too. The general-purpose inspecting system may include a function of filing information sampled out as necessary information separately based on preset information after inspection result of inspection receiving circuit baseboard, for example, is filed as a log by using the log file generation section 29 and the sample data file generation section 24 viewing the contents of a sampled and processed file.

In addition, the computer system of FIG. 37 may include similar devices to those described with reference to FIG. 1.

Specifically, when the log file generation section 29 files the inspecting result as a log and outputs the log file 21, it is possible to sample only the necessary information on the basis of preset information. The sample data file generation section 24 may then output the sample data file 25. When the sample data file generation section 24 generates a file so as to view a content of the sample data file 25, the file may be transferred to the display section 2 via the pass and displayed on the screen thereof.

Figure 40:
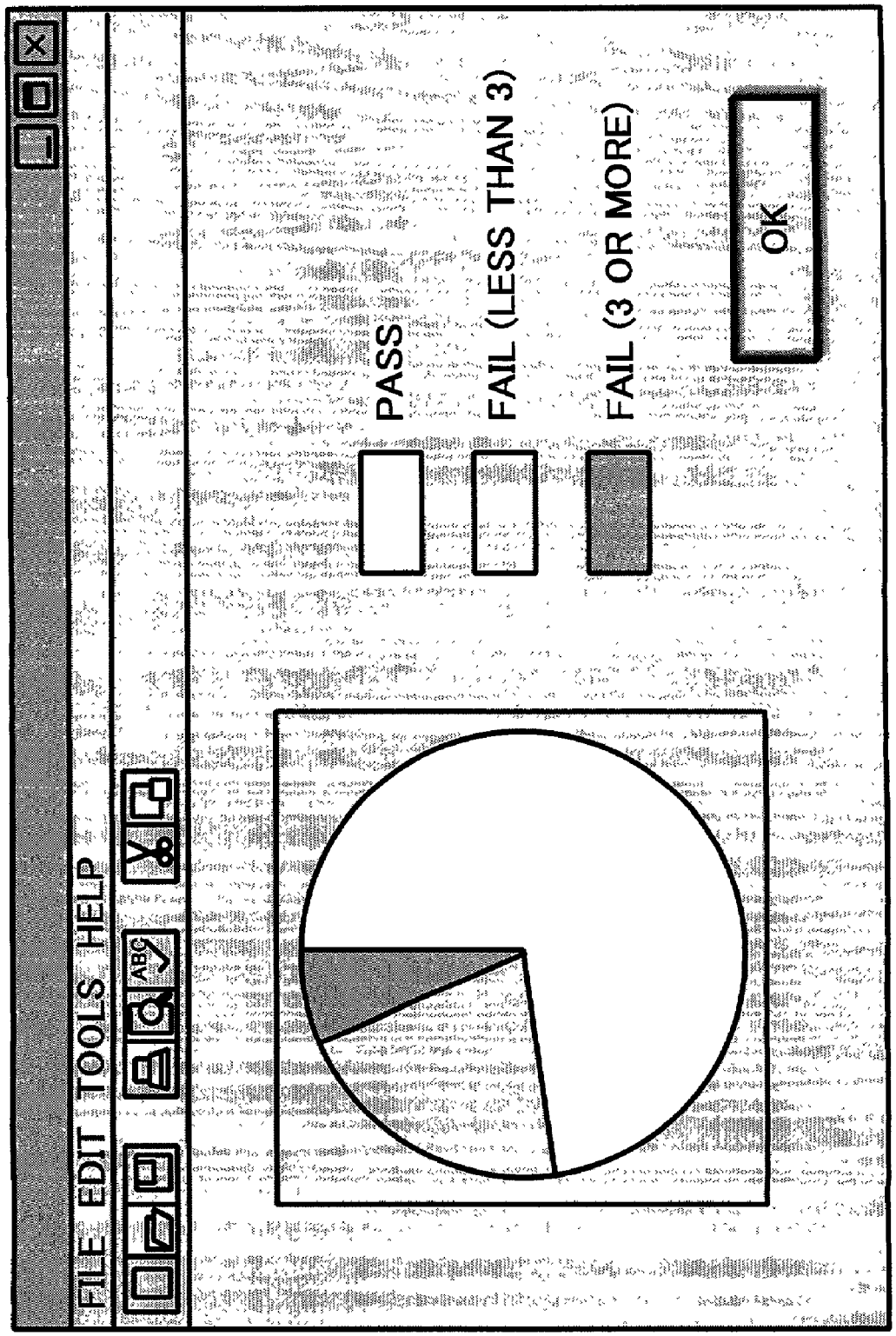
FIG. 40 is a chart illustrating arbitrary data on the table of FIG. 38.
Figure 41:
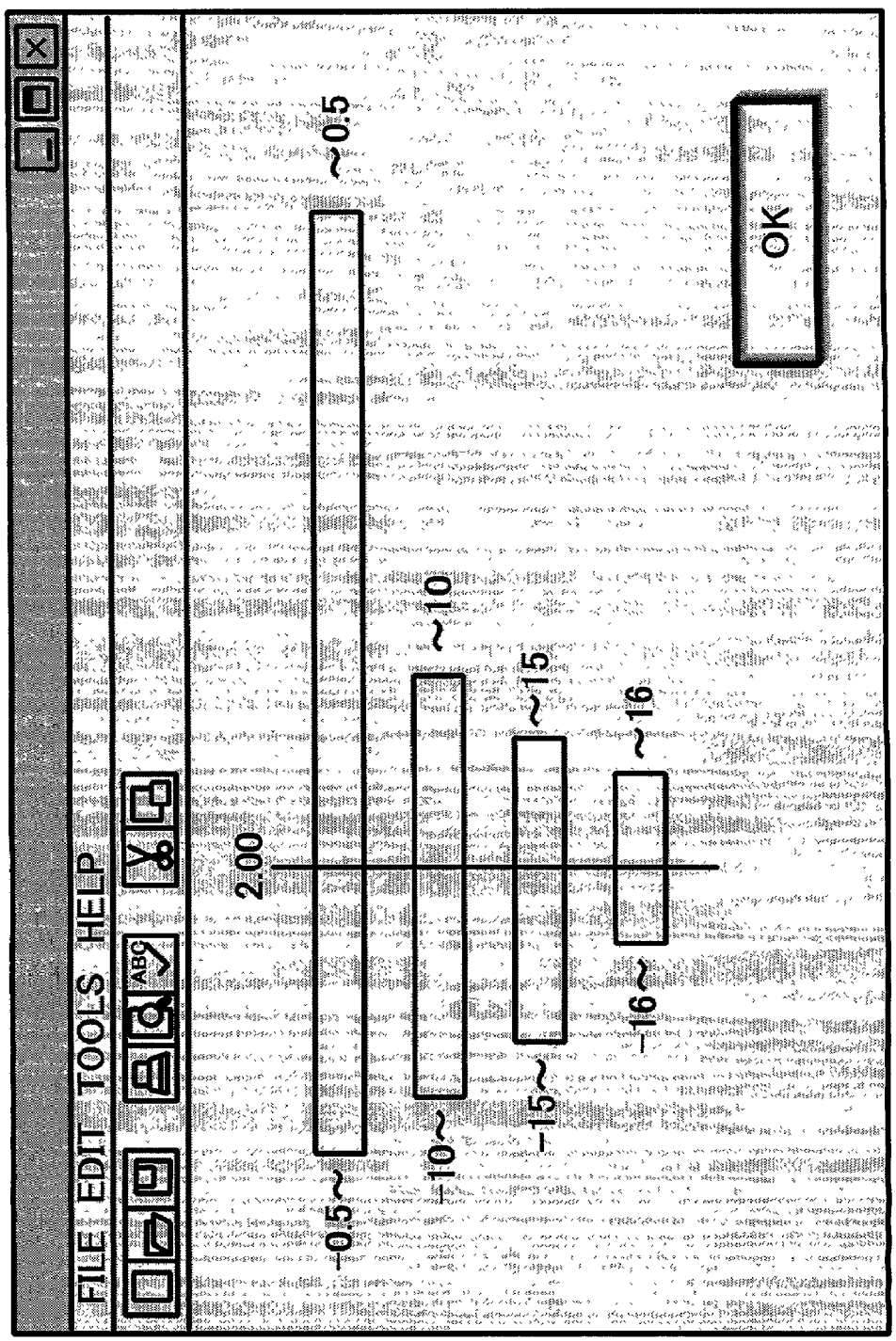
FIG. 41 is a graph illustrating variations of arbitrary data about a setting of 2.00.
Figure 42:
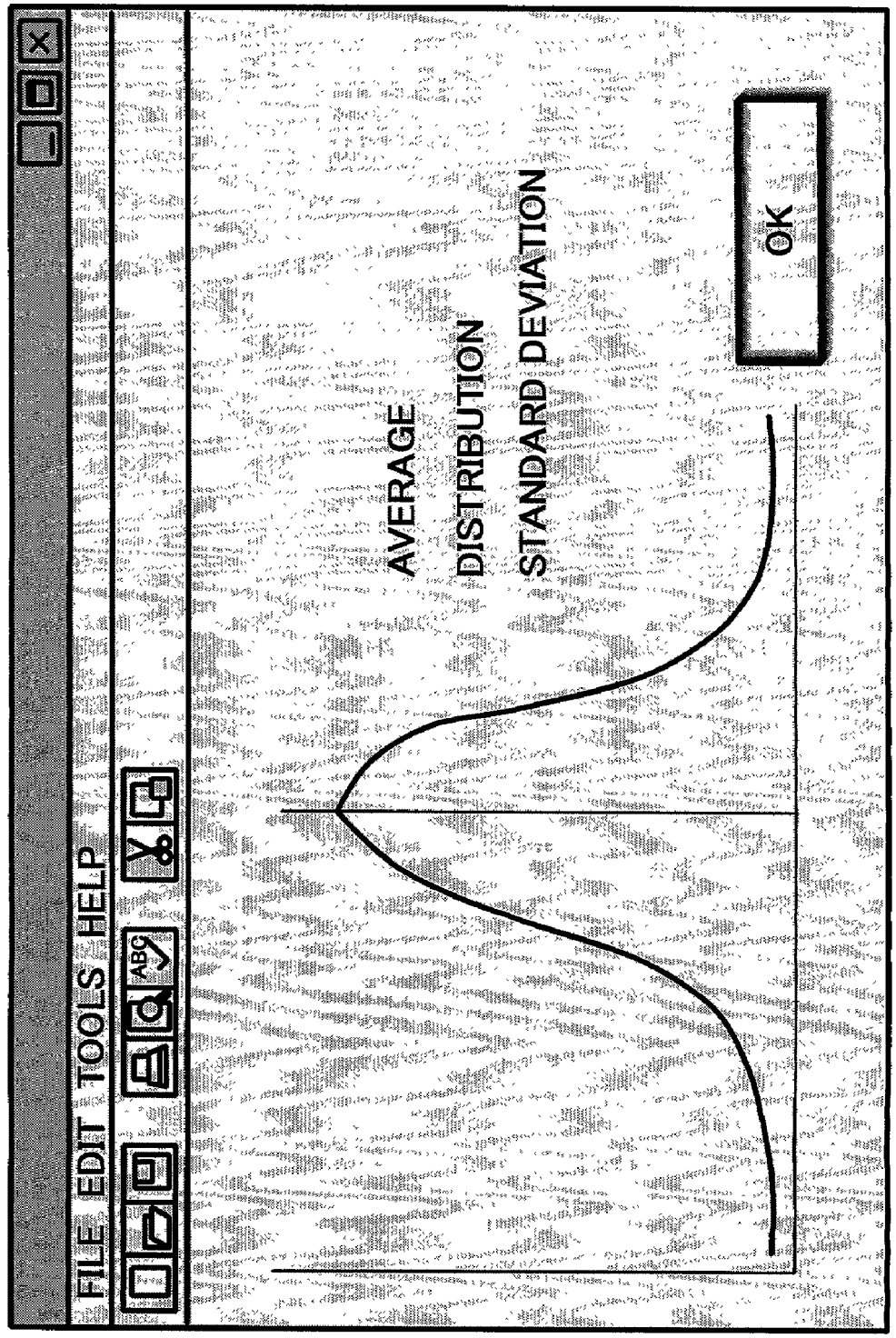
FIG. 42 is a graph illustrating a normal distribution of arbitrary data.

In FIGS. 40, 41 and 42, there are shown a various display screens. The content of the file can be viewed with a selection in a various display methods. Desired statistical data can be generated from a plurality of generated files. A prescribed display mode may be selected from a menu shown in FIG. 38 and then display contents may be selected. Specifically, in FIG. 40, there is shown a pie chart of arbitrary data on the table of FIG. 38. The form of the display may be a graph. Result (i.e., result) and NG Count (i.e., counting failure) in FIG. 38 may be selected as display contents. In the pie chart, PASS is approx. 73%, FAIL (below 3) is approx. 19%, and FAIL (e.g. 3 or more) is approx. 8%.

In FIG. 41, there is shown a graph of variations of arbitrary data about a setting of 2.00. The first one may have a variation in which the range within +0.05 is much higher than that within −0.05. The second one may have a variation in which a range within −0.10 is much higher than that within +0.10. The third one may have a variation in which a range within −0.15 is much higher than that within +0.15. In addition, the fourth one may have a variation of +0.16 or greater slightly higher than −0.16 or greater. In FIG. 8, there is shown a graph of a normal distribution of arbitrary data, with values of an average, a variance, and a standard deviation displayed in the upper right portion.

The fourth embodiment of the present invention will now be described in detail with reference to FIGS. 43 to 53.

Figure 43:
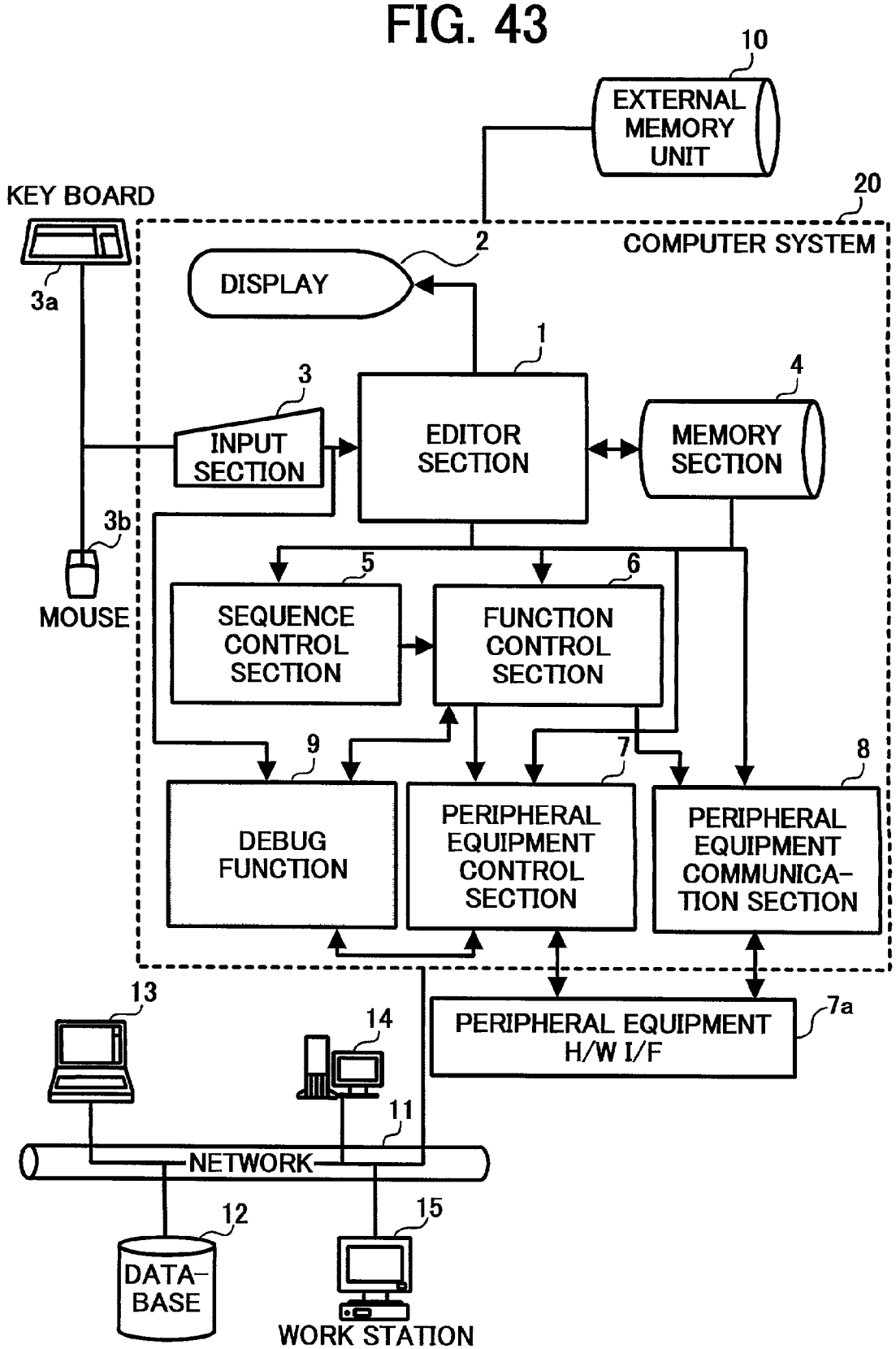
FIG. 43 is a block diagram illustrating the organization of a general-purpose inspecting system according to the fourth embodiment of the present invention.
Figure 44:
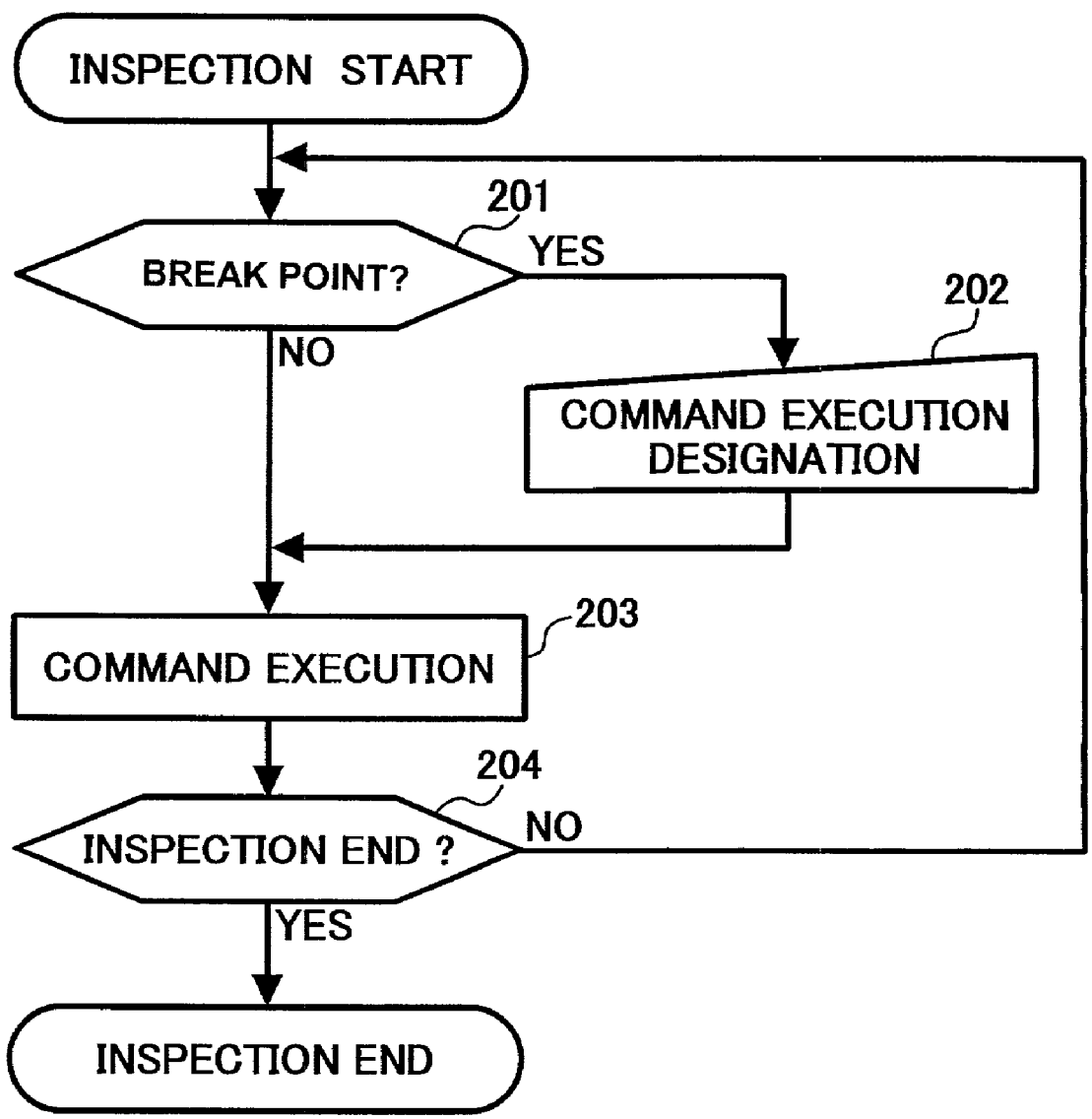
FIG. 44 is a flowchart illustrating a first operation performed based on processing of a debugging function section of the general-purpose inspecting system in FIG. 43.
Figure 45:
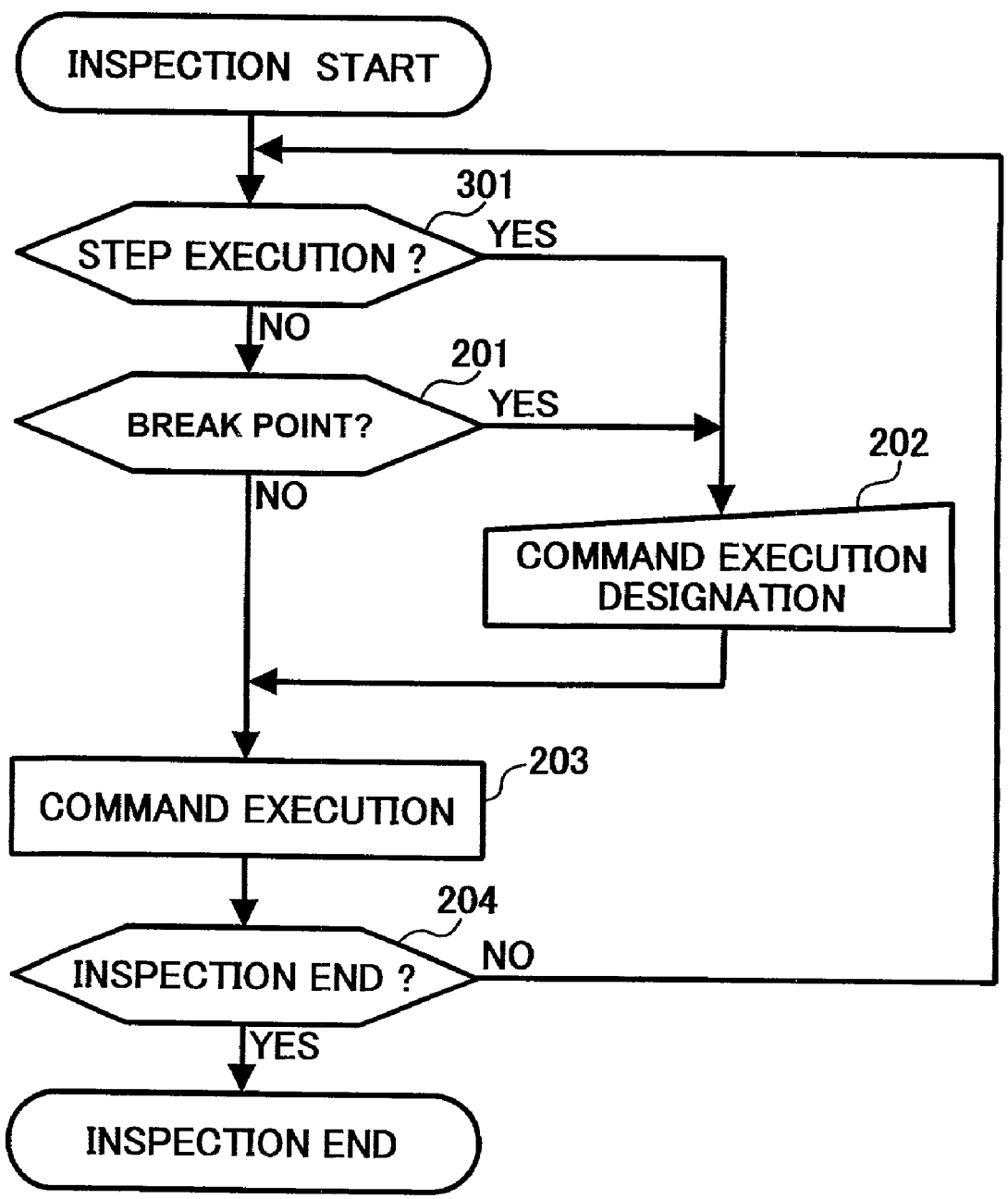
FIG. 45 is a flowchart illustrating a second operation performed based on processing of the debugging function section of the general-purpose inspecting system in FIG. 43.
Figure 46:
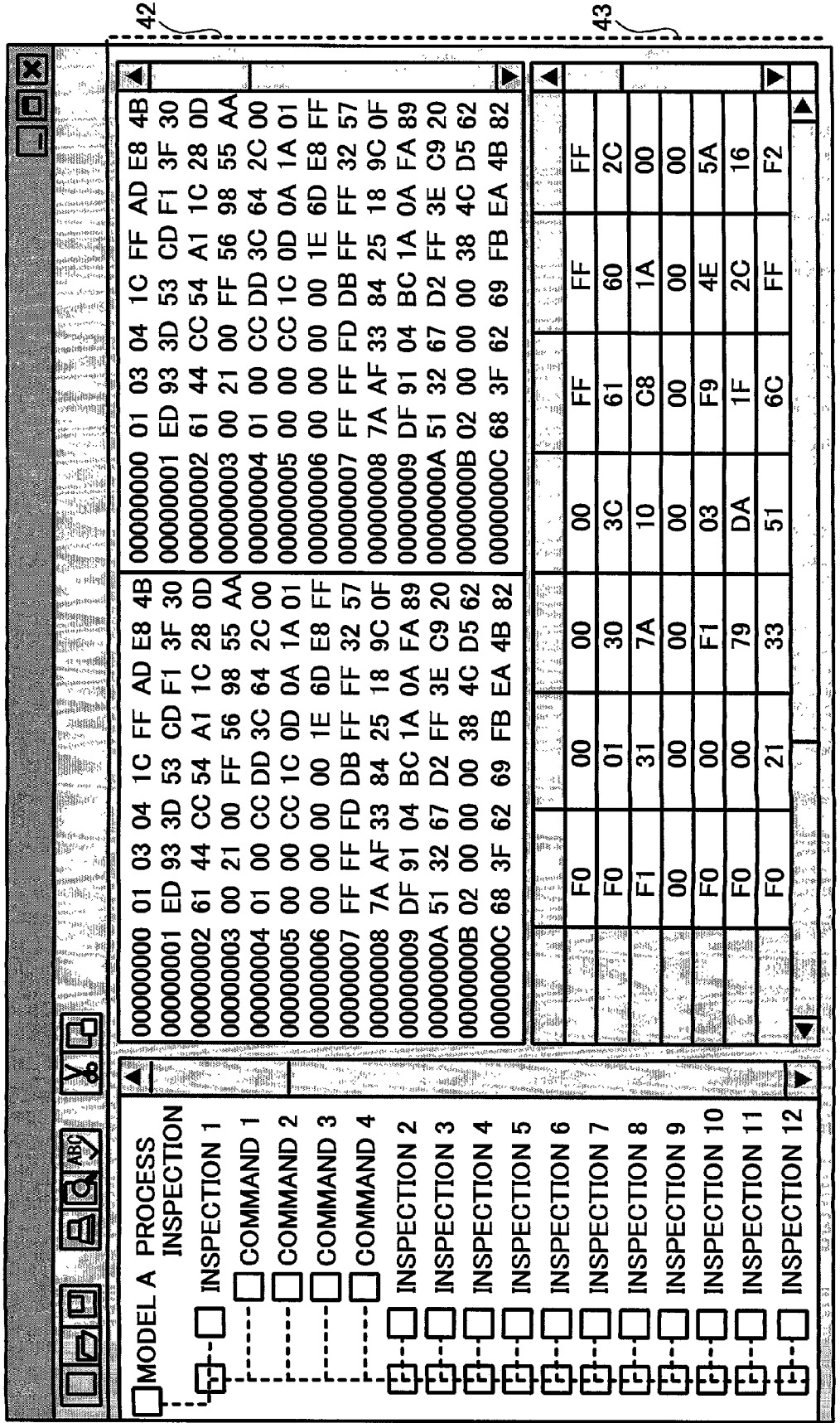
FIG. 46 is an explanatory diagram illustrating a screen displayed on the basis of processing of the debugging function section of the general-purpose inspecting system in FIG. 43.

In FIG. 43, there is shown a block diagram of a composition of a general-purpose inspecting system of the fourth embodiment according to the present invention. In FIGS. 44 to 46, there are shown flowcharts of first and second operations performed based on processing of a debugging function section of the general-purpose inspecting system in FIG. 43, and an explanatory diagram of a screen displayed on the basis of processing of the debugging function section. The hardware configuration of the general-purpose inspecting system may be the same as that described with reference to FIG. 13.

The general-purpose inspecting system shown in FIG. 43 may include the debugging function section 9 in addition to the conventional general-purpose inspecting system described in FIG. 1.

The computer system 20 having this composition is applied to the inspecting system shown in FIG. 2 for inspecting a PCB.

Thus, the general-purpose inspecting system according to this embodiment may provide detailed inspecting conditions when inspecting a peripheral unit such as a PC board (PCB) by using the new debugging function section 9.

Specifically, various identification information of test names, inspection item names, and command names may be displayed as a result of inspecting the peripheral unit performed by the control sections. Simultaneously, data values may be written into a register as command execution result and displayed on a screen of the display section 2. In addition, an execution result of a command arbitrarily specified by a user may also be displayed on the screen by using the debugging function section 9.

An exemplary operation of the debugging function section 9 may be described in more detail with reference to FIG. 44.

The debugging function section 9 may include a function to read inspection operation in order to confirm information such as contents of registers and memories of the inspecting circuit, parameter values in the command, signal information of a connection I/F or the like during inspection of a peripheral unit. Also included may be a screen display function on a screen displaying reading result on the display section 2. For example, as shown in the screen of the screen area 41, the debugging function section 9 may display respective inspection items such as "Process inspection" and "Inspections 1 to 12" for the peripheral unit (e.g. Model A) on the screen in an order of execution. The screen may thus enable a user to preset a breakpoint for halting the execution of the inspection items in units of a command.

As noted from FIG. 46, a checkbox for "Command 3" of "Check 1" is marked, and thus a breakpoint may be so preset. This checkbox may be an object button for starting the debugging function section 9. Thus, the started debugging function section 9 may halt the execution of the command of the inspection item at this breakpoint and display an execution result on the screen. In addition, various values of the registers may be displayed per an address as a result of executing the "Command 3" in a screen area 42.

Furthermore, after the execution is halted at this breakpoint afterward, the debugging function section 9 may execute debugging step by step in a unit of a single command, for example, and displays execution result on the screen. An instruction of this step execution may be inputted through a predetermined key operation on the keyboard 3a by a user.

This processing operation using a breakpoint may be described below in more detail with reference to FIGS. 44 and 45. First, as shown in FIG. 44, after receiving an instruction of starting the inspection operation, commands may be arranged on the memory in accordance with the procedure definition and the item definition. It may then be determined whether the command is for a breakpoint before executing the command in order (step 201).

If the command is for the breakpoint, an external execution instruction (i.e., user input) may be awaited (step S202). Alternatively, the command may be directly executed (step 203). After executing the command, it is determined whether all of the commands on the memory are completed (step 204). The control may then progress to the next command execution unless the inspection is terminated. As an alternative, the processing may be terminated.

Alternatively, as shown in FIG. 45, after receiving an instruction to begin the inspection operation, the commands may be arranged on the memory in accordance with the procedure definition and the item definition. Then, it may be determined whether it is for a step by step execution before executing the commands in order (step 301). If it is for the step execution, an external execution instruction is awaited (step 201), and hereinafter the same processing as for the steps 201 to 204 is performed as described in FIG. 2.

The debugging function section 9 may be described in more detail with reference to FIGS. 47 to 53. In FIGS. 47 to 53, there are shown a block diagram of a first exemplary composition of the debugging function section of the general-purpose inspecting system of FIG. 43, a flowchart of a processing operation of the debugging function section of FIG. 47, and a block diagram of a second exemplary constitution of the debugging function section. Also shown may be a flowchart of a processing operation of the debugging function section of FIG. 49, a block diagram of a third detailed constitution of the debugging function section, a flowchart of a first processing operation of the debugging function section of FIG. 51, and a flowchart of a second processing operation of the debugging function section of FIG. 9, respectively.

Figure 47:
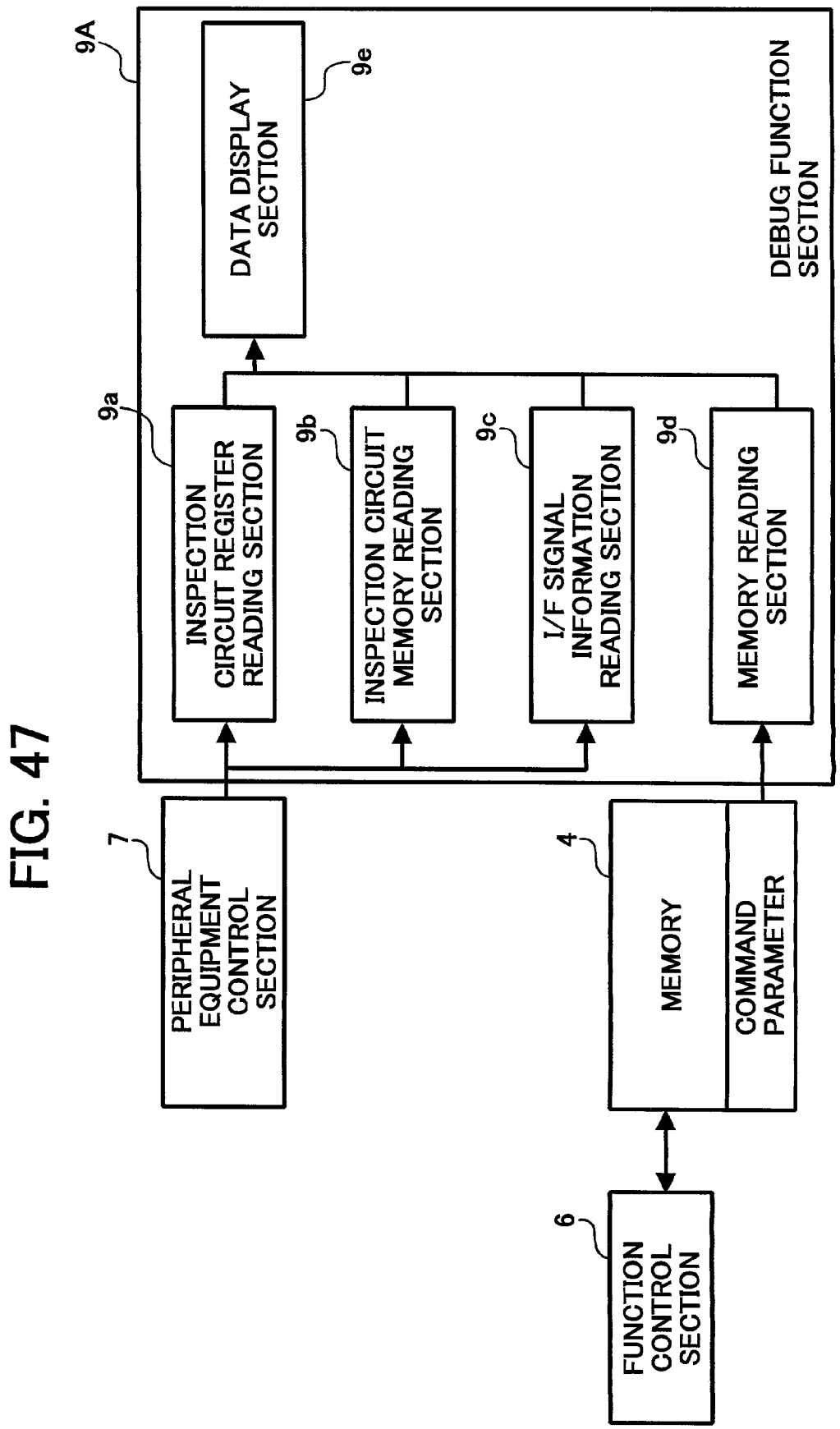
FIG. 47 is a block diagram illustrating a first detailed composition of the debugging function section of the general-purpose inspecting system in FIG. 43.

The debugging function section 9A of FIG. 47 may include an inspecting circuit register reading section 9a, a inspecting circuit memory reading section 9b, an I/F signal information reading section 9c, and a memory reading section 9d, and a data display section 9e. The debugging function section 9A may acquire data from the peripheral unit control section 7 using the inspecting circuit register reading section 9a, the inspecting circuit memory reading section 9b, and the I/F signal information reading section 9c. The debugging function section 9A may acquire a command parameter from the storage section 4 (i.e., "Memory" in the diagram) using the memory reading section 9d, and may transmit it to the data display section 9e to enable the display section 2 to display it on the data display section 9e. Data may thereby be presented to the user.

Figure 48:
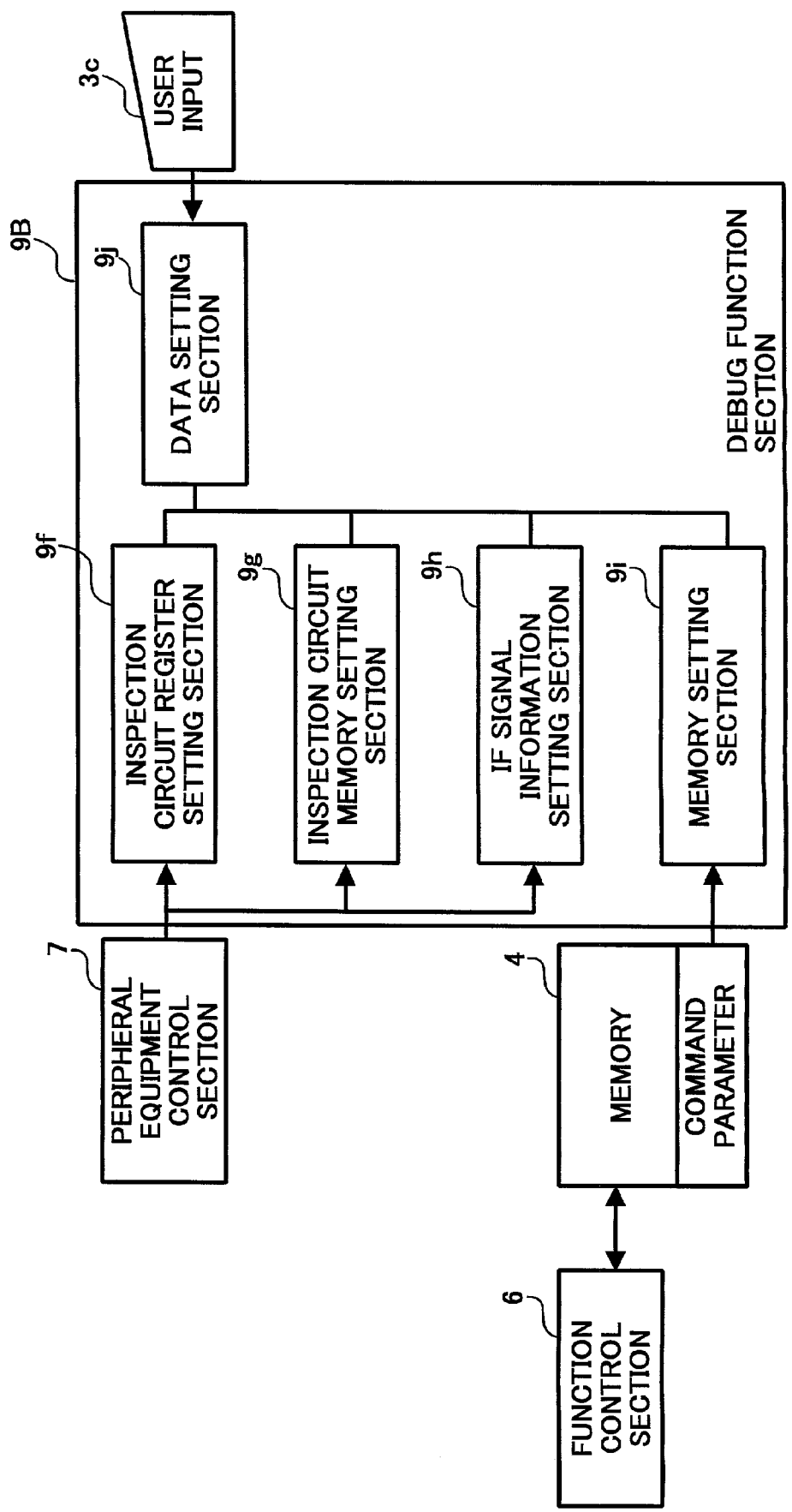
FIG. 48 is a flowchart illustrating a processing operation of the debugging function section in FIG. 47.

In other words, the debugging function section may execute commands in the procedure from step 301 to steps 201 to 203 as shown in FIG. 48 and then may display the data acquired from the peripheral unit control section 7 and the memory on the display section 2 (step 601).

Since the parameter values of the command, contents of the registers and memories of the inspecting circuit, and the signal information of the connection I/F are displayed at a breakpoint or per a step of execution in this manner, the user may easily check the information of the peripheral unit on the screen. Thus, error examination or design verification may easily be performed.

Figure 49:
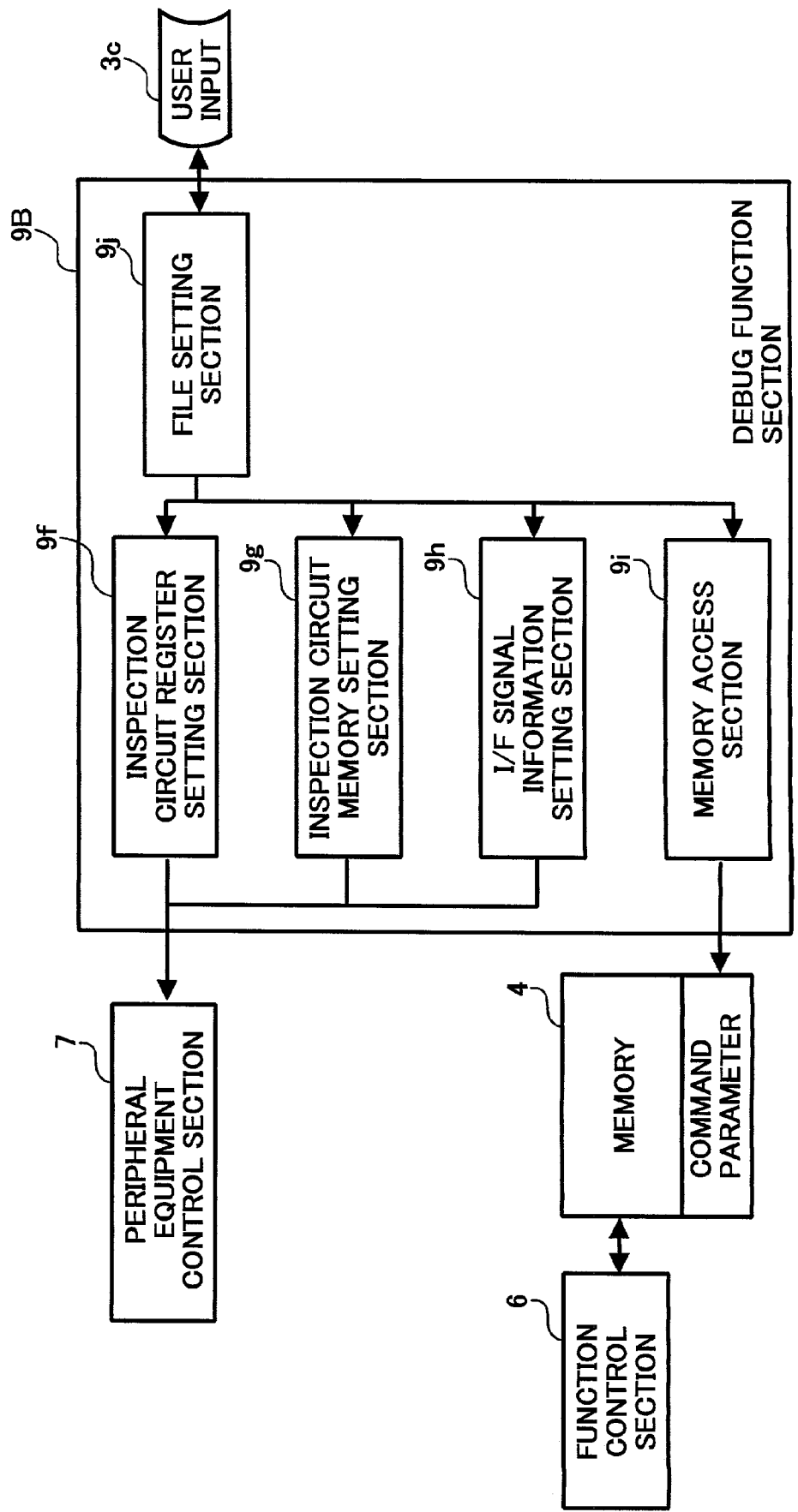
FIG. 49 is a block diagram for illustrating a second detailed composition of the debugging function section of the general-purpose inspecting system in FIG. 43.

In addition, the debugging function section 9B in FIG. 49 may include an inspecting circuit register setting section 9f, an inspecting circuit memory setting section 9g, an I/F signal information setting section 9h, a memory setting section 9I, and a data setting section 9j. The debugging function section 9B may set prescribed input data entered by a user from the keyboard or the like to the peripheral unit control section 7 by means of the inspecting circuit register setting section 9f, the inspecting circuit memory setting section 9g, and the I/F signal information setting section 9h. The debugging function section 9B may also set the prescribed data to the storage section 4 by the memory setting section 9i.

Figure 50:
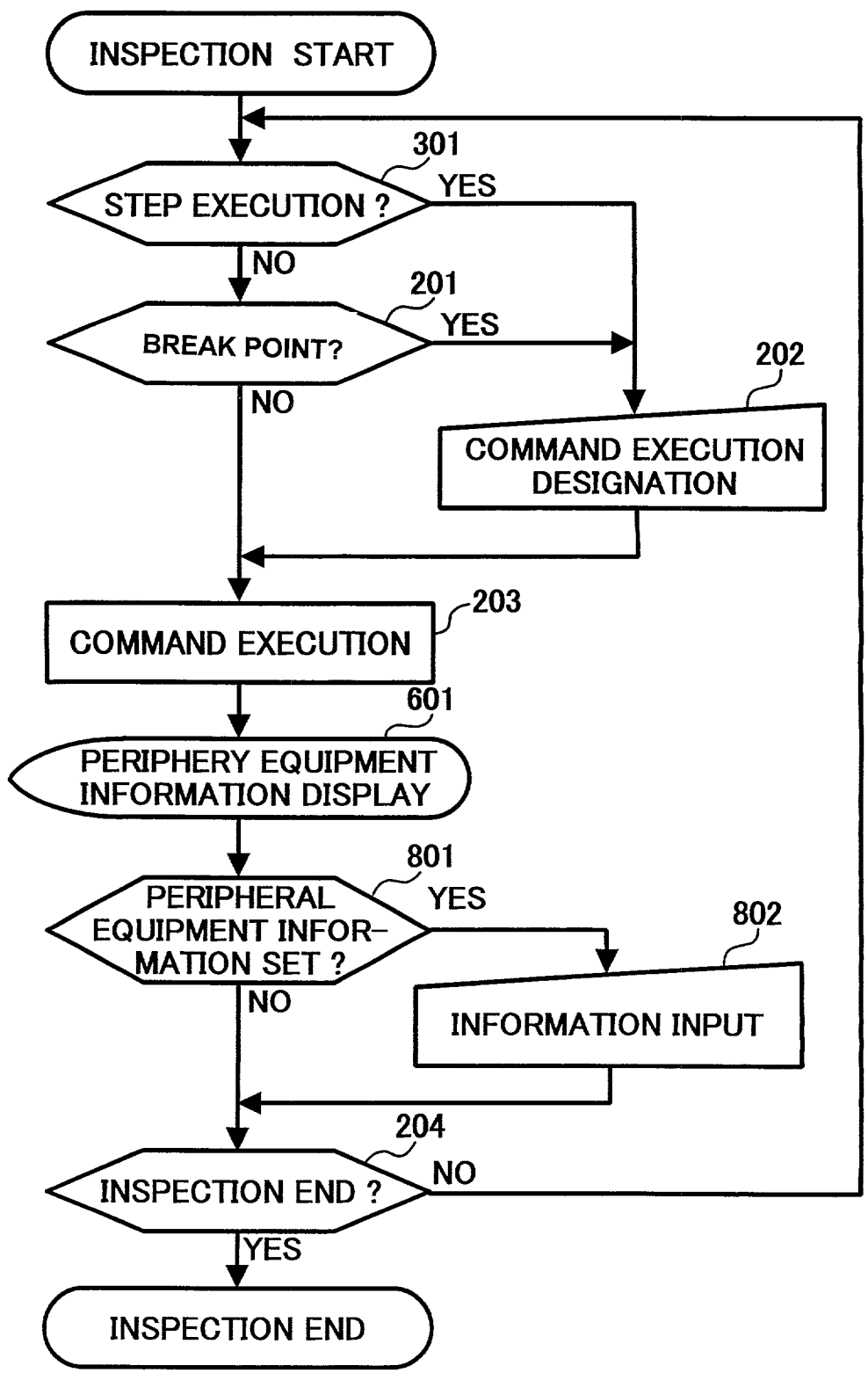
FIG. 50 is a flowchart illustrating a processing operation of the debugging function section in FIG. 49
Figure 51:
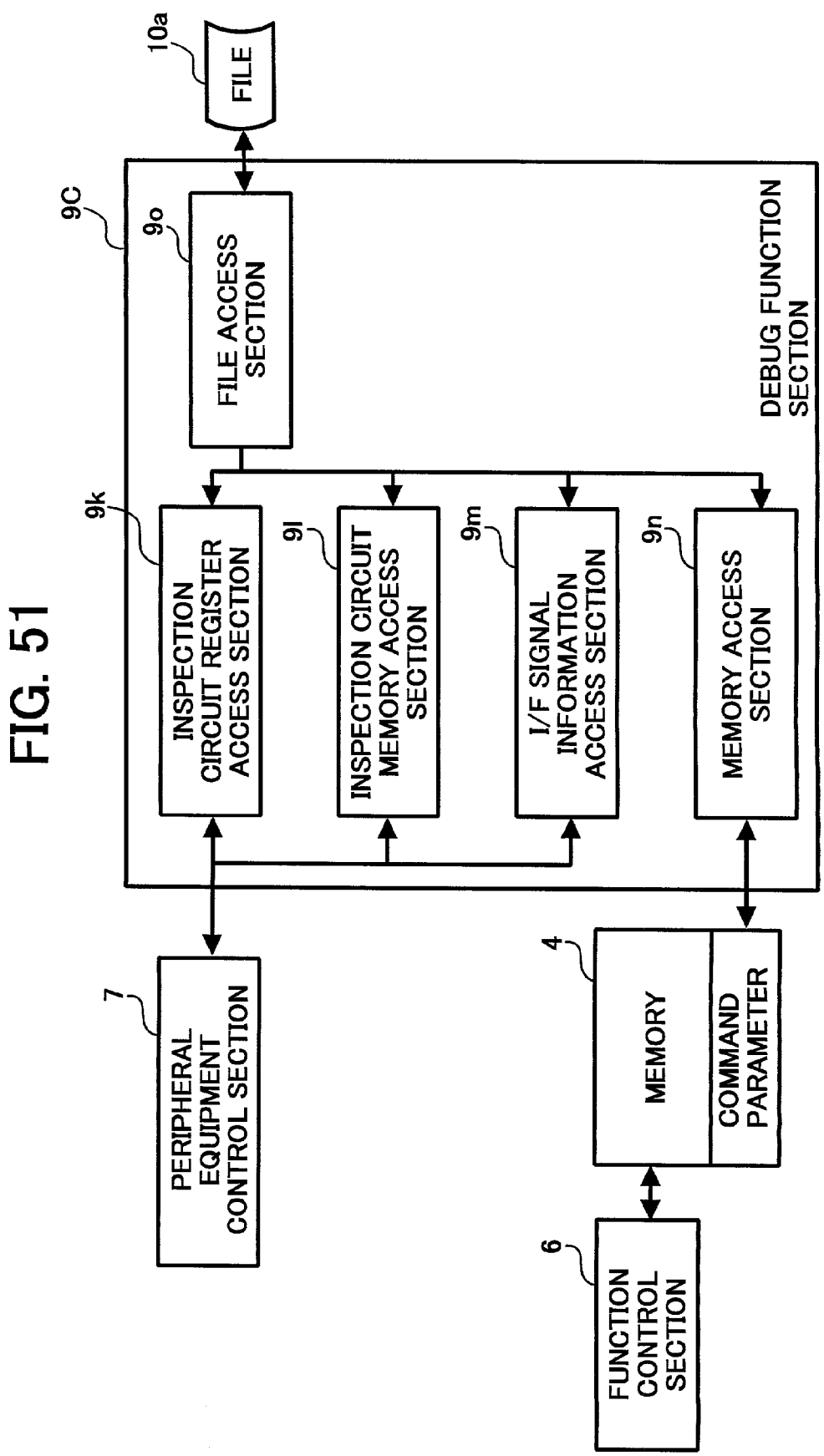
FIG. 51 is a block diagram illustrating a third detailed composition of the debugging function section of the general-purpose inspecting system in FIG. 43.
Figure 52:
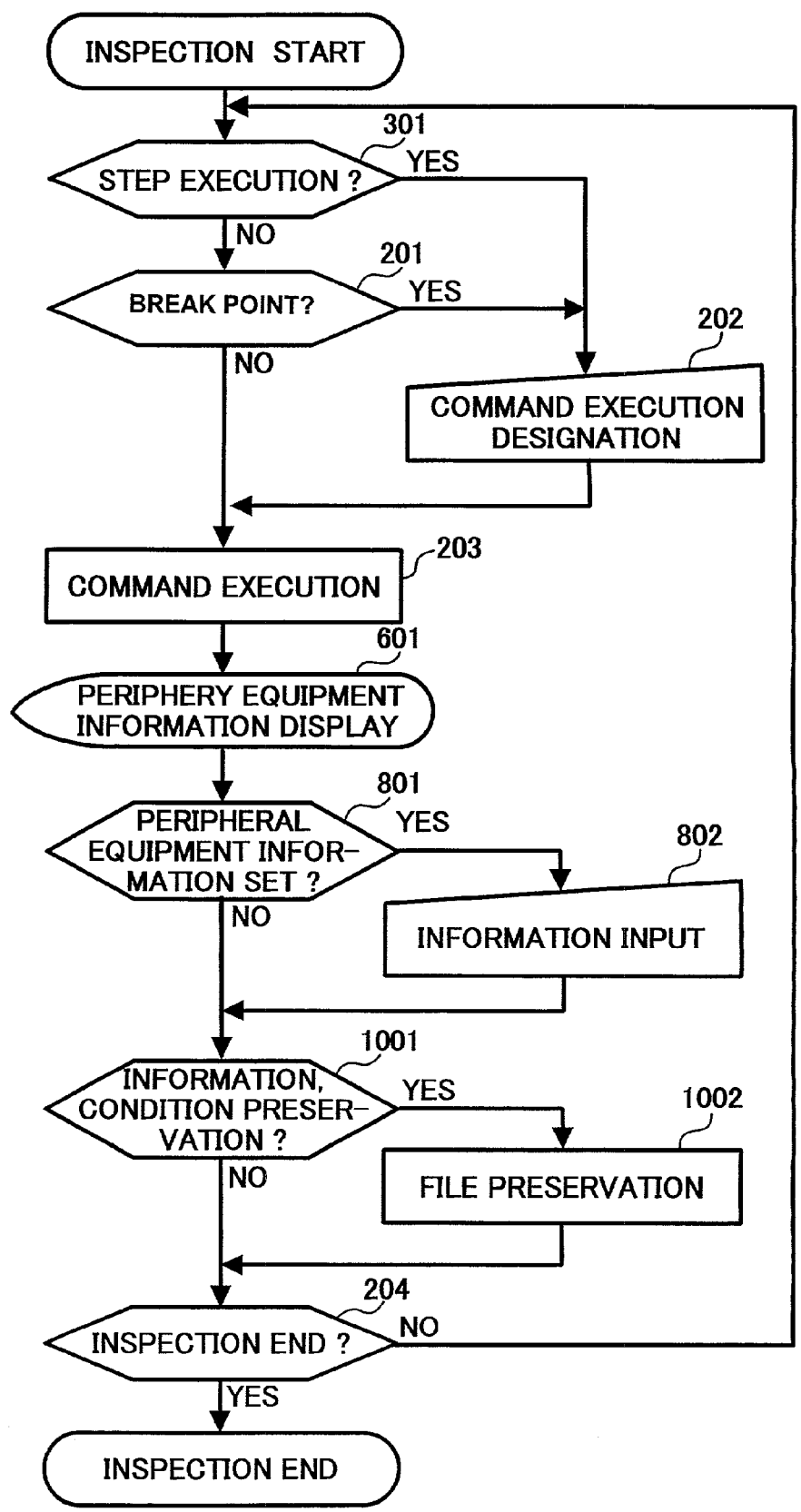
FIG. 52 is a flowchart illustrating a first processing operation of the debugging function section in FIG. 51.

In other words, the debugging function section 9B may execute the command in a procedure from step 301 to steps 201 to 203 as shown in FIG. 50 and set data inputted by the user to replace the data related to the peripheral unit control section 7 and the memory which are displayed on the display section 2 (steps 801 and 802) for another testing purpose.

As set forth above, by permitting a user to replace data related to contents of registers and memories of the inspecting circuit, parameter values of commands, and signal information of the connection I/F at a breakpoint or in each execution set, a different inspecting environment can be set during the inspection operation described in FIGS. 47 and 48. Thus, inspection error examination and design verification can be achieved with special environmental settings.

In addition, the debugging function section 9C of FIG. 9 may include an inspecting circuit register access section 9k, an inspecting circuit memory access section 9l, an I/F signal information access section 9m, a memory access section 9n, and a file access section 9o. The debugging function section 9C may write and read data between itself and either the peripheral unit control section 7 via the inspecting circuit register access section 9k, the inspecting circuit memory access section 9l, and the I/F signal information access section 9m, or a file 10a in the external storage device 10.

The debugging function section 9C may also write and read data between itself and either the storage section 4 (described as "memory" in the diagram) or the file 10a via the memory access section 9n.

In other words, the debugging function section 9C may perform prescribed processing in the procedure of the steps S301, and S201 to S203, the step S601, and the steps S801 and S802 of FIG. 50 as shown in FIG. 10 and then store setting data of the peripheral unit control section 7 and in the storage section 4 related to contents of registers and memories of the inspecting circuit at a breakpoint or in each step of execution, parameter values of commands, and signal information in the connection I/F in the file 10a (steps 1001 and 1002).

Figure 53A:
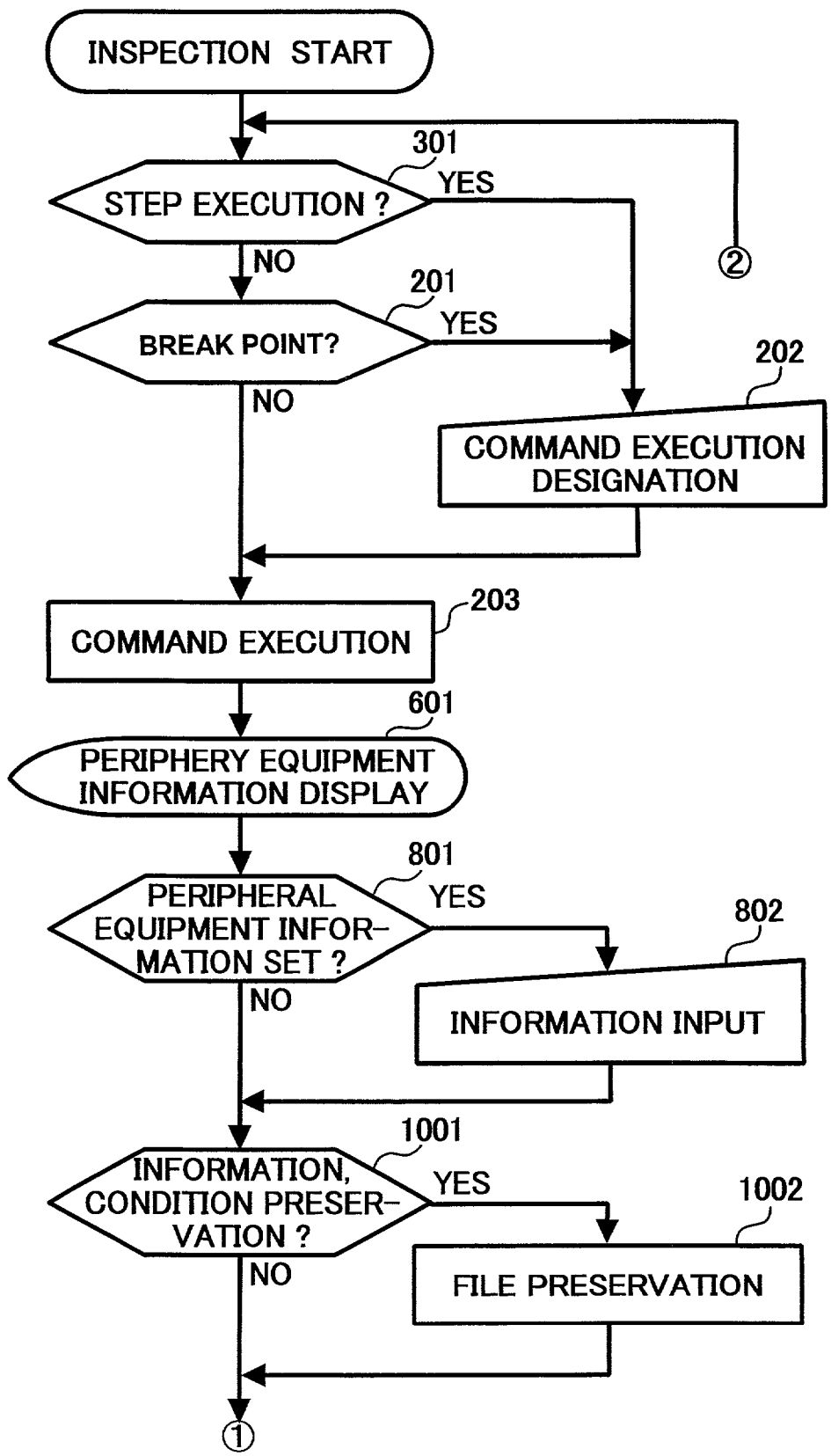
FIGS. 53A and 53B are flowcharts illustrating a second processing operation of the debugging function section in FIG. 55;.
Figure 53B:
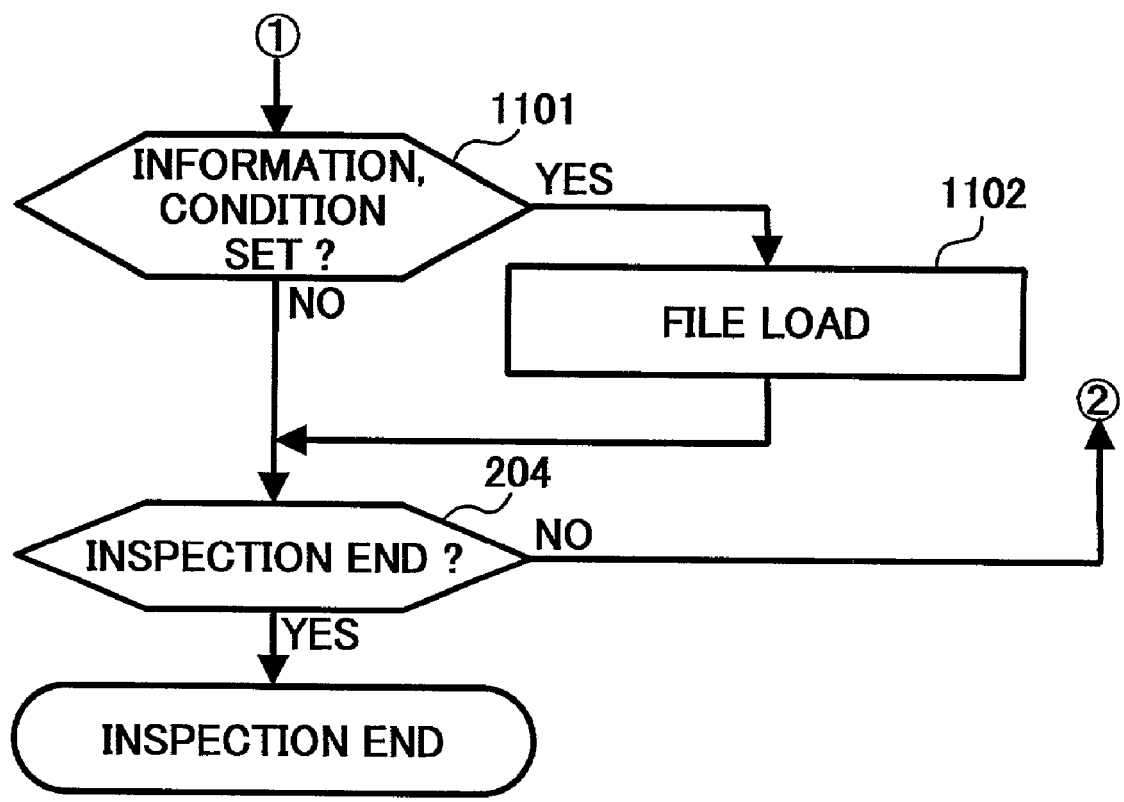

After that, the debugging function section 9C may replace setting data stored in the steps S1002 (i.e., the contents of registers and memories of the inspecting circuit, parameter values of commands, and signal information of the connection I/F) with another setting data other than those setting data from the file 10a (step 1102) as shown in FIG. 53. By storing and loading setting data in this manner, an arbitrary inspecting environment or status can be reconstructed, thereby enabling inspection abnormality examination or design verification with special environmental settings.

The on-screen display may be described with reference to FIG. 46. An inspecting procedure may be displayed in the screen area 41 and respective inspecting items may be classified in a unit of a command. A click on a check item "+" with a mouse may display command items for an applicable inspection operation.

A checkbox may be arranged at the head of each of the inspection items and the command items and checking a checkbox may cause the portion to be a breakpoint. A user can set one or more breakpoints at an arbitrary portion. A function key may be allocated for an operation of the step execution. In addition, another function key may also be allocated for an operation of a non-step execution up to a breakpoint beside step by step execution.

Further, memory contents in the inspecting circuit may be displayed in the screen area 42. This area may be separated into two sections horizontally because of simultaneously displaying both contents of a measuring result storage memory and a reference data storage memory in the inspecting circuit memory. The left-half 8-digit numeral of the right and left memory blocks may represent an address, and an 8-byte memory content may be displayed on the right-hand side thereof with single byte segmentation. A direct input of a numeral to each address may also enable writing into the inspecting circuit memory.

In addition, a register content of the inspecting circuit may be displayed in the screen area 43. A PLD number may correspond to a row, and a register number may correspond to a column. An input of a numeral on this list may also allow setting of an inspecting circuit register.

As set forth above with reference to FIGS. 43 to 54, according to the general-purpose inspecting system and its inspecting method, the inspection operation confirming information may be read during the execution of inspecting the peripheral unit. The debugging function section 9 may be arranged, for example, in order to display respective inspection items for the peripheral unit to be inspected in a prescribed execution order on the screen of the display section 9. A breakpoint for halting the execution of the inspection item may be permitted to be preset in a unit of a command for the inspection items. The execution may be halted at a portion of a command of the inspection item in which this breakpoint is preset, and a command execution result may be displayed on the screen. A step execution may then be made, for example, in a unit of a single command before respective execution results are displayed on the screen.

As set forth in the above-described execution flow, a breakpoint may be preset at an arbitrary place, and the inspection can be halted at the preset breakpoint, thereby facilitating inspection abnormality examination and design verification.

Further, a device may be inspected in a step by step manner in a unit of a command or the like from the start of the inspection operation to a breakpoint or to the end of the inspection operation, thereby enabling more detailed inspection abnormality examination or design verification.

Still further, parameter values of commands, contents of registers and memories of the inspecting circuit of the peripheral unit, and signal information of the connection I/F may be acquired and displayed as more detailed information up to a breakpoint or per a step of execution, thereby enabling a further detailed inspection abnormality examination and design verification.

Additionally, a different inspection environment can be set by changing parameter values of commands, contents of the registers and memories of the inspecting circuit, and signal information of the connection I/F in contrast to the information acquired in the previous inspection environment during the inspection operation at a breakpoint or in a step of execution, thereby enabling a inspection abnormality examination and a design verification with special environmental settings.

Furthermore, since prescribed parameter values of commands, contents of registers and memories of the inspecting circuit, and signal information of the connection I/F are preserved in a file, and are read and set at a breakpoint or in a step execution to be replaced with existing values, special environmental settings can be facilitated.

In the above-described embodiment, the example of the computer configuration in FIG. 53A may be a computer configuration without a keyboard, an optical disk, or a driver. In addition, for the optical disk, a floppy disk (FD) ( ) may be used as a recording medium. Furthermore, the program may be downloaded via a communication unit by way of a network for installation.

The fifth embodiment of the present invention may be described with reference to FIGS. 54 to 62.

Referring to FIG. 54, there is shown a compositional diagram of a general-purpose inspecting system of the fifth embodiment. The system may include a controlled device 10 connected to an external device 1 and a control processor 20. The term "controlled device" 10 in this embodiment may represent a device to be controlled by a control block for controlling the entire system, for example, a fixture device in the PCB inspection device, or the like. This device 10 may include an operator panel or similar devices (e.g. function buttons or PCB fixing mechanism for a PCB inspecting apparatus) as a user interface as well as an I/F section 12 for receiving a command or the like from the control processor 20 and returning a response to it. In addition, this device 10 may have no processing section inside or externally have a processing section with being connected to the external device 1.

On the other hand, the term "control processor" 20 may represent the control block for controlling the entire system. It may also include a user interface (GUI screen, etc.) used when a user operates the system and a control section 22 for controlling the entire system according to input by the user via the user interface. Furthermore, in the same manner as to the controlled device 10, it may include an I/F section 21 for transmitting a command or the like or receiving a response thereto. Furthermore, it may also be possible to arrange an intermediate block such as an auxiliary control unit between the controlled device 10 and the control processor 20, so that the control processor 20 may operate the auxiliary control unit or that the auxiliary control unit assumes a part or all of the control by the controlled device 10.

Figure 55A:
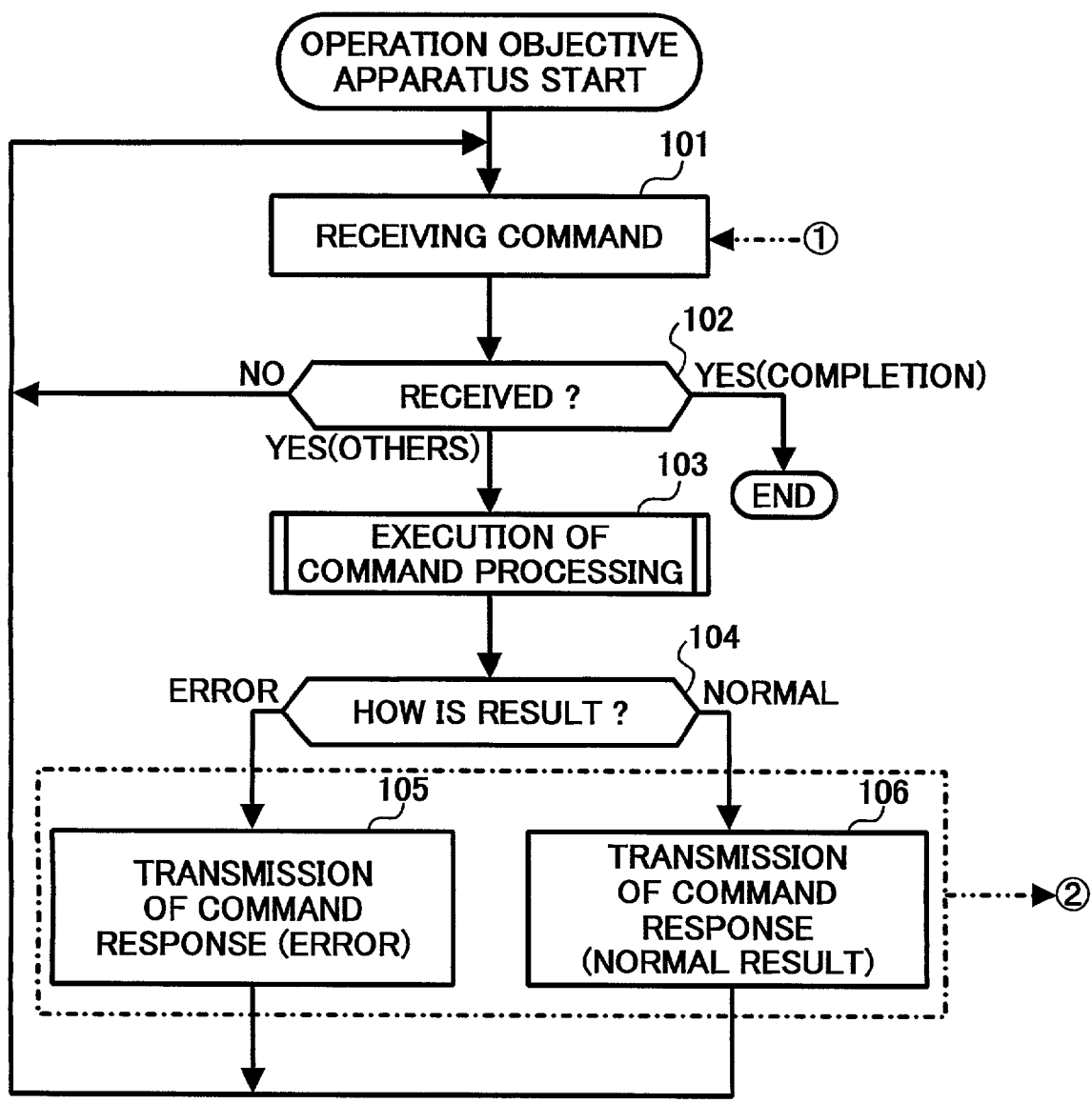
FIGS. 55A and 55B are flowcharts illustrating an operation of an related art.
Figure 55B:
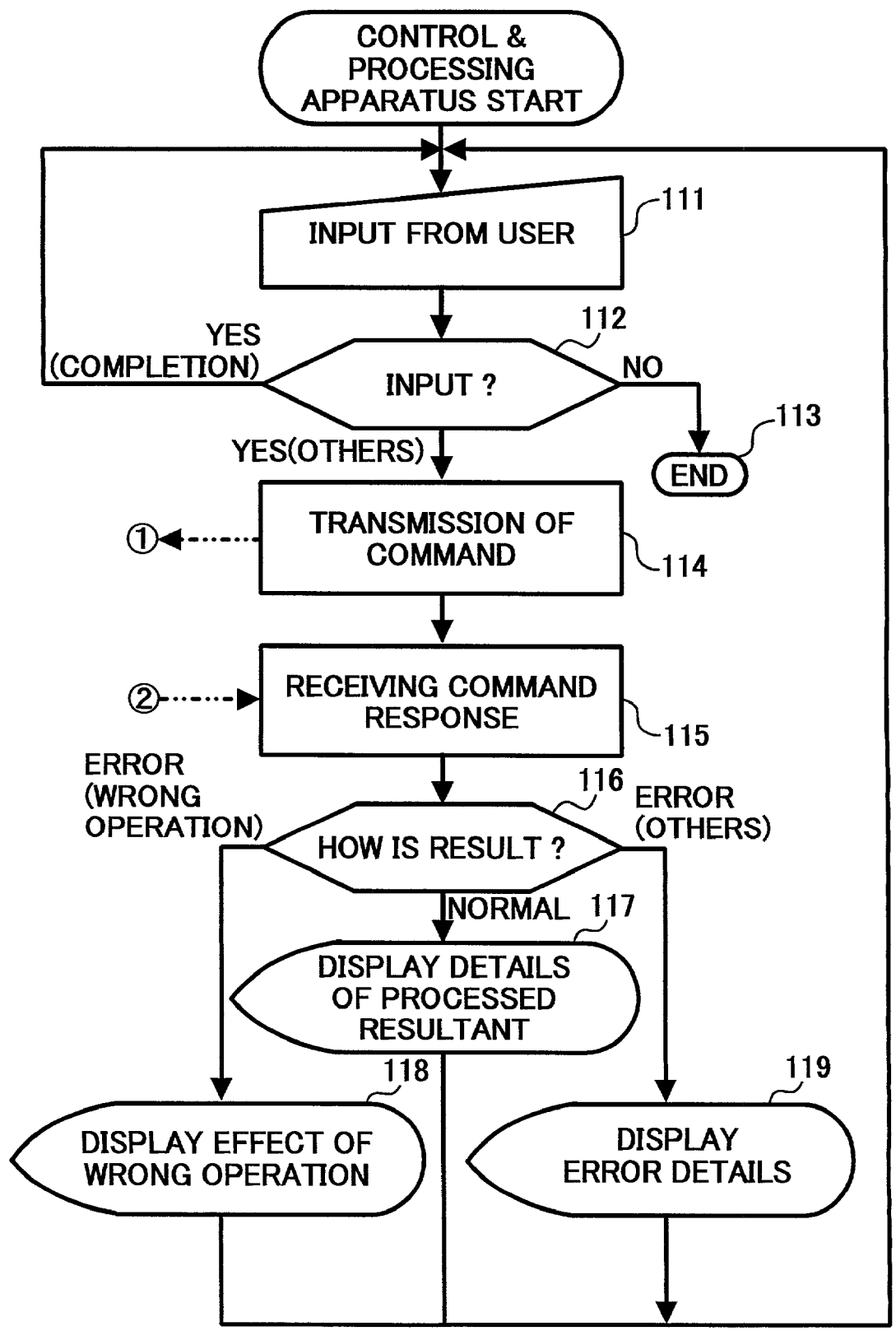

Prior to describing a general-purpose inspecting method of this embodiment, a basic flow may be described below for comparison purpose. As shown in FIGS. 55A and 55B, the control processor 20 may transmit a prescribed command or the like to the controlled device 10 in accordance with the input by a user (step 114) and receive a response (step 115). If the receipt is an error (step 116), the operation of the user may be found as invalid only after examining its cause. Therefore, the control processor 20 notifies the user that the operation is invalid upon such a finding (step 118).

Figure 56A:
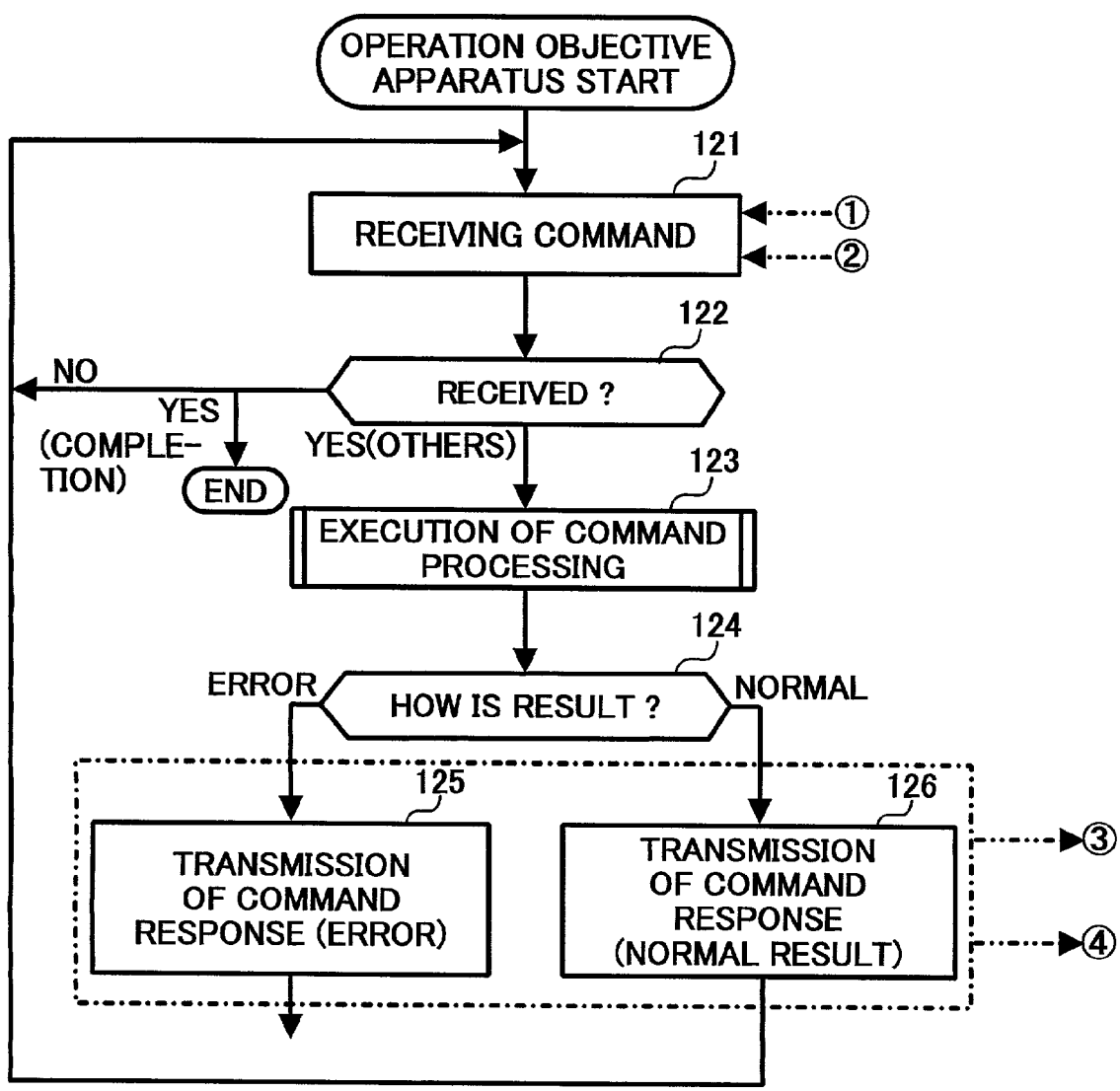
FIGS. 56A, 56B and 56C are operation flowcharts illustrating a general-purpose inspecting method.
Figure 56B:
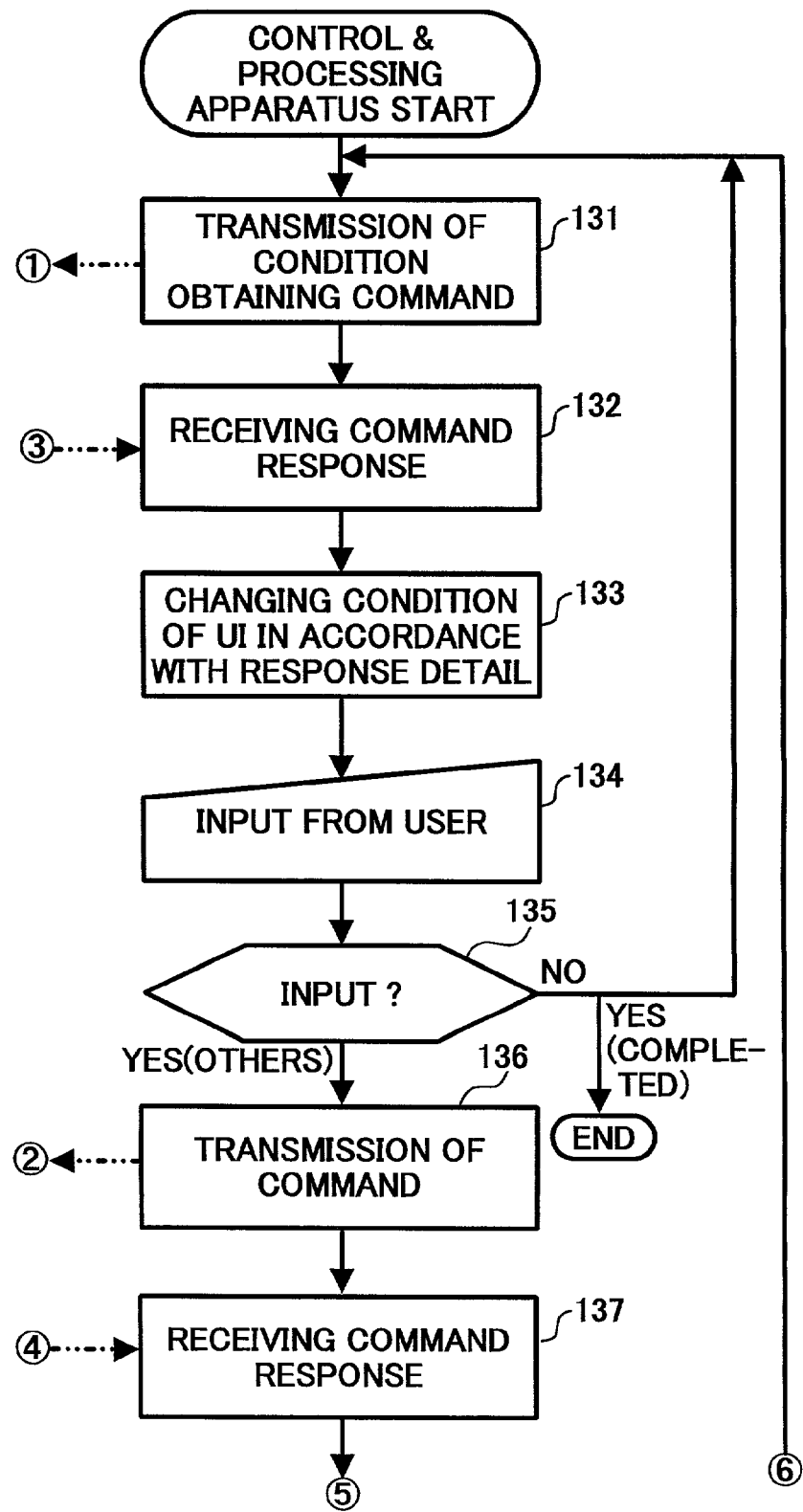
Figure 56C:
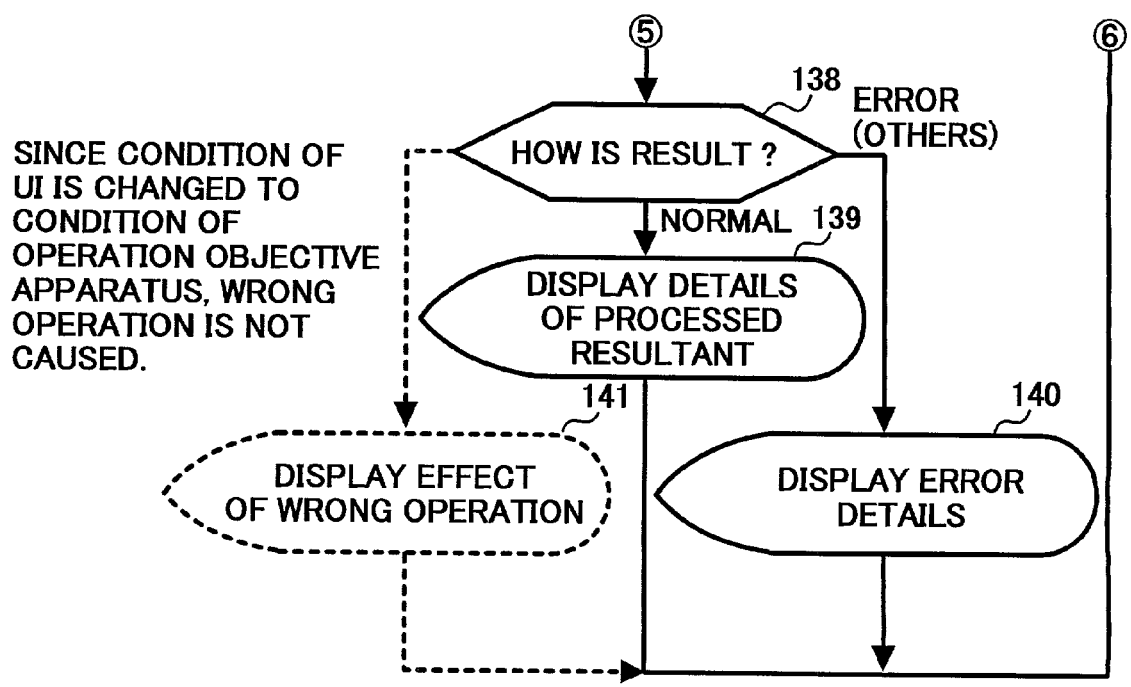

In FIGS. 56A, 56B, and 56C, there is shown an operational flowchart of a general-purpose inspecting method according to this embodiment. Since there is provided an interface 21 for acquiring a status of the controlled device 10 in addition to an existing interface, the user input (UI) section 23 of the control processor 20 can be changed according to a status of the controlled device 10 so as to inhibit a user from performing a conflicting operation that might be caused between both UI sections, for example. Thus, this may prevent.

Specifically, if processing of the control processor 20 is started in FIG. 56B, a status acquisition command may be transmitted first (step 131). The controlled device 10 may receive the command simultaneously with the start of the operation (step 121) and execute the command processing (step 123). If a result of the execution is normal, it may return a command response indicating a normal result (step 126). In contrast, in case of an error, it may return a command response indicating an error. (step 125). This return may immediately be received as a command response (steps 132 and 137), and a status of the controlled device 10 may be determined. Accordingly, if a UI status is changed according to the content of the response (step 133), and prescribed input is made by a user (step 134), a command can be transmitted to the controlled device 10 while avoiding the conflict (step 136).

FIG. 56B illustrates yet another possible modification. In this modification, a status of the controlled device 10 may be acquired by polling from loops while awaiting user input. In other words, as soon as the control processor 20 starts the operation, it may transmit a status acquisition command through a polling operation (step 131). The controlled device 10 may receive this command at a start of the operation (step 121) and may execute command processing (step 123) and return a command response (steps 125 and 126) to the control processor 20. The control processor 20 may receive the command response (step 132), and may permit a change of the UI status in accordance with the content of the response (step 133). Thus, the UI status may be set in accordance with the status of the controlled device 10, thereby preventing a conflicting operation.

Another modification is described with reference to FIG. 57, which shows an operation flowchart of a general-purpose inspecting method.

A processing flow in FIGS. 57A, 57B, 57C, and 57D may use a system for generating interruption to the control processor 20 in accordance with a change in a status of the controlled device and changing a status of a user interface of the control processor 20 in accordance with the interruption in addition to the basic processing flow. The processing manner may be the same as that of the above-described polling performed during the interruption.

Figure 57A:
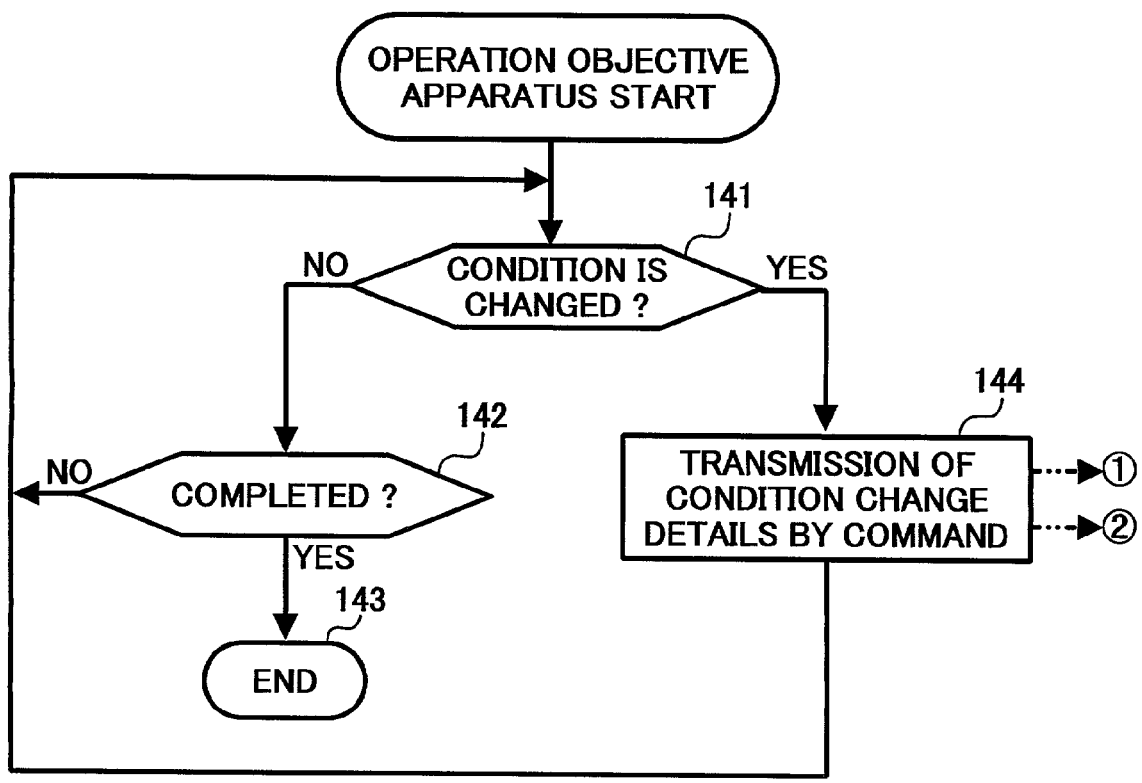
FIGS. 57A, 57B, 57C and 57D are operation flowcharts illustrating a modification of the general-purpose inspecting method.
Figure 57B:
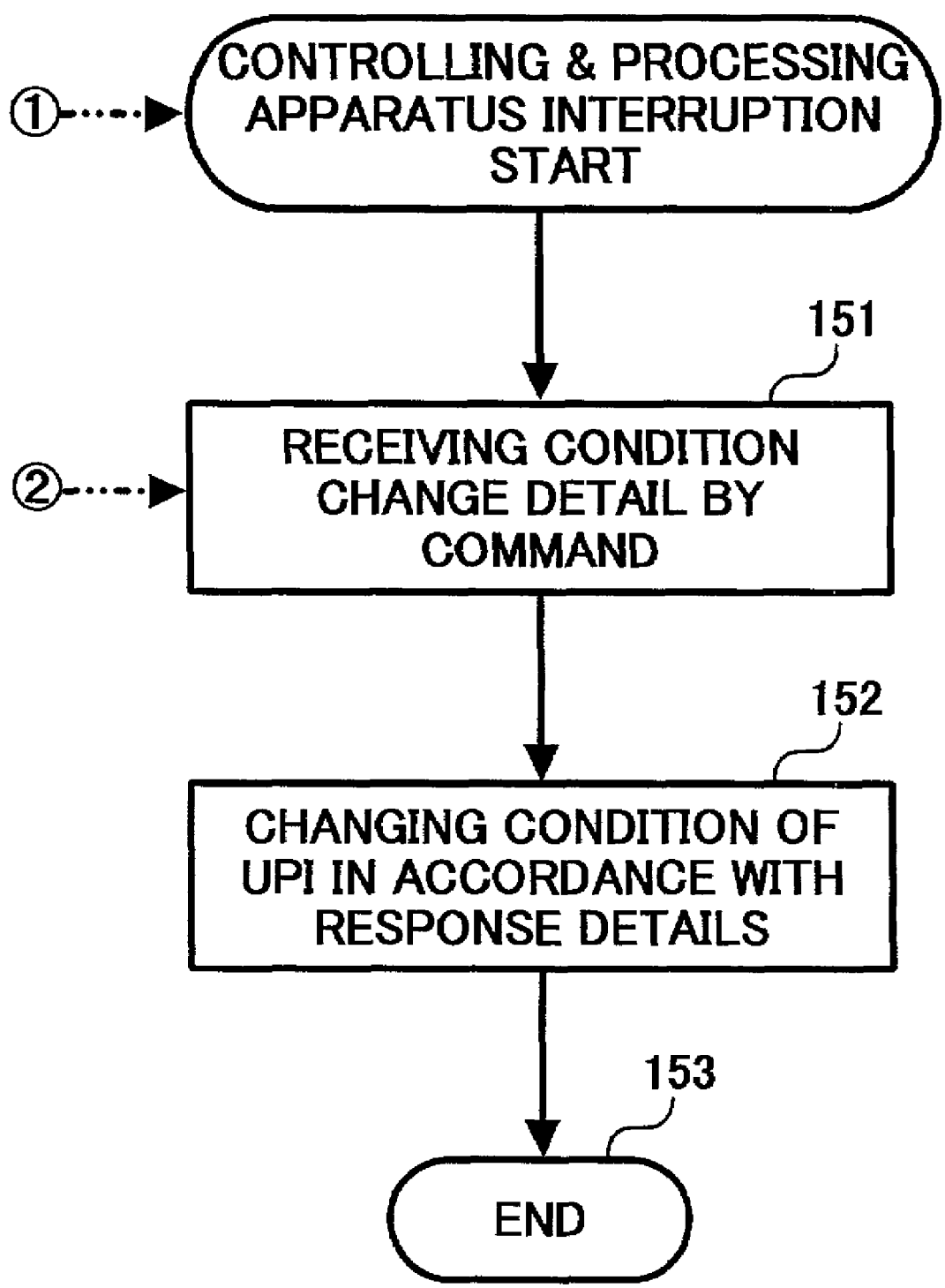
Figure 57C:
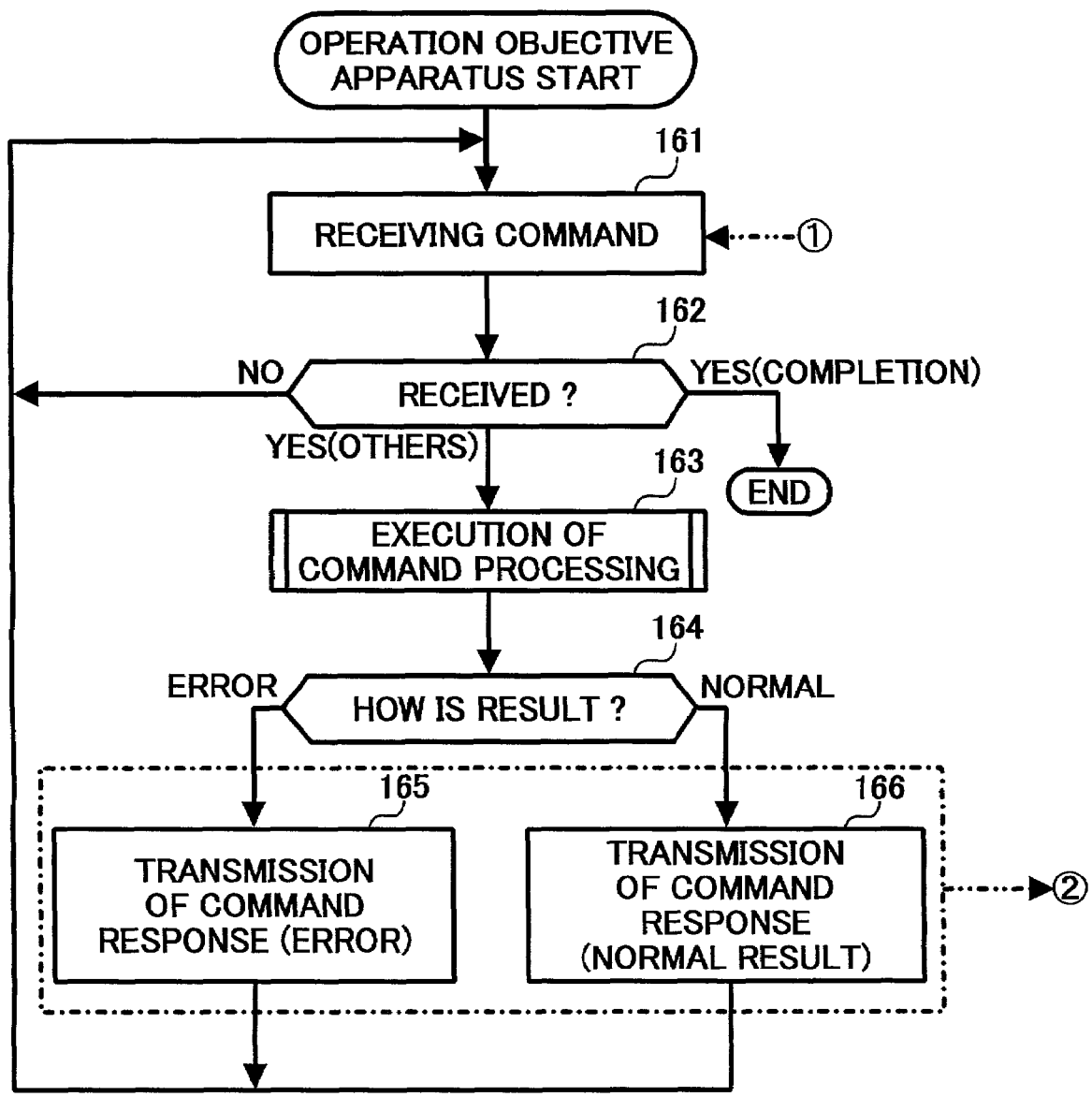
Figure 57D:
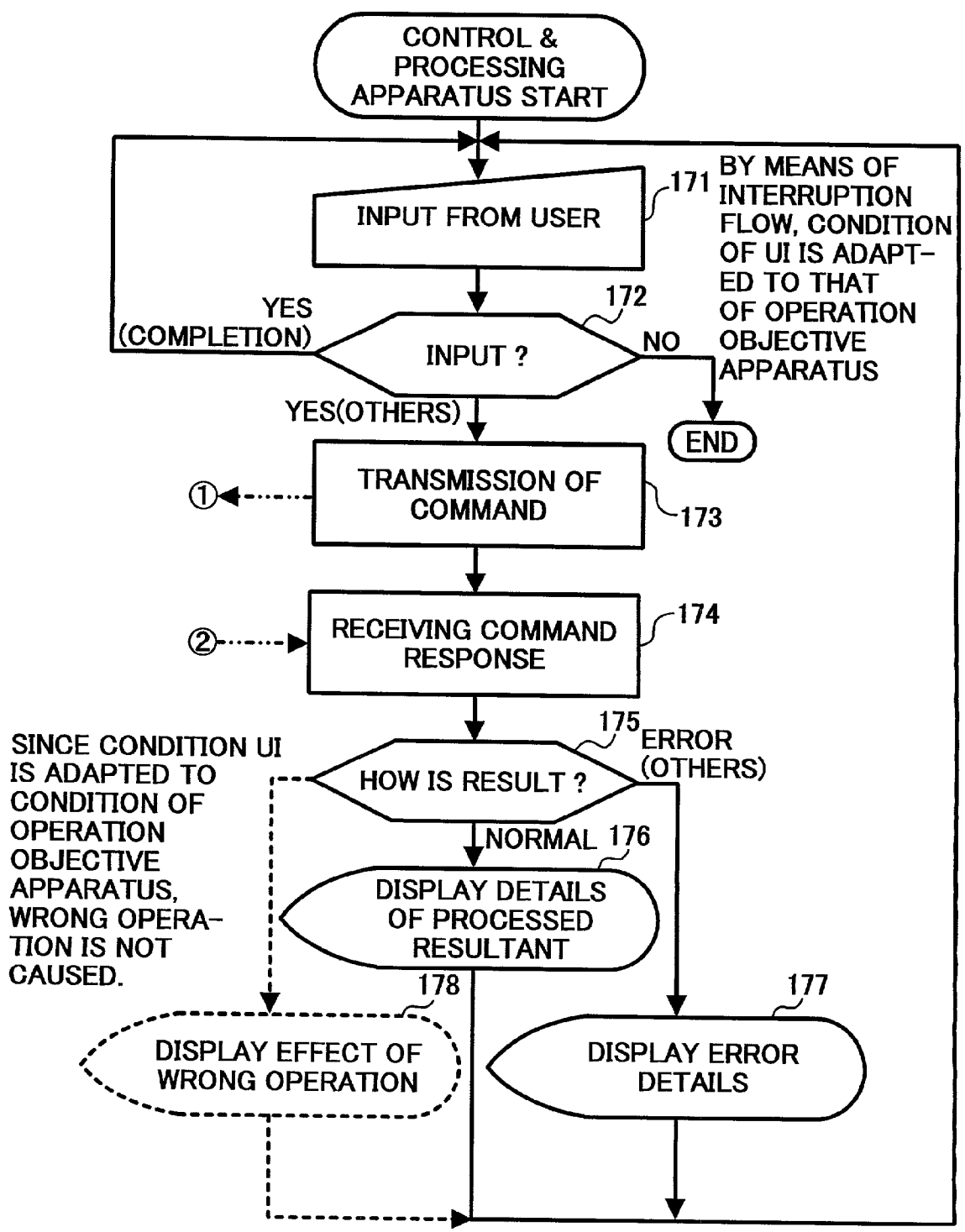
Figure 58A:
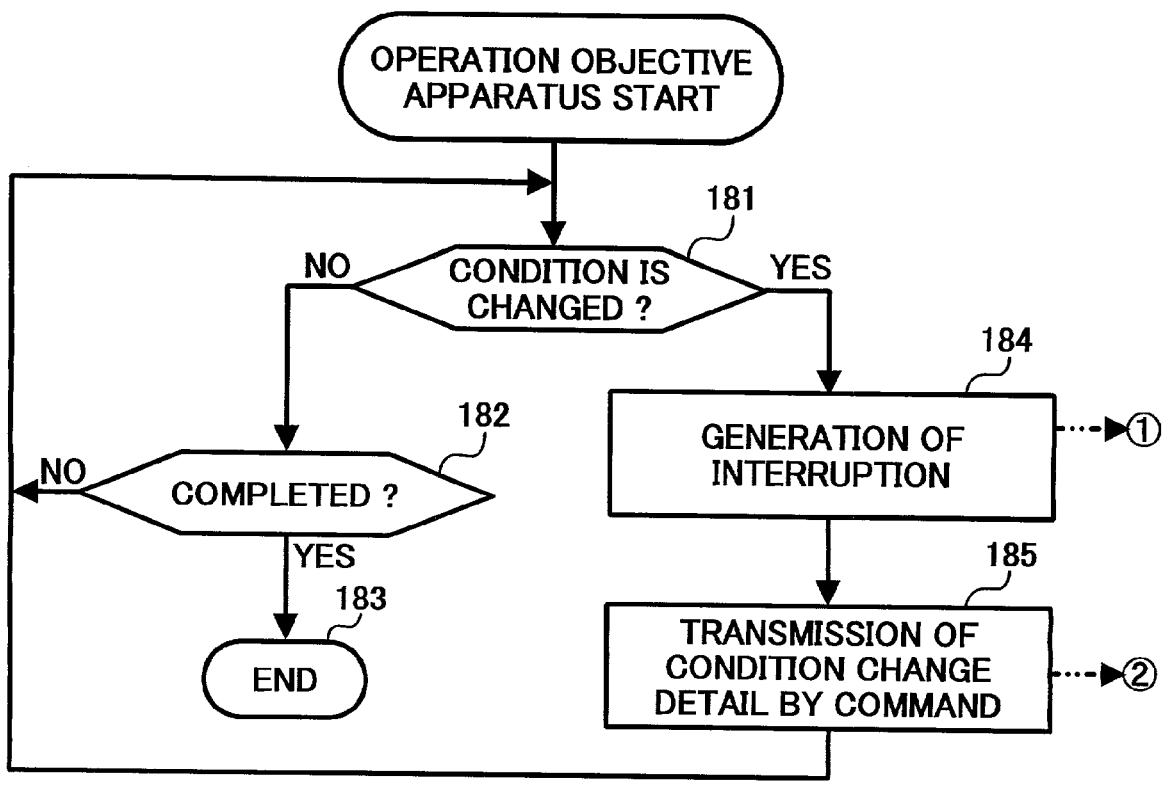
FIGS. 58A, 58B, 58C and 58D are flowcharts illustrating another modification of the processing flow of FIG. 64.
Figure 58B:
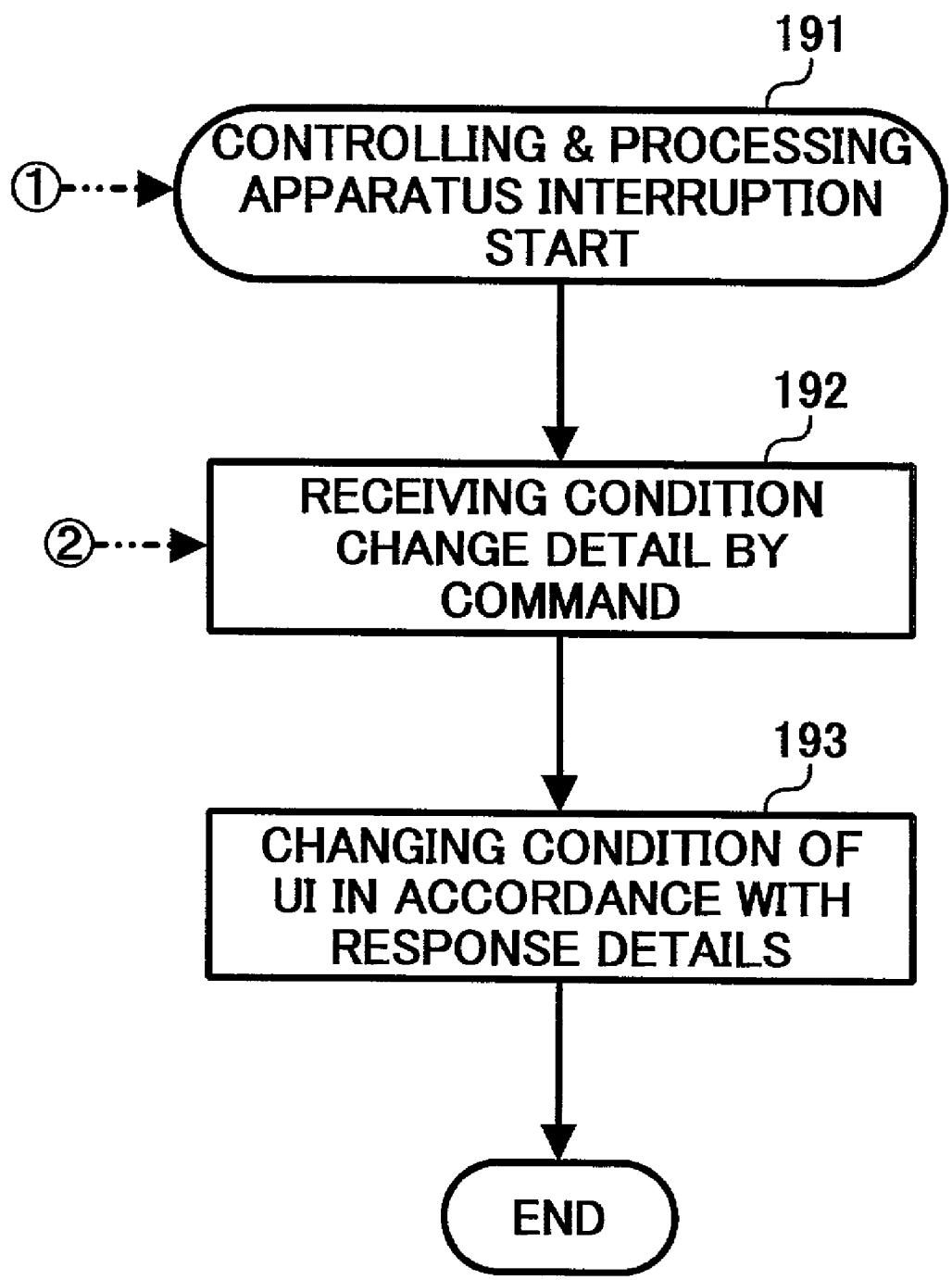
Figure 58C:
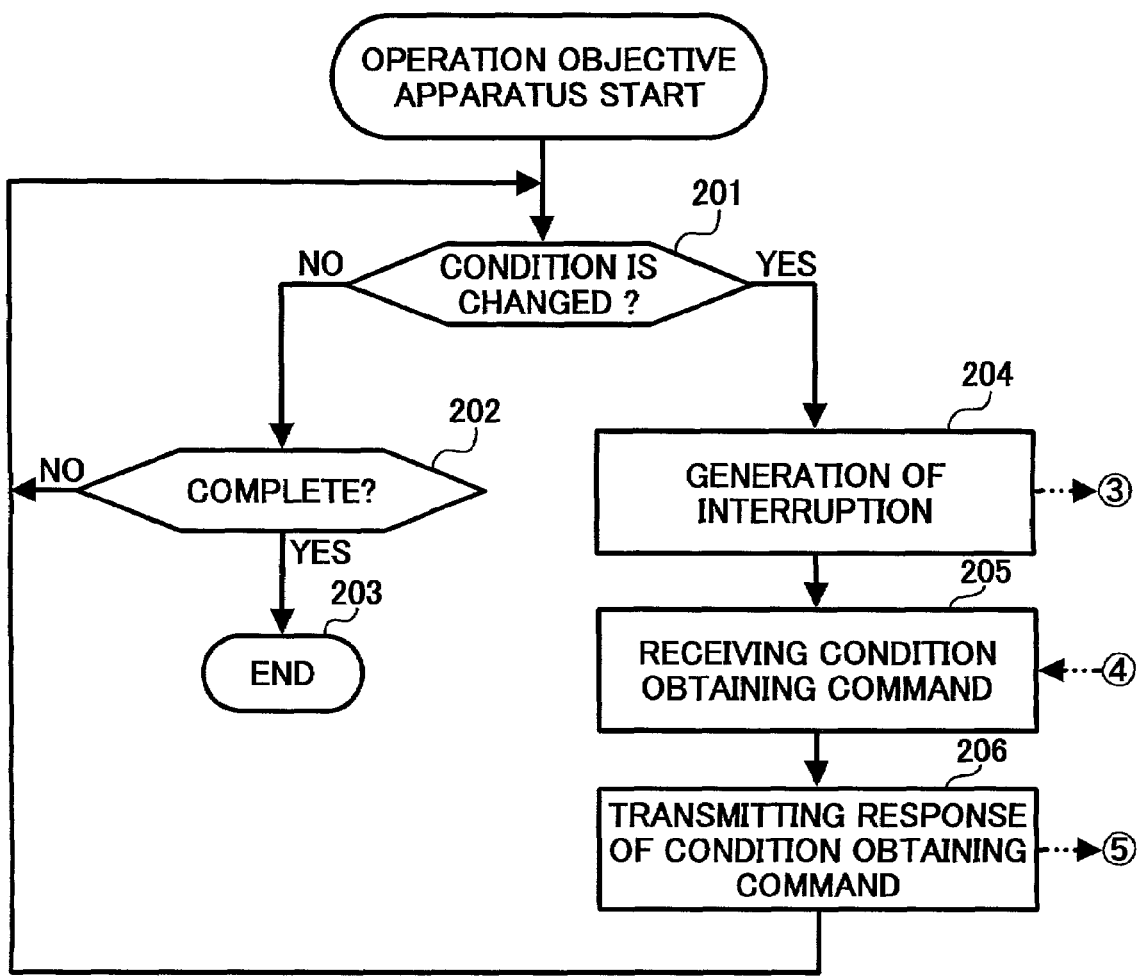
Figure 58D:
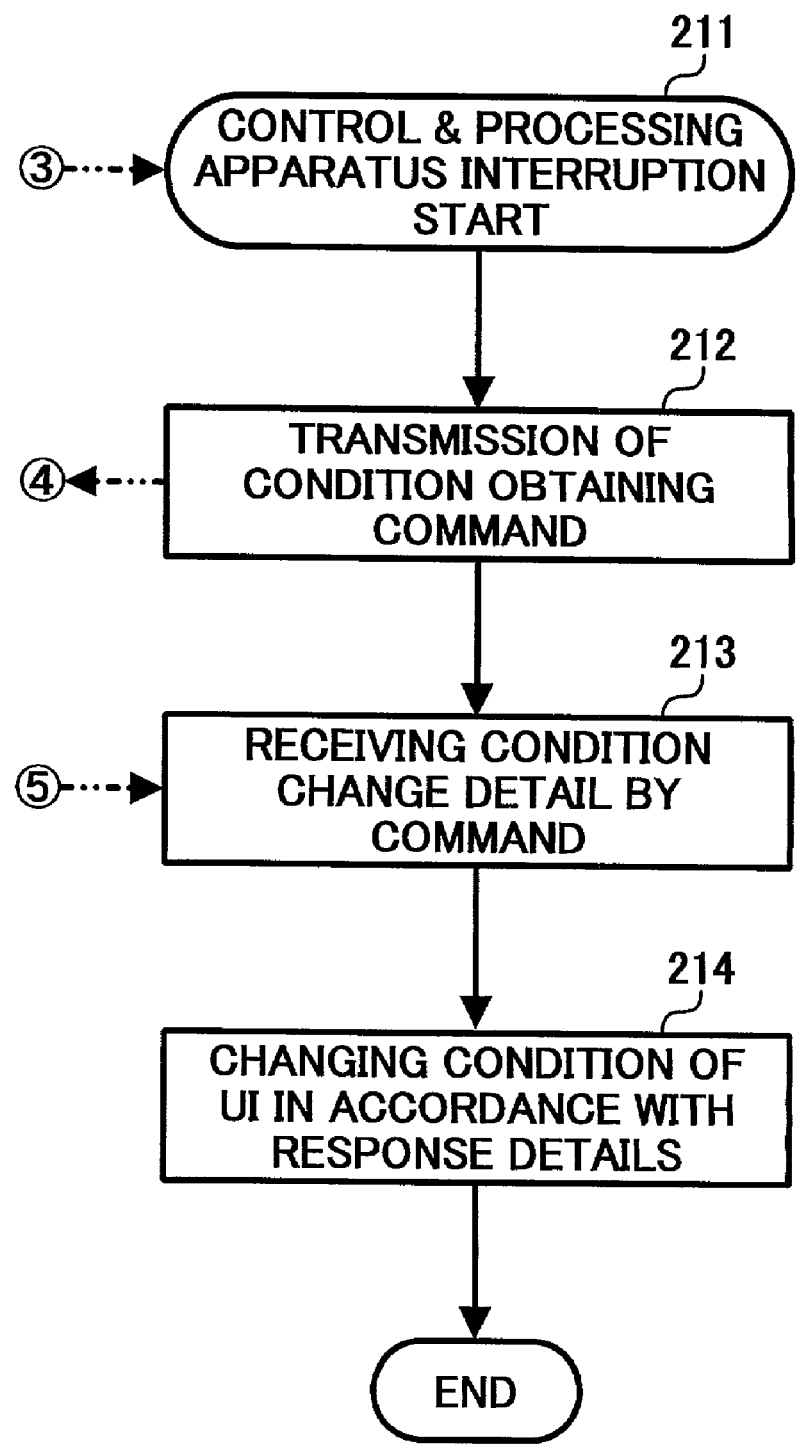

Specifically, FIGS. 57A and 57B show potential interrupt generation processing and FIGS. 57C and 57D show processing steps. As shown in FIGS. 57A and 57B, when interruption processing by the control processor 20 begins and a status change occurs simultaneously when an operation of the controlled device 10 is started (step 141), an interrupt may occur and contents of a status may be transmitted by means of a command (step 144). If the status change does not occur, the processing may be terminated directly (step 142). The control processor 20 may receive the content of the status change (step 151) and may change the UI status according to the contents of the response (step 152). After this interrupt processing, the main processing (i.e., PCB inspection) shown in FIGS. 57A and 57B may be executed. In this processing, the UI status may be changed to the status of the controlled device 10, thereby preventing the occurrence of a conflicting operation.

Figure 59A:
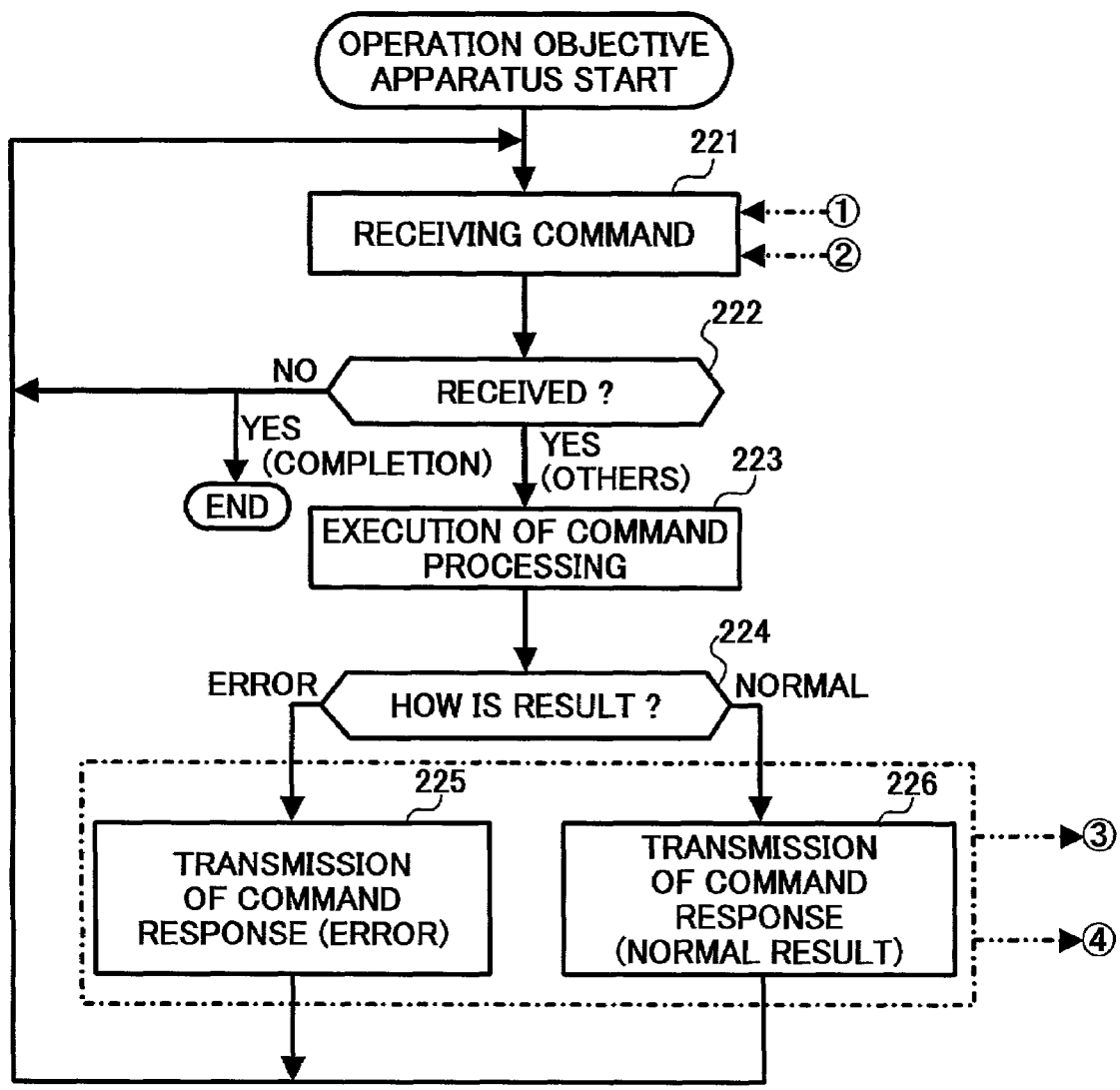
FIGS. 59A, 59B, and 59C are operation flowcharts illustrating another general-purpose inspecting method according to the present invention.
Figure 59B:
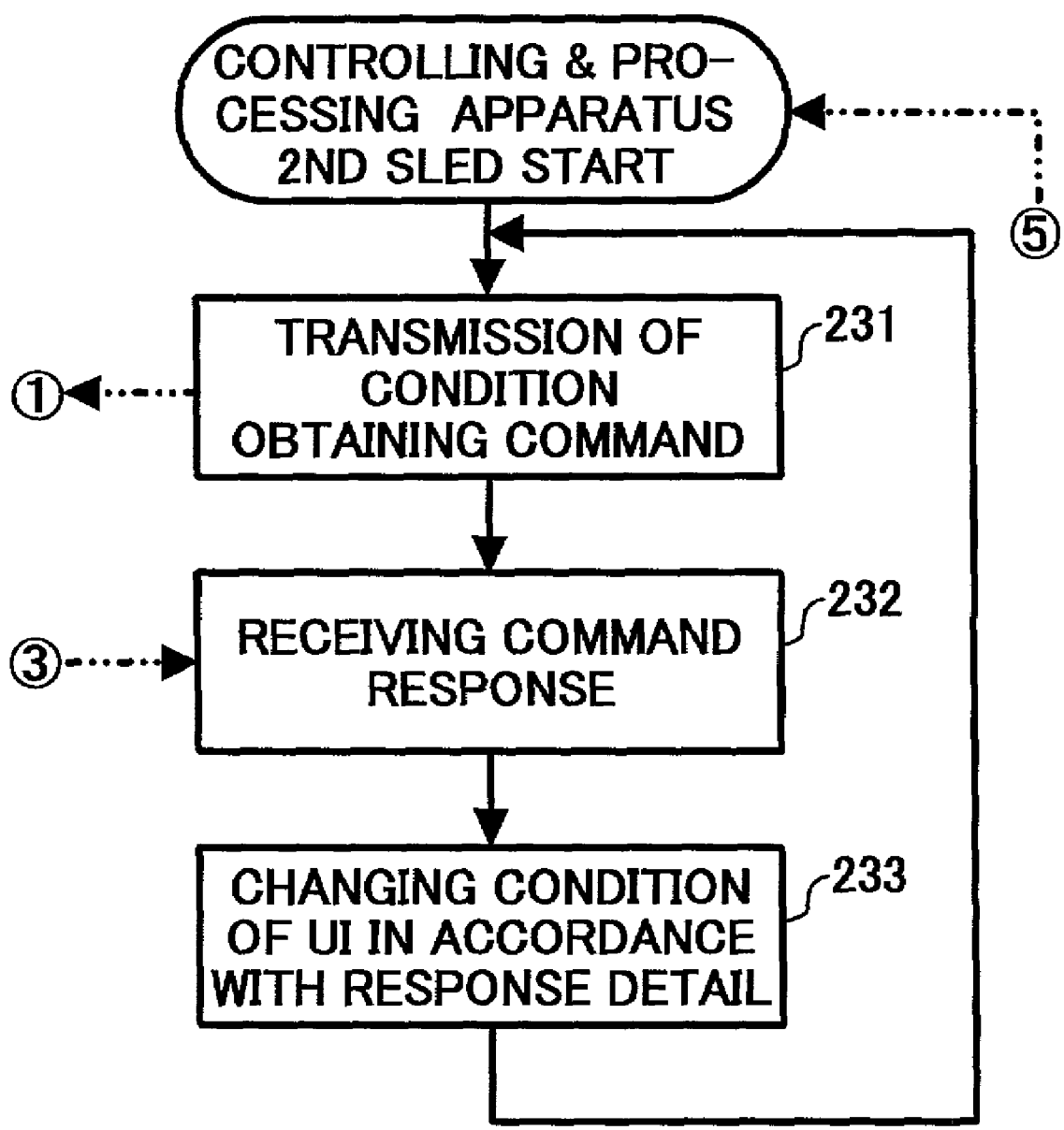
Figure 59C:
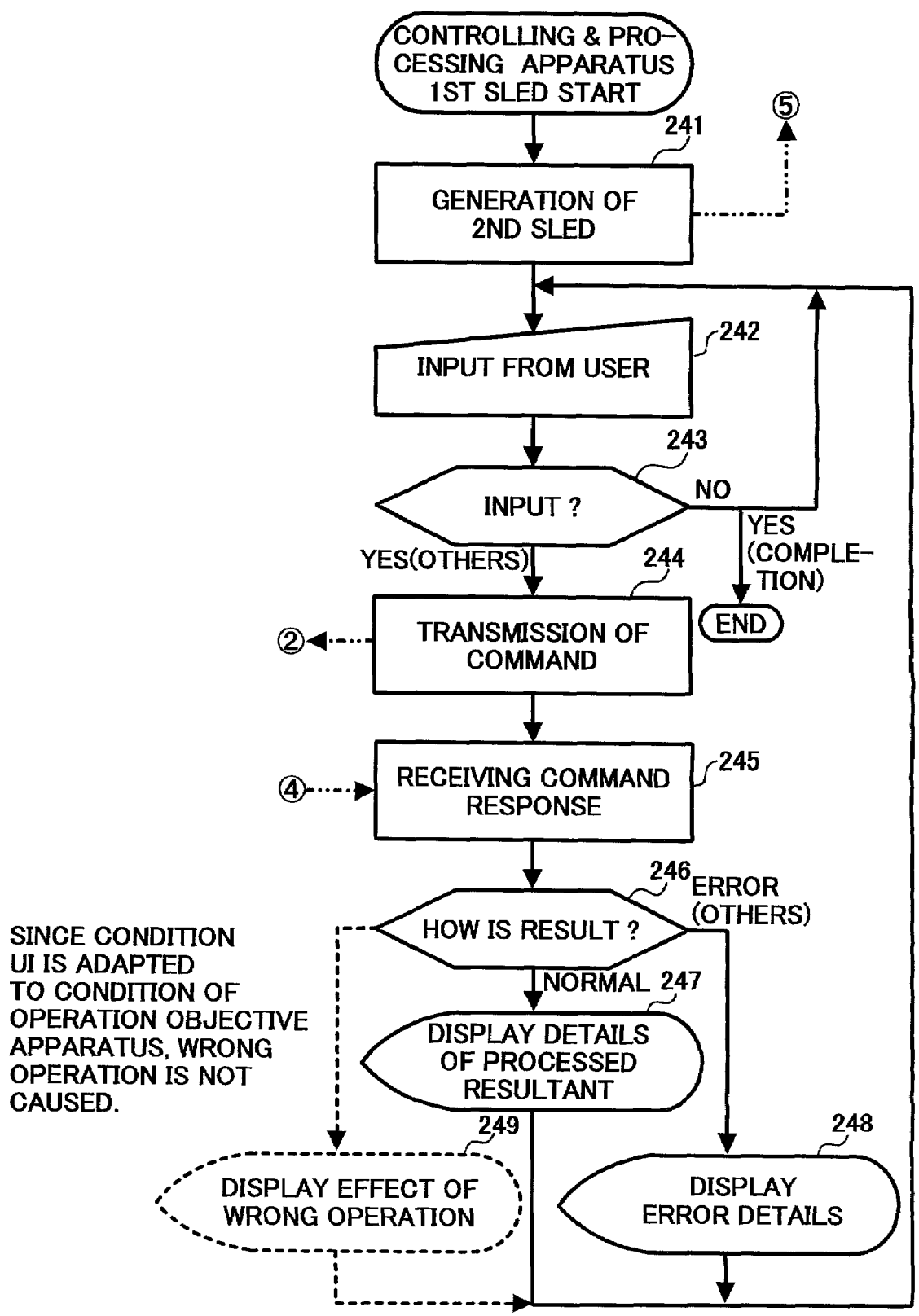

Referring to FIGS. 59A, 59B, 59C and 59D, there is shown a processing flowchart of still another modification of the processing flow of FIGS. 58A to D. The interrupt processing flow may use an interface, for example, RS-232C port of a PC, in which receipt data (i.e., command) causes interruption as an interface between the controlled device 10 and the control processor 20. Specifically, as shown in FIGS. 59A to 59C, besides an interface used for exchanging a command, it may be possible to arrange a system for causing an interrupt (See FIGS. 58A and 58B). It may also be possible to cause only an interrupt in the controlled device 10 and to enable the control processor 20 to transmit a status acquisition command in the interrupt processing triggered by the interruption, and to acquire a status change of the controlled device 10 (See FIGS. 58A and 58B).

In other words, FIGS. 59A and 59B show processing for causing interrupt in the controlled device 10. Therefore, when the operation of the controlled device 10 begins and the status change occurs (step 181), an interrupt may also occur (step 184) and the control processor 20 starts interrupt processing (step 191). Subsequently, when the controlled device 10 transmits a content of the status change by means of a command (step 185), the control processor 20 may receive the contents of the status change by way of the command (step 192) and may change the UI status according to the contents of the response (step 193).

Still another modification is described with reference to FIGS. 60A to 60C, which show an operation flowchart of a general-purpose inspecting method.

Figure 60B:
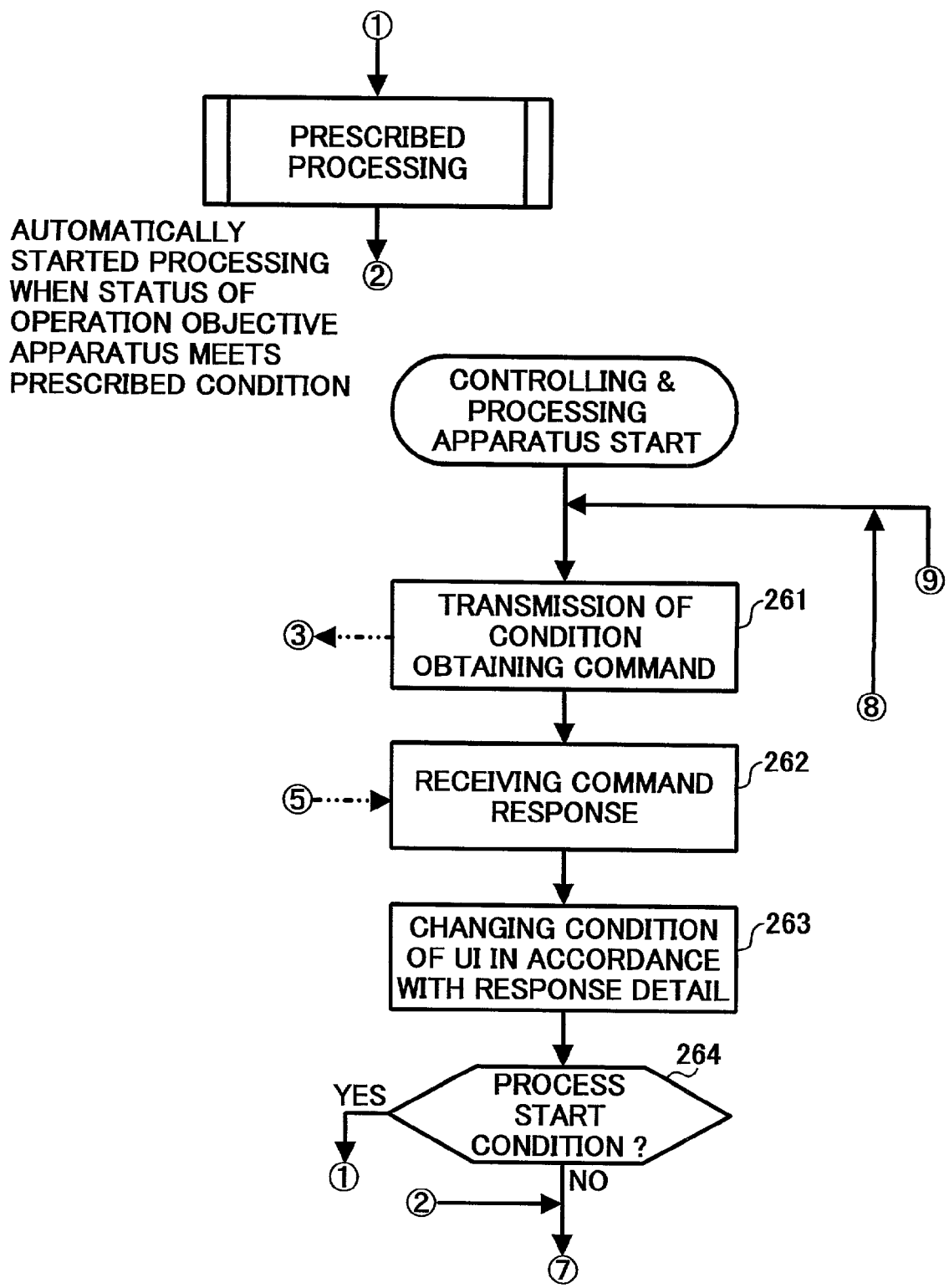
Figure 60C:
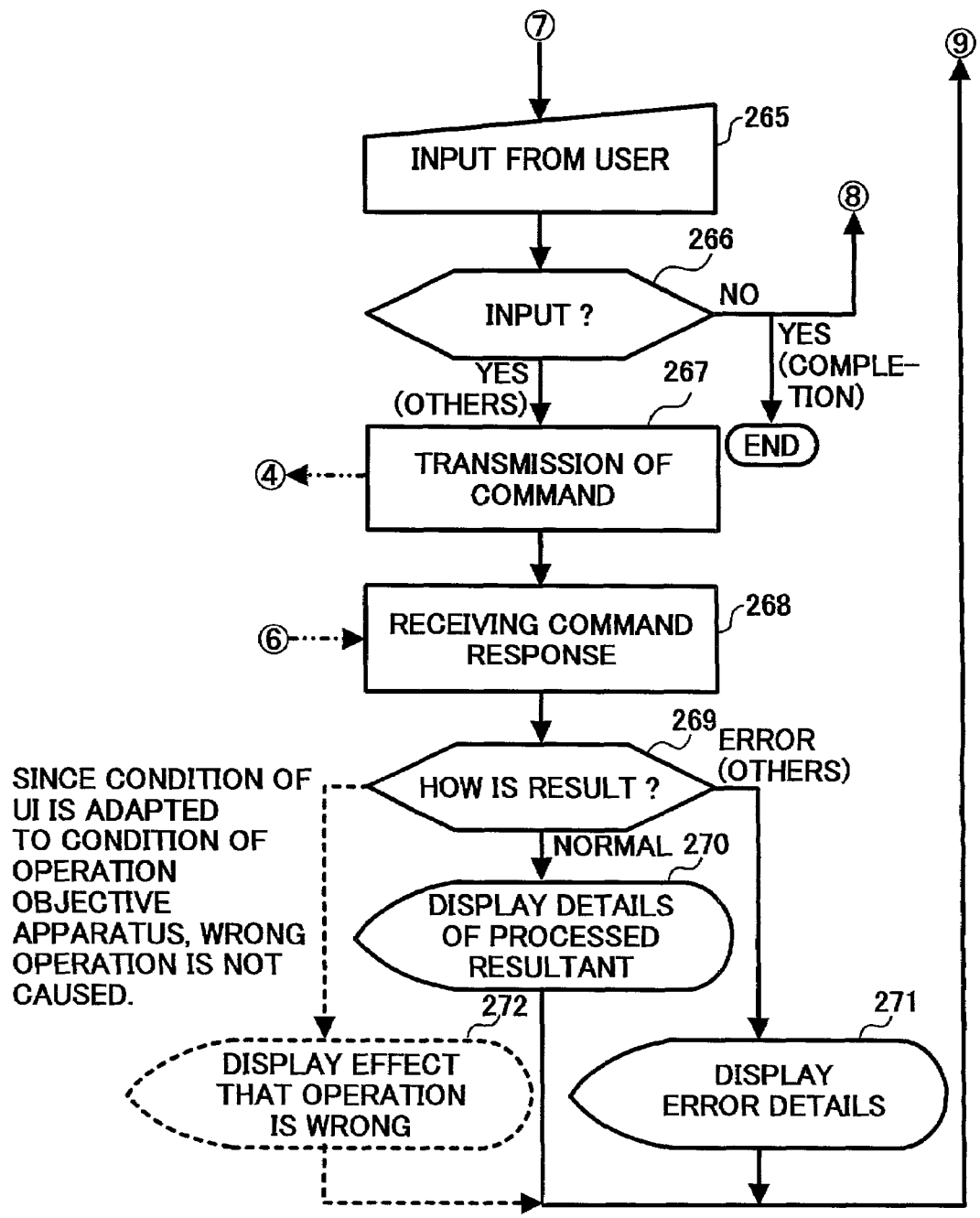

FIGS. 60A to 60C illustrate of processing performed in the controlled device 10, processing of a second thread performed in the control processor 20 before awaiting of input, and processing of a first thread performed in the control processor 20 after awaiting of input, respectively. The second thread may be generated before entering a wait state for input by a user and may execute processing of changing a user interface of the control processor in accordance with the status of the controlled device. While the term "second thread" is used, a second task or in some cases a second process may be used.

Specifically, in FIGS. 60A and 60B, when the second thread in the control processor 20 is started, the status acquisition command may be transmitted to the controlled device 10 (step 231). If reception is confirmed (step 222) in the controlled device 10 upon receiving the command (step 221), the controlled device 10 may execute command processing (step 223). The controlled device 10 may transmit a response indicating an error to the control processor 20 if there is an error (step 225) or transmits a response indicating a normal result to the control processor 20 if the result is normal (step 226). The control processor 20 may receive the command response (step 232) and change the UI status according to the contents of the response (step 233).

As may be noted from FIGS. 60A to 60C, when the first thread of the control processor 20 is started, a second thread may be generated (step 241), and user input may be awaited (steps 242 and 243). The inputted command may then be transmitted to the controlled device 10 (step 244). In the same manner as described above, when receiving a response of an error or a normal result from the controlled device 10 (step 245), the control processor may display contents of a processing result if it is normal (steps 246 and 247). In contrast, if there is an error it may display contents of the error (step 248). The processing may then be terminated. If there is input by a user (steps 242 and 243), it may repeat the processing until no input is entered.

Figure 61A:
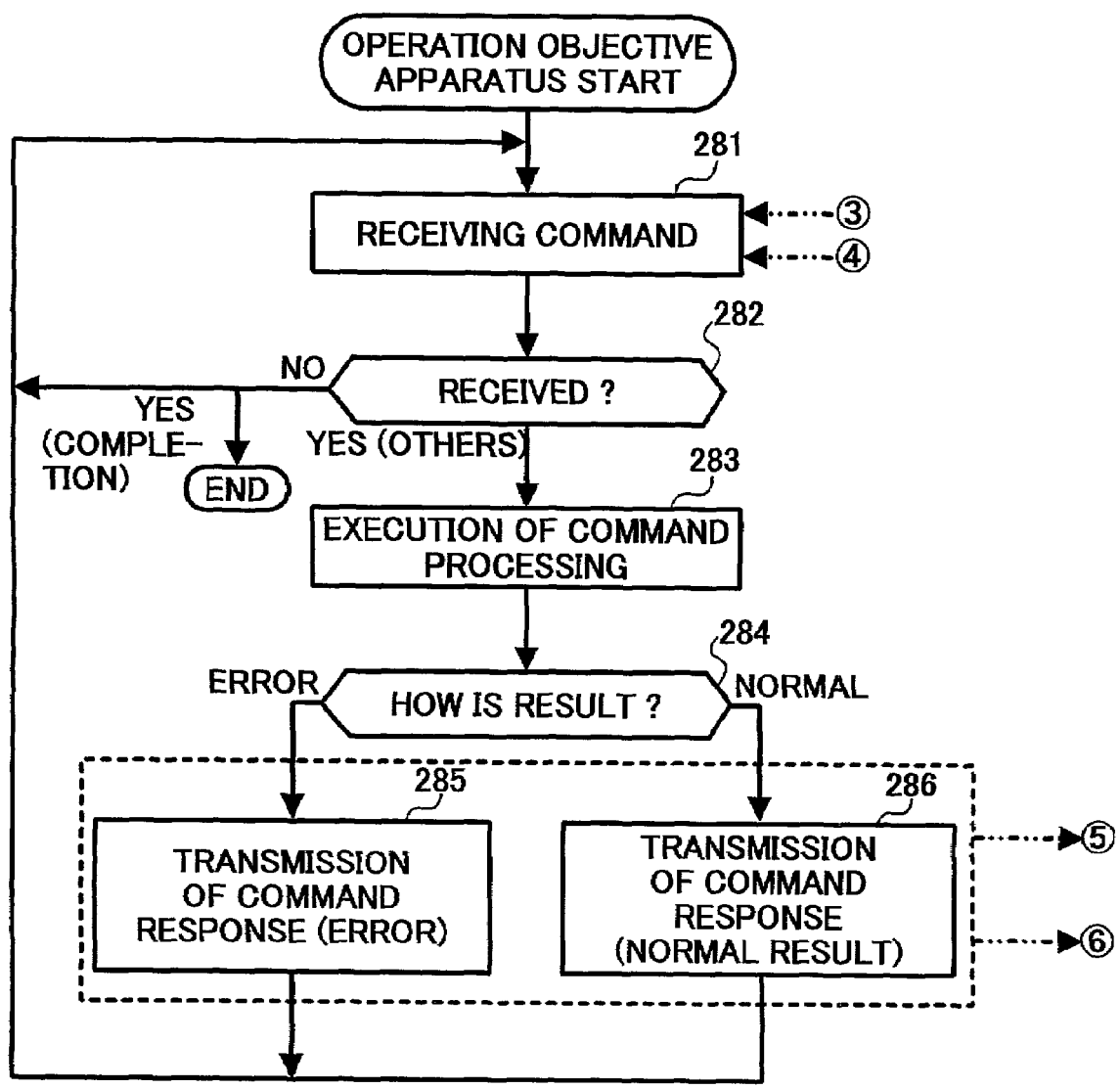
FIGS. 61A, 61B and 61C are operation flowcharts illustrating still another general-purpose inspecting method according to the present invention.
Figure 61B:
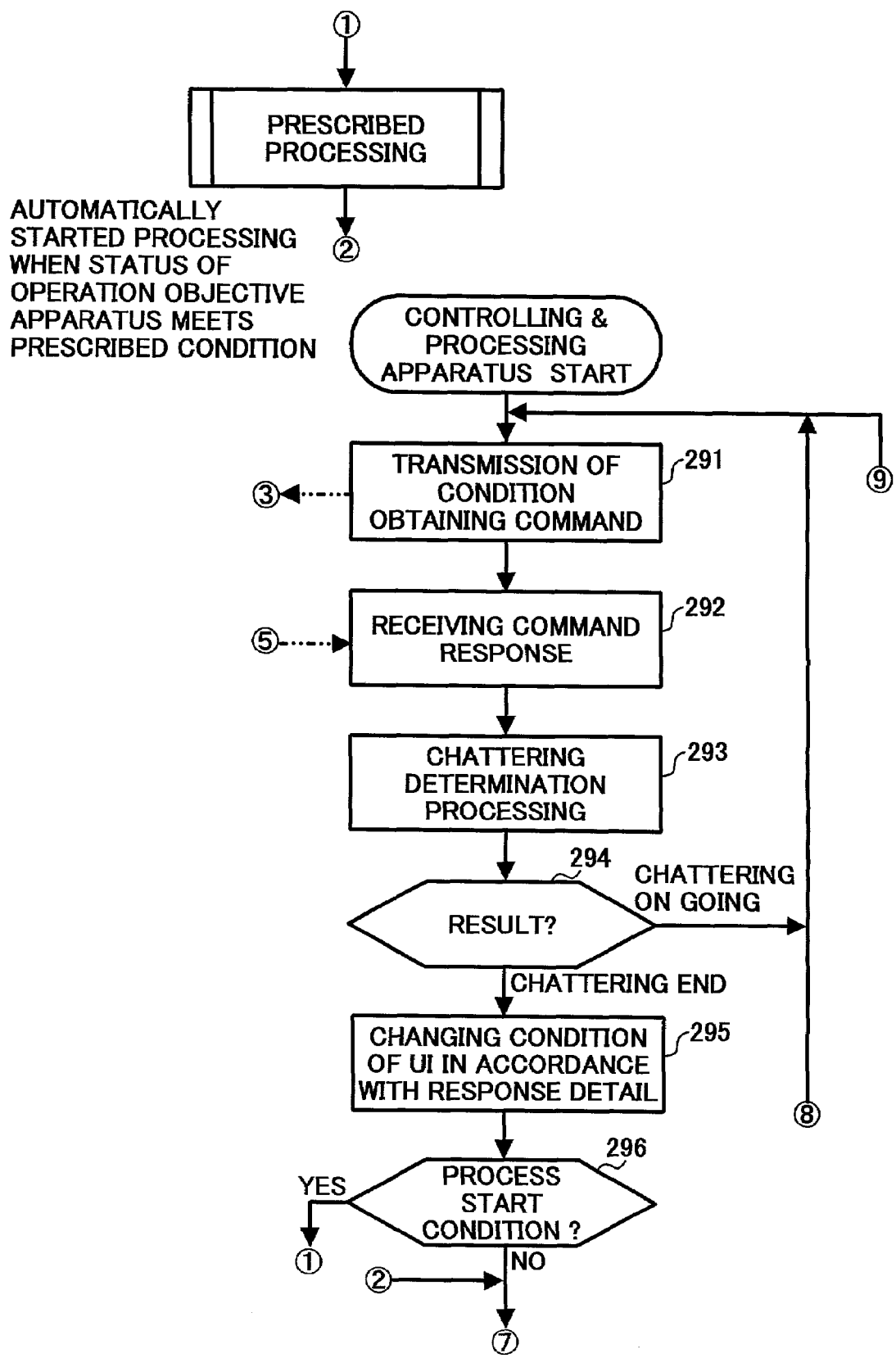
Figure 61C:
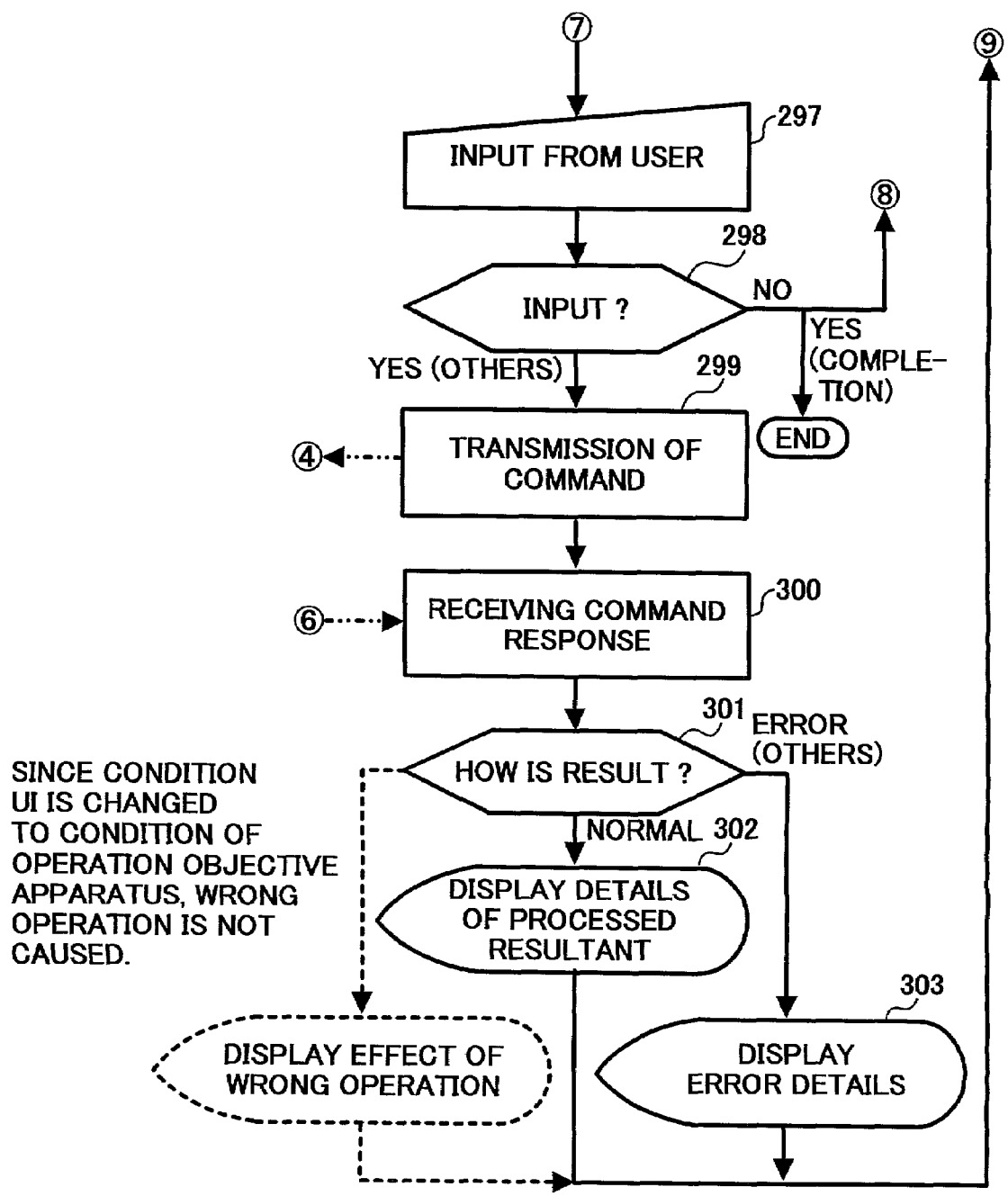

Still another modification is described with reference to FIGS. 61A to 61C showing an operational flowchart of a general-purpose inspecting method. In this modification, after acquiring a status of the controlled device and before and after changing the user interface status of the control processor, it may be determined whether starting conditions for specific processing are satisfied. If they are satisfied, an applicable processing may be executed. Regarding the conditions and processing executed thereupon based, single processing may be associated with a plurality of conditions. Conversely, plural processing may be associated with a single condition. Also, there may be a plurality of sets of the conditions and processing.

Specifically, as noted from FIGS. 61A to 61C, the control processor 20 may transmit a status acquisition command first to the controlled device 10 (step 261). The controlled device 10 may receive the command (step 251), may confirm that it is the status acquisition command (step 252), may execute command processing (step 253), and finally (step 254) may transmit an error or normal command response to the control processor 20 (steps 255 and 256). The control processor 20 may receive the command response (step 262) and may change the UI status according to contents of the response (step 263). Then, it may determine whether the processing starting conditions are satisfied (step 264). If the conditions are satisfied, it may start the processing and may await input by a user so as to transmit the command to the controlled device 10 (steps 265, 266, and 267).

On the other hand, unless the conditions are satisfied, the processing may be automatically started when the status of the controlled device satisfies a certain condition after a prescribed operation. After it is started, an input by the user may be awaited (steps 265 and 266) and then the command may be transmitted (step 267). The controlled device 10 may execute the same processing as described earlier. If a response of an error or of a normal result is transmitted, the response may be received (step 268). If the result is normal or abnormal, the content may be displayed (steps 270 and 271). In this modification, the contents of the UI status may be changed such that they correspond to those of the status of the controlled device 10, thereby preventing conflicting operation.

Still another modification is described with reference to FIGS. 61A to 61C, which show an operational flowchart of a general-purpose inspecting method. In this modification, it may be determined whether the device is under chattering on the basis of a status change caused when an acquisition of a status of the controlled device is repeated. If it is determined that the chattering is terminated as a result, awaiting of an input by a user may be processed.

In other words, in FIG. 61A to 61C, upon a start of processing of the control processor 20, a status acquisition command may be transmitted first (step 291). The controlled device 10 may then receive this command (step 281), may confirm that it is a status acquisition command (step 282), and may execute the command processing (step 283). If the result is abnormal or normal, it may transmit the command processing result to the control processor 20 (steps 285 and 286). The control processor 20 may receive the command response (step 292) and perform chattering determination processing. If the device is under chattering (steps 293 and 294), the status acquisition command may be transmitted to the controlled device 10 again (step 291).

This processing may be repeated several times. At a termination of the chattering (step 294), the control processor may change the UI status according to contents of the response (step 295) and determine whether the processing start conditions are satisfied (step 296). It may await an input by a user (step 297) since the processing is automatically started when the status of the controlled device 10 satisfies a certain condition and transmit a command to the controlled device 10 (step 299). In the same manner as described earlier, the controlled device 10 may execute the command processing. If a response of an error or a normal result is returned as a result, it may receive the response (step 300). If the result is abnormal or normal, the contents may be displayed (steps 302 and 303). In this case, the UI status is adapted to the status of the controlled device 10, thereby capable of preventing a conflicting operation.

Figure 62A:
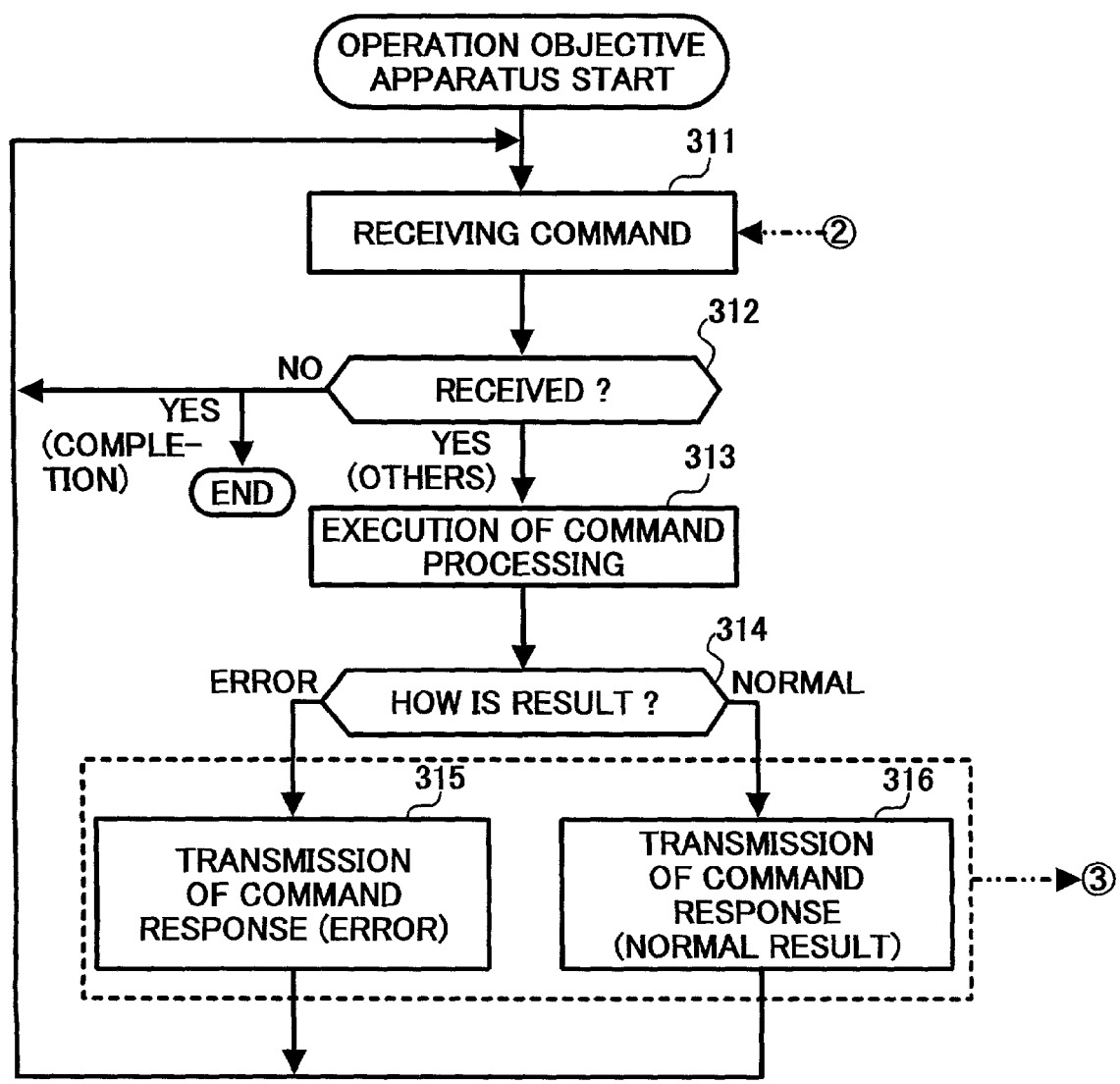
Figure 62C:
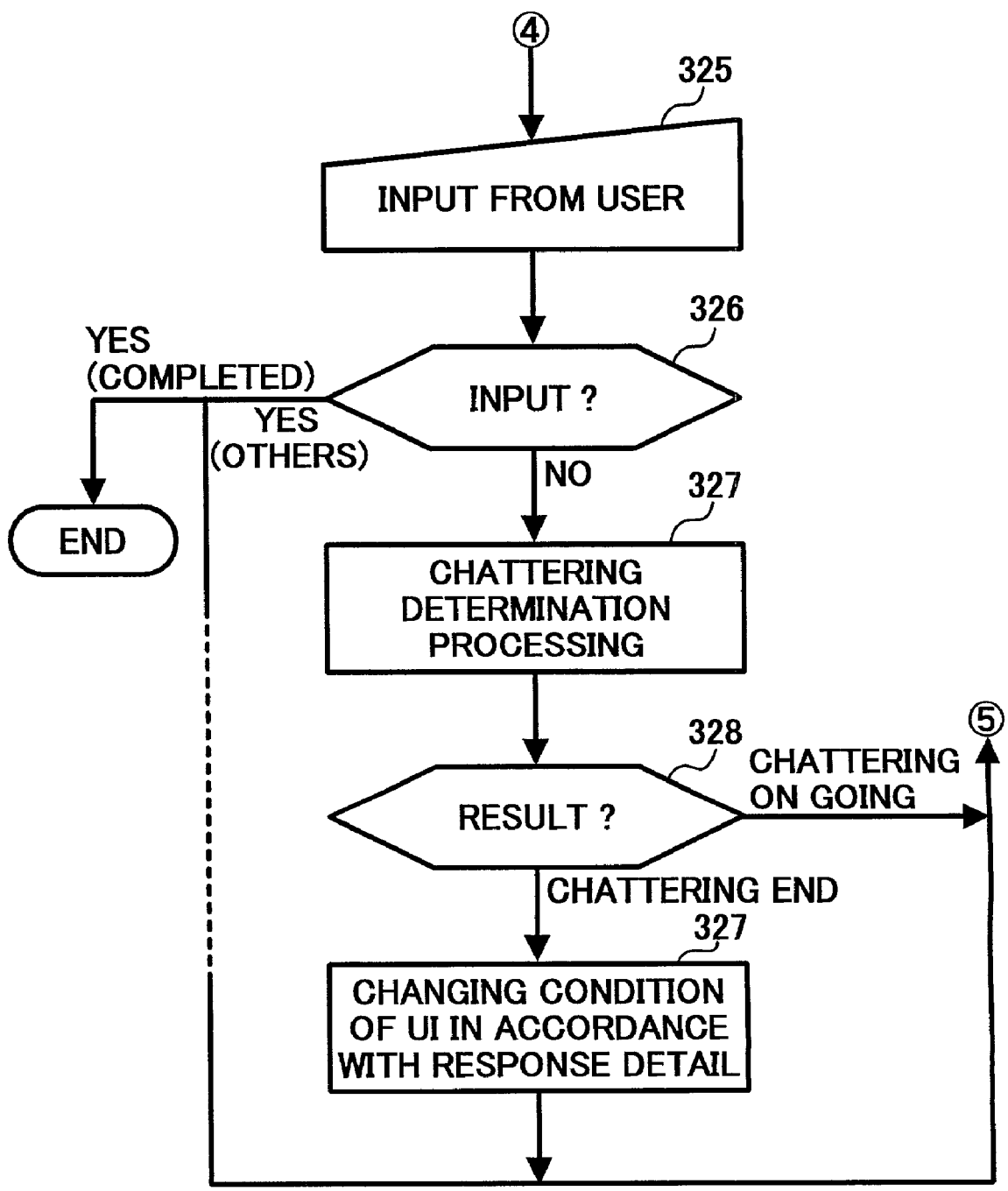

Still another modification is described with reference to FIGS. 62A to 62C showing an operational flowchart. In the modification, the chattering determination, the changing a user interface status of the control processor, and the execution of the specific processing (step 324) performed when the certain conditions are satisfied may be performed after the determination of input by a user (i.e., there is no input) in order to recover from a slow response of the user interface.

Specifically, upon a start of the control processor 20, a status acquisition command may be transmitted to the controlled device 10 (step 321). The controlled device 10 may receive the command (step 311), may confirm that it is a status acquisition command (step 312), and may execute the command processing (step 313), and finally (step 314) may transmit an error or a normal status to the control processor 20 (steps 315 and 316).

The control processor 20 may receive the command response (step 322), may determine whether the device satisfies the processing starting conditions (step 323), may perform processing that is automatically started when the controlled device 10 satisfies a certain condition (step 324), may await an input from the user if it is started (steps 325 and 326), and perform chattering determination processing (step 327). The control processor 20 may return to the beginning to repeat the same processing until the chattering is terminated if the device is under chattering (step 328), change the UI status according to the content of the response after a termination of the chattering (step 329), and terminate the processing or return to the beginning so as to perform the same processing from the operation of the status acquisition command transmission (step 321).

In addition, if respective steps of the above-described operation flowcharts are converted to respective programs and they are previously stored into a storage medium such as a CD-ROM, the present invention is easily realized by putting it in the computers of the controlled device and the control processor to install the programs or downloading them via a network and executing the programs.

The mechanisms and processes set forth in the present invention may be implemented using one or more conventional general purpose microprocessors and/or signal processors programmed according to the description in the present specification as will be appreciated by those skilled in the relevant arts. Appropriate software coding can readily be prepared by skilled programmers based on the present disclosure, as will also be apparent to those skilled in the relevant arts. Furthermore, as will be readily apparent to those skilled in the art, the present invention also may be implemented by the preparation of application-specific integrated circuits by interconnecting an appropriate network of conventional component circuits or by a combination thereof with one or more conventional general purpose microprocessors and/or signal processors programmed accordingly. The present invention thus also may include a computer-based product which may be hosted on a storage medium and may include, but is not limited to, any type of disk including floppy disks, optical disks, CD-ROMs, magneto-optical disks, ROMs, RAMs, EPROMs, EEPROMs, flash memory, magnetic or optical cards, or any type of media suitable for storing electronic instructions.

Numerous additional modifications and variations of the present invention are possible in light of the above tings. It is therefore to be understood that within the scope of the appended claims, the present invention may be practiced otherwise than as specifically described herein.

What is claimed as new and desired to be secured by letters patent of the United States is:

1. An inspecting apparatus for inspecting a performance of a variety of circuit baseboards, comprising:
    a PLD configured to inspect a circuit baseboard using at least two PLD files based upon a signal from the circuit baseboard;
    a PLD file storing device configured to store a plurality of PLD files;
    a correspondence assigning device configured to assign correspondence of a PLD file to the circuit baseboard to be inspected;
    a registering memory configured to store information of the correspondence;
    an ID reading device configured to read identification information and identify the circuit baseboard, said identification information being previously included in the circuit baseboard to be inspected; and
    a specifying device configured to refer to the correspondence information and specify the PLD file based on the circuit baseboard identified by the ID reading device; and
    a loading device configured to load the prescribed PLD with the applicable PLD file;
    a load completed PLD file determining device configured to determine if the applicable PLD file has been loaded in the prescribed PLD in a previous inspection; and
    an additional PLD file specifying device configured to specify at least one unused PLD file to be added for a next inspection, based upon the applicable PLD file specified by the specifying device based on the ID and the determination of the load completed PLD file determining device when a different type of the circuit baseboard is to be inspected;
    wherein said loading device loading the PLD specified by the additional PLD file specifying device, and said loading device deletes the PLD file determined as being disused in the PLD.

2. The inspecting apparatus according to claim 1, further comprising a log obtaining device configured to obtain log information when said loading device loads the PLD with the applicable PLD file, said log information storing information specifying the applicable PLD file stored in the PLD for inspection, wherein said load completed PLD file determining device determines if the applicable PLD file has been loaded to the PLD of the inspection circuit baseboard based upon the log information.

* * * * *